(12) United States Patent
Vellianitis

(10) Patent No.: US 11,322,495 B2
(45) Date of Patent: May 3, 2022

(54) COMPLEMENTARY METAL-OXIDE-SEMICONDUCTOR DEVICE AND METHOD OF MANUFACTURING THE SAME

(71) Applicant: Taiwan Semiconductor Manufacturing Co., Ltd., Hsinchu (TW)

(72) Inventor: Georgios Vellianitis, Heverlee (BE)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 17 days.

(21) Appl. No.: 16/801,071

(22) Filed: Feb. 25, 2020

(65) Prior Publication Data

US 2021/0125986 A1  Apr. 29, 2021

Related U.S. Application Data

(60) Provisional application No. 62/926,569, filed on Oct. 28, 2019.

(51) Int. Cl.
| | |
|---|---|
| *H01L 27/092* | (2006.01) |
| *H01L 29/06* | (2006.01) |
| *H01L 21/8234* | (2006.01) |
| *H01L 21/8238* | (2006.01) |

(52) U.S. Cl.
CPC .. *H01L 27/0924* (2013.01); *H01L 21/823431* (2013.01); *H01L 21/823821* (2013.01); *H01L 29/0649* (2013.01)

(58) Field of Classification Search
CPC ............. H01L 27/0924; H01L 27/1211; H01L 29/0649; H01L 29/42392; H01L 29/78696; H01L 21/823431; H01L 21/823821; H01L 21/845
USPC .......................... 257/365, 368, 369, 401, 288
See application file for complete search history.

(56) References Cited

U.S. PATENT DOCUMENTS

| | | |
|---|---|---|
| 8,772,109 B2 | 7/2014 | Colinge |
| 8,785,285 B2 | 7/2014 | Tsai et al. |
| 8,796,666 B1 | 8/2014 | Huang et al. |
| 8,815,712 B2 | 8/2014 | Wan et al. |
| 8,816,444 B2 | 8/2014 | Wann et al. |
| 8,823,065 B2 | 9/2014 | Wang et al. |
| 8,860,148 B2 | 10/2014 | Hu et al. |
| 8,963,258 B2 | 2/2015 | Yu et al. |

(Continued)

OTHER PUBLICATIONS

G. Sun et al., "Hole mobility in silicon inversion layers: Stress and surface orientation," Journal of Applied Physics, vol. 102, No. 8, article 084051, Oct. 2007, pp. 1-8.

(Continued)

*Primary Examiner* — Dao H Nguyen
(74) *Attorney, Agent, or Firm* — JCIPRNET

(57) ABSTRACT

A complementary metal-oxide-semiconductor device includes a p-type field effect transistor and an n-type filed effect transistor. The p-type filed effect transistor has a first transistor architecture. The n-type field effect transistor is coupled with the p-type field effect transistor and has a second transistor architecture. The second transistor architecture is different from the first transistor architecture. The p-type field effect transistor and the n-type field effect transistor share a same gate structure.

20 Claims, 60 Drawing Sheets

(56) References Cited

U.S. PATENT DOCUMENTS

| | | |
|---|---|---|
| 9,093,530 B2 | 7/2015 | Huang et al. |
| 9,105,490 B2 | 8/2015 | Wang et al. |
| 9,171,929 B2 | 10/2015 | Lee et al. |
| 9,209,247 B2 | 12/2015 | Colinge et al. |
| 9,214,555 B2 | 12/2015 | Oxland et al. |
| 9,236,267 B2 | 1/2016 | De et al. |
| 9,236,300 B2 | 1/2016 | Liaw |
| 9,412,817 B2 | 8/2016 | Yang et al. |
| 9,412,828 B2 | 8/2016 | Ching et al. |
| 9,472,618 B2 | 10/2016 | Oxland |
| 9,502,265 B1 | 11/2016 | Jiang et al. |
| 9,520,482 B1 | 12/2016 | Chang et al. |
| 9,536,738 B2 | 1/2017 | Huang et al. |
| 9,548,303 B2 | 1/2017 | Lee et al. |
| 9,576,814 B2 | 2/2017 | Wu et al. |
| 9,608,116 B2 | 3/2017 | Ching et al. |
| 10,332,803 B1 * | 6/2019 | Xie .................... H01L 27/0924 |
| 2020/0098756 A1 * | 3/2020 | Lilak ................. H01L 29/66545 |
| 2020/0335501 A1 * | 10/2020 | Dewey ................ H01L 27/0924 |
| 2020/0381427 A1 * | 12/2020 | Suh .................... H01L 29/42392 |

OTHER PUBLICATIONS

S. Tagaki et al., "On the Universality of Inversion Layer Mobility in Si MOSFET's: Part I—Effects of Substrate Impurity Concentration," IEEE Transactions on Electronic Devices, vol. 41, No. 12, Dec. 1994, pp. 2357-2362.

\* cited by examiner

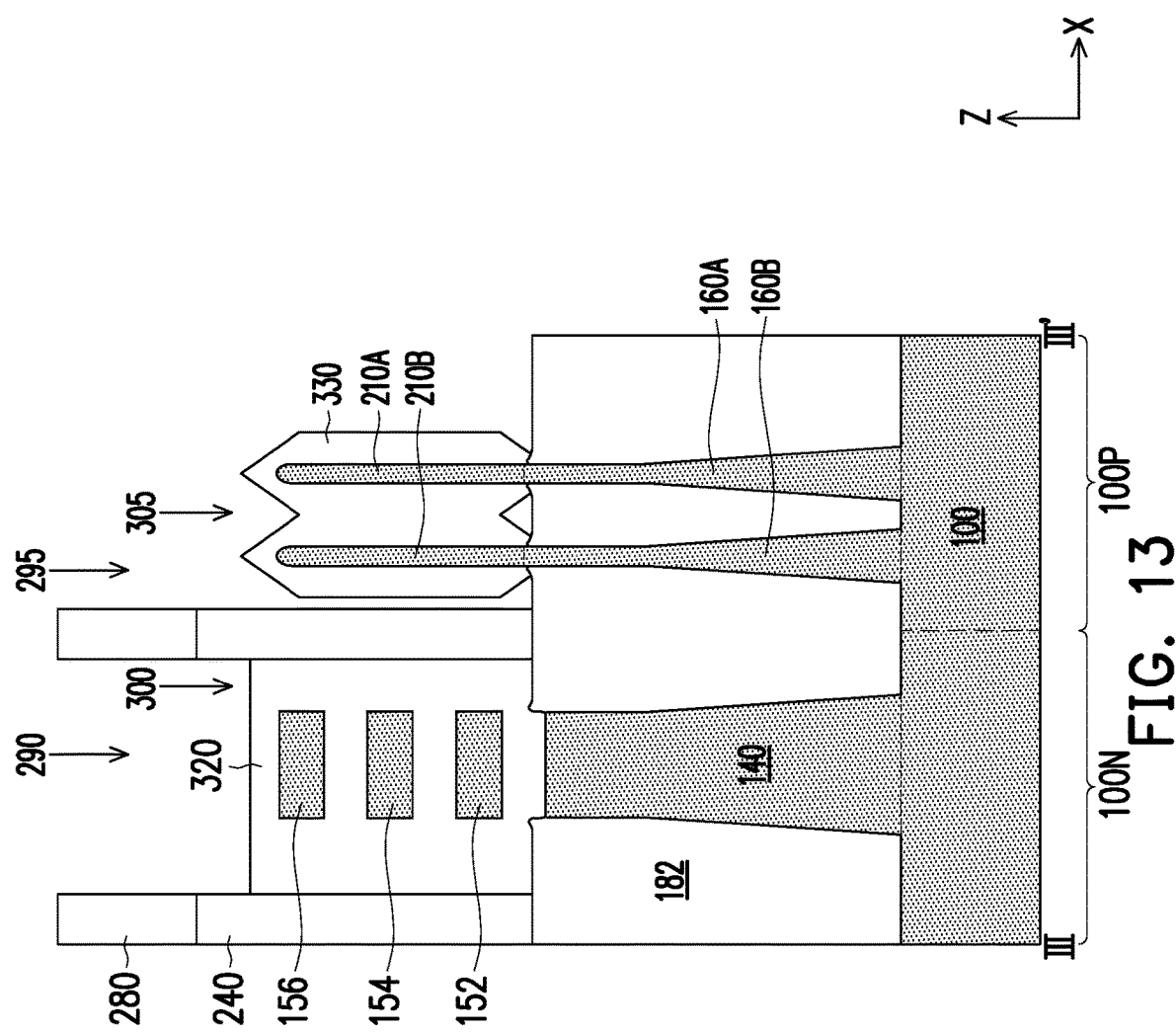

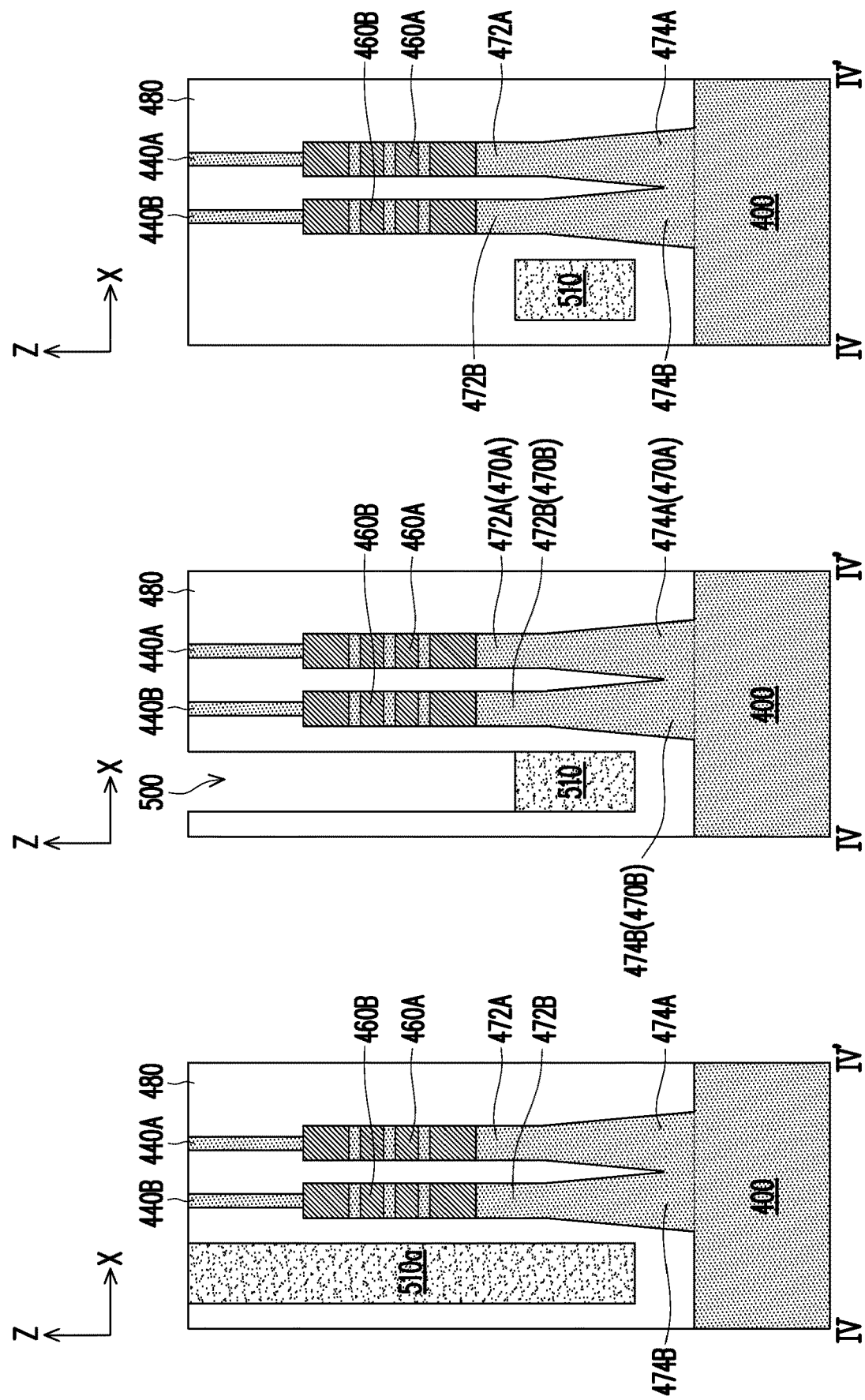

COMPLEMENTARY METAL-OXIDE-SEMICONDUCTOR DEVICE AND METHOD OF MANUFACTURING THE SAME

CROSS-REFERENCE TO RELATED APPLICATION

This application claims the priority benefit of U.S. provisional application Ser. No. 62/926,569, filed on Oct. 28, 2019. The entirety of the above-mentioned patent application is hereby incorporated by reference herein and made a part of this specification.

BACKGROUND

The semiconductor integrated circuit (IC) industry has experienced a fast-paced growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component or line that can be created using a fabrication process) has decreased. This scaling down process generally provides benefits by increasing production efficiency and lowering associated costs. Challenges from both fabrication and design issues have resulted in the development of three-dimensional designs, such as fin field-effect transistors (FinFETs).

BRIEF DESCRIPTION OF THE DRAWINGS

Aspects of the disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 13 is a schematic cross-sectional view of a structure produced during a manufacturing method of a CMOS device according to some embodiments of the present disclosure.

FIG. 20, FIG. 21, and FIG. 23 to FIG. 25 are schematic cross-sectional views of structures produced during a manufacturing method of a CMOS device according to some embodiments of the present disclosure.

DETAILED DESCRIPTION

Figure 2:
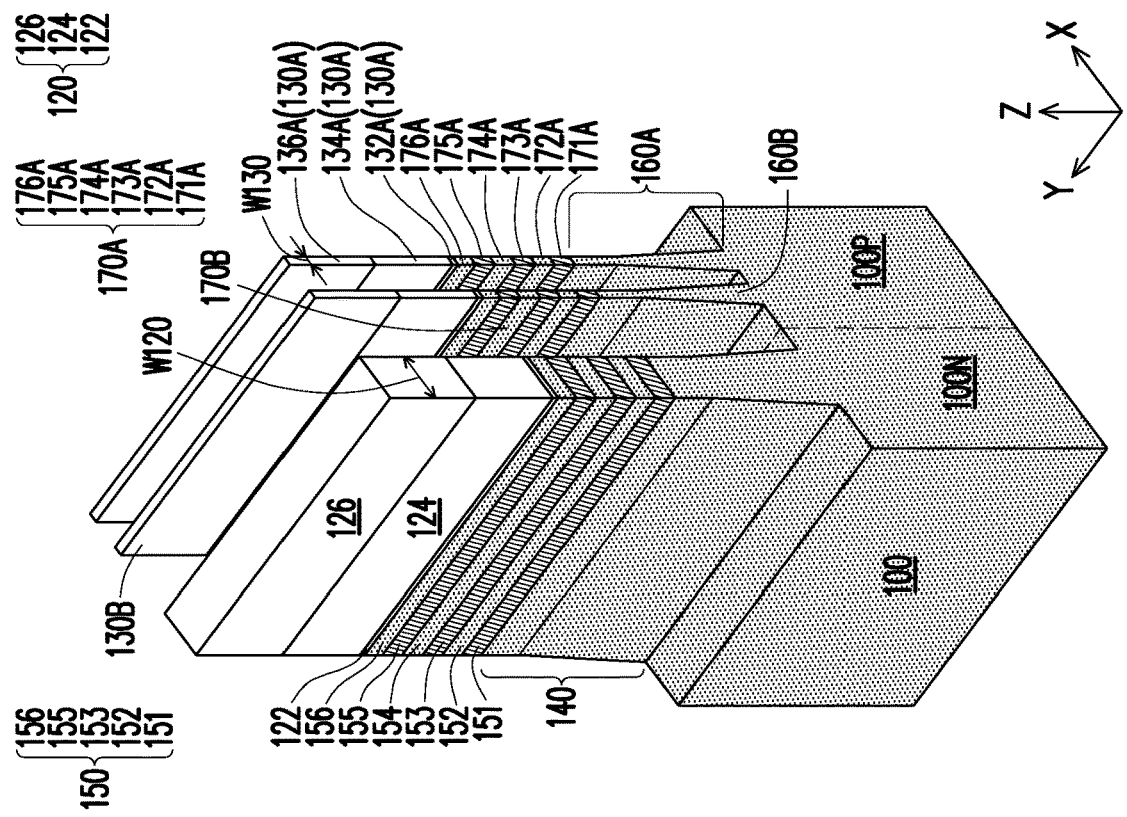
FIG. 1 to FIG. 9, FIG. 11, FIG. 12, and FIG. 14 are schematic perspective views of structures produced during a manufacturing method of a CMOS device according to some embodiments of the present disclosure.

The following disclosure provides many different embodiments, or examples, for implementing different features of the provided subject matter. Specific examples of components and arrangements are described below to simplify the disclosure. These are, of course, merely examples and are not intended to be limiting. For example, the formation of a second feature over or over a first feature in the description that follows may include embodiments in which the second and first features are formed in direct contact, and may also include embodiments in which additional features may be formed between the second and first features, such that the second and first features may not be in direct contact. In addition, the disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath", "below", "lower", "over", "overlying", "above", "upper"

and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

The gate all around (GAA) transistor structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

The embodiments of the disclosure describe the exemplary manufacturing process of complementary metal-oxide-semiconductor (CMOS) devices and the CMOS devices fabricated there-from. In certain embodiments of the disclosure, the CMOS devices may be formed on bulk silicon substrates. Still, the CMOS devices may be formed on a silicon-on-insulator (SOI) substrate, a germanium-on-insulator (GOI) substrate, a SiGe substrate, or a Group III-V semiconductor substrate. Also, in accordance with some embodiments of the disclosure, the silicon substrate may include other conductive layers or other semiconductor elements, such as transistors, diodes or the like. The embodiments are not limited in this context. The CMOS devices may be included in microprocessors, memories, and/or other integrated circuits (IC). Accordingly, it is understood that additional processes may be provided before, during, and after the illustrated method, and that some other processes may only be briefly described herein. Also, the structures illustrated in the drawings are simplified for a better understanding of the concepts of the present disclosure. For example, although the figures illustrate the structure of a CMOS device, it is understood the CMOS device may be part of an IC that further includes a number of other devices such as resistors, capacitors, inductors, fuses, etc.

Figure 1:
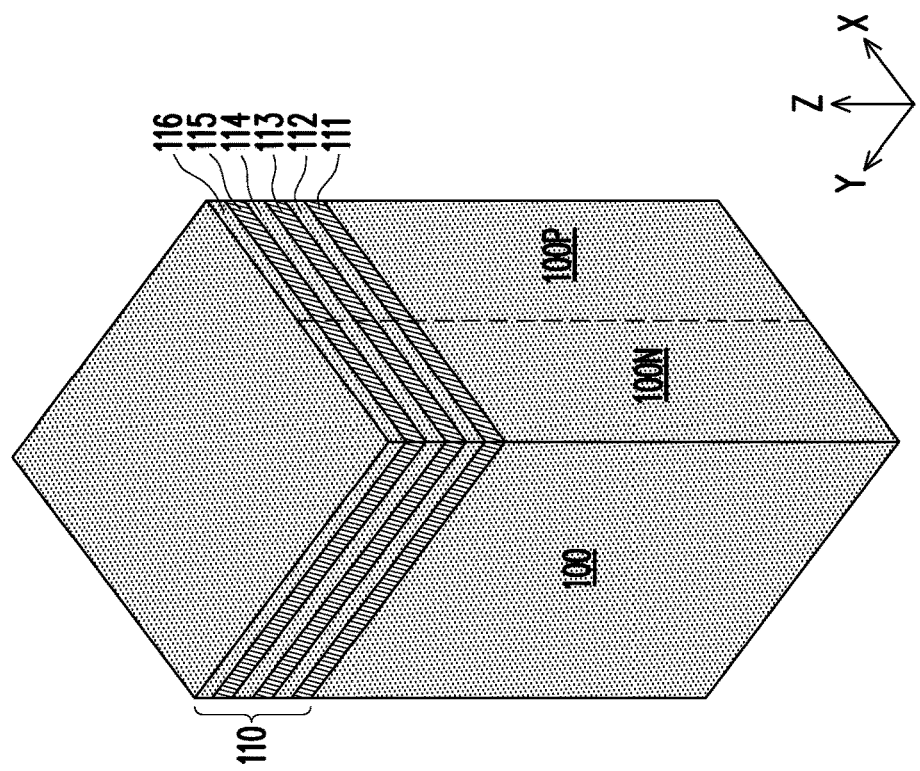
Figure 8:
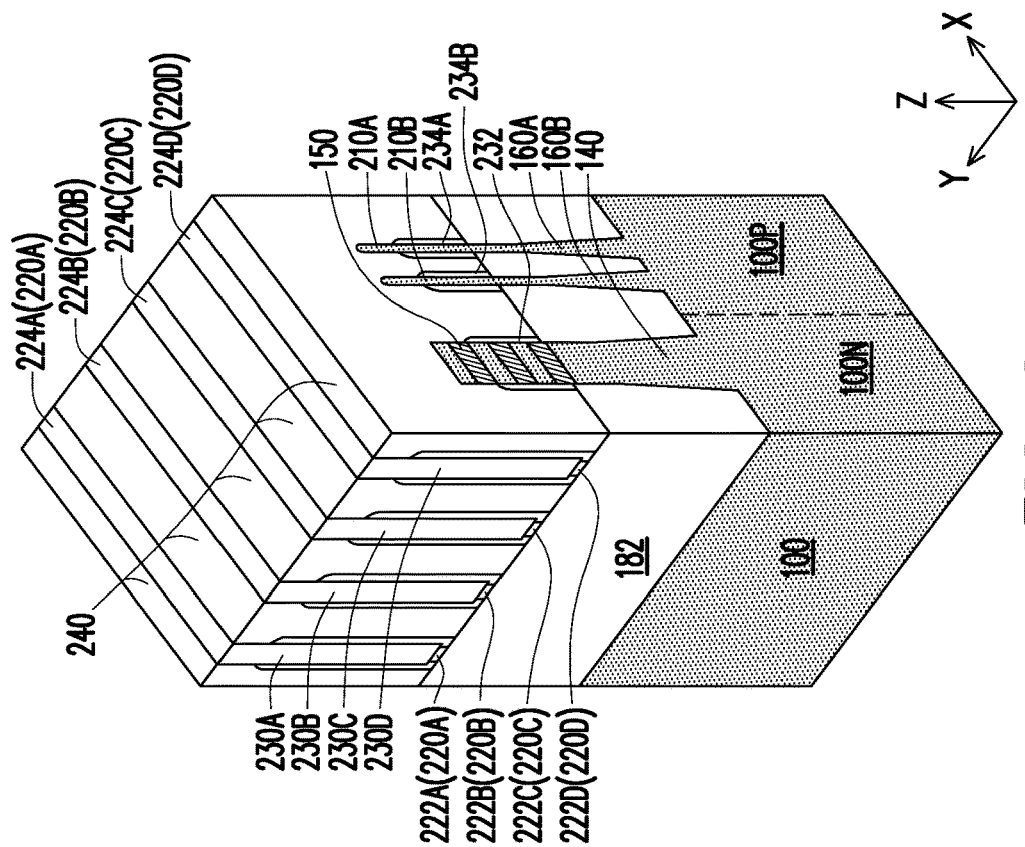
Figure 9A:
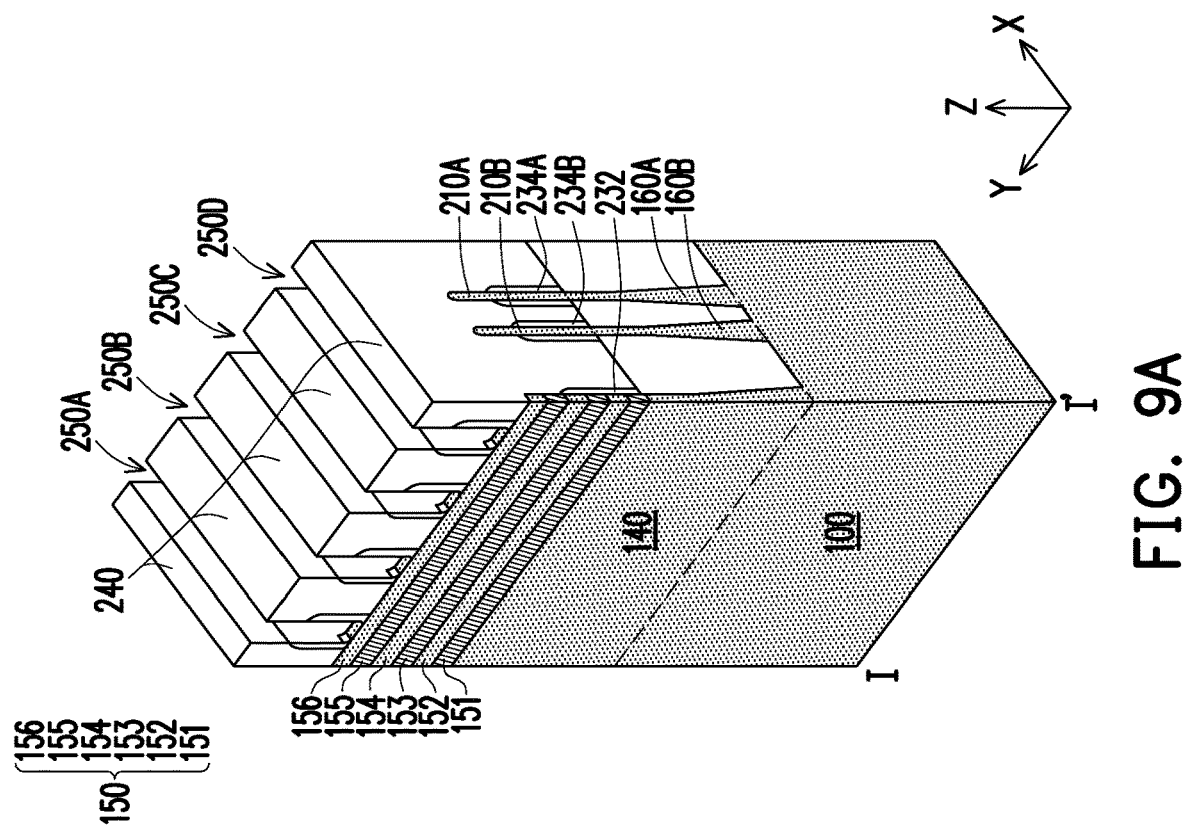
FIG. 9A and FIG. 14A are schematic perspective sectional views of the structures respectively illustrated in FIG. 9 and FIG. 14 according to some embodiments of the present disclosure.
Figure 14A:
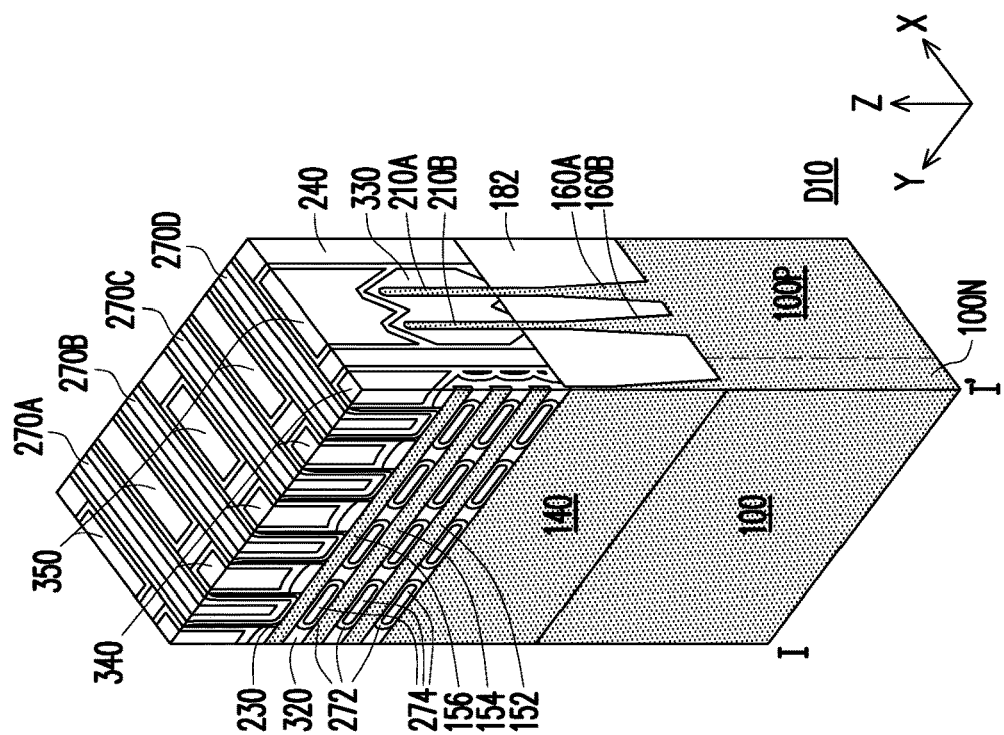

In FIG. 1 to FIG. 14B are illustrated views of structures produced during a manufacturing process of a CMOS device D10 according to some embodiments of the disclosure. FIG. 1 to FIG. 9, FIG. 11, FIG. 12, and FIG. 14 are schematic perspective views, FIG. 9A, FIG. 10, and FIG. 14A are schematic perspective sectional views, and FIG. 9B, FIG. 10A, FIG. 11A, FIG. 12A, and FIG. 13 are schematic cross-sectional views. For clarity of illustrations, in the drawings are illustrated the orthogonal axes (X, Y and Z) of the Cartesian coordinate system according to which the views are oriented. Referring to FIG. 1, in some embodiments a semiconductor substrate 100 is provided. In some embodiments, the semiconductor substrate 100 includes a crystalline silicon substrate or a bulk silicon substrate (e.g., wafer). In some embodiments, the semiconductor substrate 100 may be made of a suitable elemental semiconductor, such as diamond or germanium; a suitable compound semiconductor, such as gallium arsenide, silicon carbide, indium arsenide, or indium phosphide; or a suitable alloy semiconductor, such as silicon germanium carbide, gallium arsenic phosphide, or gallium indium phosphide. In some embodiments, the semiconductor substrate 100 includes a silicon on insulator (SOI) substrate. The semiconductor substrate 100 may include various doped regions 100N, 100P depending on design requirements (e.g., p-type semiconductor substrate or n-type semiconductor substrate). In some embodiments, the doped regions may be doped with p-type (e.g., 100P) or n-type (e.g., 100N) dopants. For example, the doped regions 100P, 100N may be doped with p-type dopants, such as boron or $BF_2$; n-type dopants, such as phosphorus or arsenic; and/or combinations thereof. The doped regions 100P, 100N may be configured for an n-type FET, or alternatively, configured for a p-type FET. In some embodiments, an n-doped region 100N in which an n-type FET is to be formed is flanked by a p-doped region 100P in which a p-type FET is to be formed.

As shown in FIG. 1, stacked semiconductor layers 110 are formed on the semiconductor substrate 100. In the stacked semiconductor layers 110, layers of channel material 112, 114, 116 are alternately stacked with layers of sacrificial material 111, 113, 115. In some embodiments, the layer of sacrificial material 111 is formed on the semiconductor substrate 100, with the remaining semiconductor layers 112-116 alternately stacked on top. The disclosure is not limited by the number of stacked semiconductor layers 110. In some embodiments, the layers 111-116 are alternately grown on the semiconductor substrate 100. In some embodiments, the stacked semiconductor layers 110 are a semiconductor superlattice. In some embodiments, the layers 111-116 may be formed on the semiconductor substrate 100 by chemical vapor deposition (CVD), for example low pressure CVD (LPCVD), metalorganic CVD (MOCVD), molecular beam epitaxy, or other suitable techniques. In some embodiments, the layers of channel material 112, 114, 116 may be formed of the same material as the semiconductor substrate 100, while the layers of sacrificial material 111, 113, 115 may be formed of a different material which can be selectively removed with respect to the material of the semiconductor substrate 100 and the layers of channel material 112, 114, 116. In the following, as a way of example, it will be considered that the semiconductor substrate 100 and the layers of channel material 112, 114, 116 are made of silicon, optionally doped, while silicon germanium (SiGe) will be considered as sacrificial material for the layers 111, 113, 115. However, the disclosure is not limited thereto, and other combinations of materials for which selective etching is possible are contemplated within the scope of the disclosure.

Referring to FIG. 1 and FIG. 2, hard masks 120, 130A, and 130B are provided on the uppermost layer of channel material 116 of the stacked semiconductor layer 110. Throughout the description, letters may be dropped from the labels when the corresponding elements are addressed collectively rather than individually. So, for example, when the hard masks 130A, 130B and their components do not need to be addressed individually, the identifying letters may be dropped from the corresponding labels, and the description may refer to "the hard masks 130" to indicate both of the hard masks 130A and 130B. The hard masks 120 and 130 may have an elongated size along the Y direction with respect to the X direction. In some embodiments, the hard masks 120 and 130 are parallel strips elongated along the Y direction and distributed along the X direction. In some embodiments, the hard masks 130A and 130B may be disposed at a distance in the range from 20 nm to 50 nm along the X direction, for example at a distance of about 30 nm. In some embodiments, the width W120 of the hard mask 120 along the X direction is greater than the width W130 of the hard masks 130A and 130B along the X direction. For example, the width W120 of the hard mask 120 may be in the range from 10 nm to 40 nm, and the width W130 of the hard mask 130 may be in the range from 5 to 15 nm. In some embodiments, the hard mask 120 is disposed over the n-type region 100N of the semiconductor substrate 100, while the hard masks 130 are disposed over the p-type region 100P of the semiconductor substrate 100. In some embodiments, the hard masks 130 have substantially the same width in the X direction with respect to each other. As illustrated in FIG. 2, in some embodiments, each of the hard masks 120 and 130 includes an etch stop layer (e.g., 122 and 132A), a lower mask layer (e.g., 124, 134A) and an upper mask layer (e.g., 126, 136A). The lower mask layers 124, 134 and the upper mask layers 126, 136 may include different dielectric materials. For example, the lower mask layers 124, 134 may include silicon nitride, and the upper mask layers 126, 136 may include silicon dioxide. The hard masks 120 and 130 may be formed by patterning a precursor hard mask stack (not shown) which is blanketly formed on the stacked semiconductor layers 110. The precursor hard mask stack may include a blanket etch stop layer (not shown), and one or more blanket dielectric layers, which are patterned, for example, via photolithography and etching steps. The precursor hard mask stack may be formed through a sequence of deposition step, for example via atomic layer deposition, chemical vapor deposition, or the like.

In some embodiments, the hard mask 120 is used to pattern the semiconductor substrate 100 and the stacked semiconductor layers 110 to respectively form a nanosheet base 140 and stacked semiconductor nanosheets 150 on the nanosheet base 140 in the region 100N of the semiconductor substrate 100. Similarly, the hard masks 130 are used to pattern the substrate 100 and the stacked semiconductor layers 110 to respectively form fin bases 160A and sacrificial fins 170A, 170B. In some embodiments, the nanosheets 150 and the sacrificial fins 170 may have substantially the same width along the X direction than the overlying hard masks 120 and 130, respectively. The nanosheet base 140 and the fin bases 160 may have the same thickness of the overlying nanosheets 150 and sacrificial fins 170 towards the top, and may gradually widen proceeding in the negative Z direction from the nanosheets 150 or the sacrificial fins 170 towards the substrate 100. That is, the nanosheet base 140 and the fin bases 160 may have a tapered shape widening along the X direction closer to the substrate 100 in the negative Z direction. In some embodiments, the nanosheets 150 and the sacrificial fins 170 retain alternating layers of channel material and sacrificial material formed from the layers 111-116. For example, the nanosheets 150 include nanosheets of sacrificial material 151, 153, and 155 and nanosheets of channel material 152, 154, and 156 formed from the layers of sacrificial material 111, 113, and 115 and from the layers of channel material 112, 114, and 116, respectively. Similarly, the sacrificial fins 170 includes the strips 171-176 which are respectively formed from the layers 111-116. It should be noted that while in FIG. 2 only one stack of nanosheets 150 and two sacrificial fins 170 are illustrated, the disclosure is not limited by the numbers of stacked nanosheets 150 or sacrificial fins 170 formed, which may be adjusted according to the requirements of the circuit design.

Figure 3:
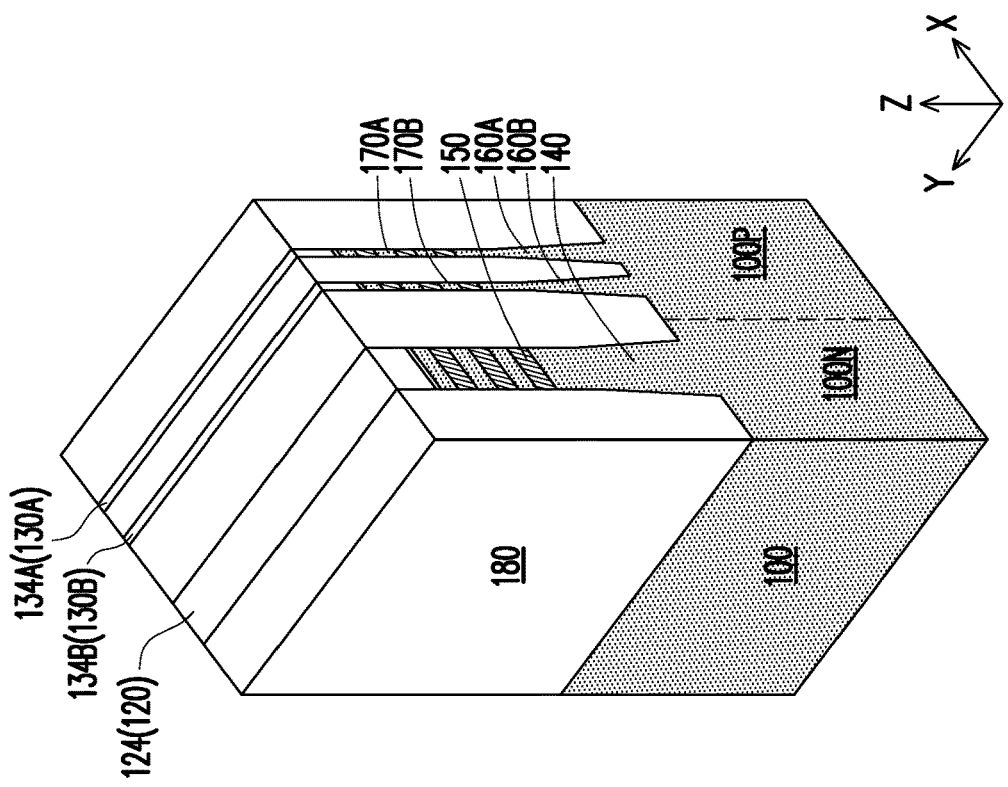

Referring to FIG. 2 and FIG. 3, in some embodiments, an insulating material 180 is disposed on the semiconductor substrate 100 in between the nanosheets 150 and the sacrificial fins 170. In some embodiments, the insulating material 180 fills the gaps between the nanosheet base 140 and the fins bases 160. In some embodiments, the insulating material may be initially formed to completely cover the nanosheets 150 and the sacrificial fins 170, reaching the level height of the hard masks 120, 130 along the Z direction. A planarization process (e.g., a chemical mechanical planarization process) may be performed to remove portion of the insulating material 180 together with the upper mask layers 126, 136 to expose the lower mask layers 124 and 134. After the planarization process, the insulating material 180 may be substantially coplanar with the lower mask layers 124 and 134. In some embodiments, the dielectric material may include silicon oxide, silicon nitride, silicon oxynitride, fluoride-doped silicate glass (FSG), a spin-on dielectric material, a low-k dielectric material, other suitable dielectric materials, or a combination thereof. In some embodiments, the insulating material 180 may include oxides, such as silicon dioxide. In some embodiments, the insulating material 180 may be formed via suitable deposition process, such as, for example, high-density-plasma chemical vapor deposition (HDP-CVD), sub-atmospheric CVD (SACVD), plasma-enhanced atomic layer deposition (PEALD), or by spin-on.

Figure 4:
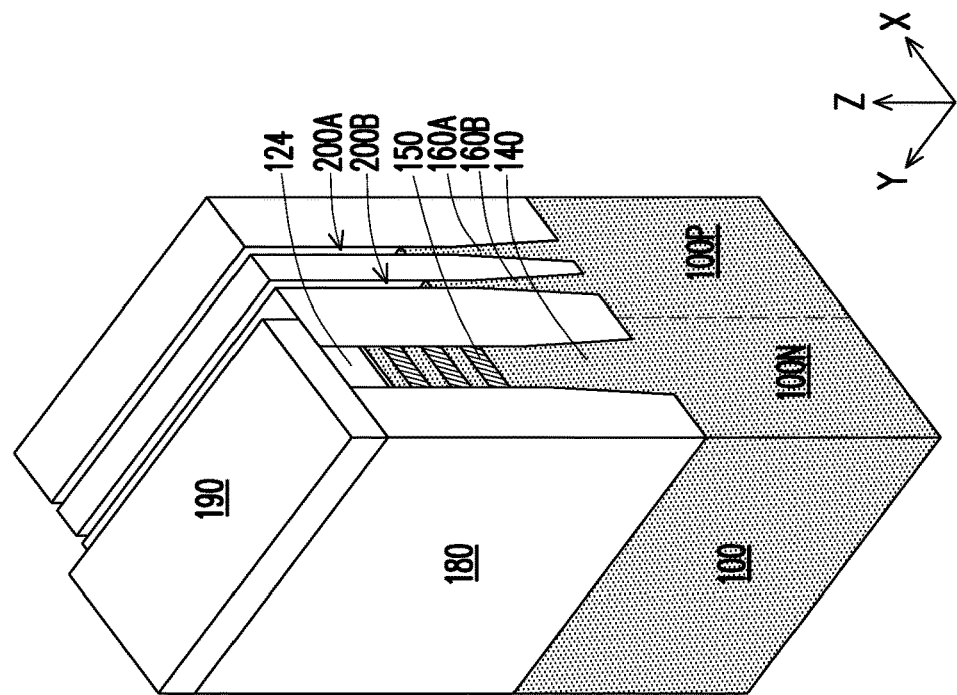
Figure 5:
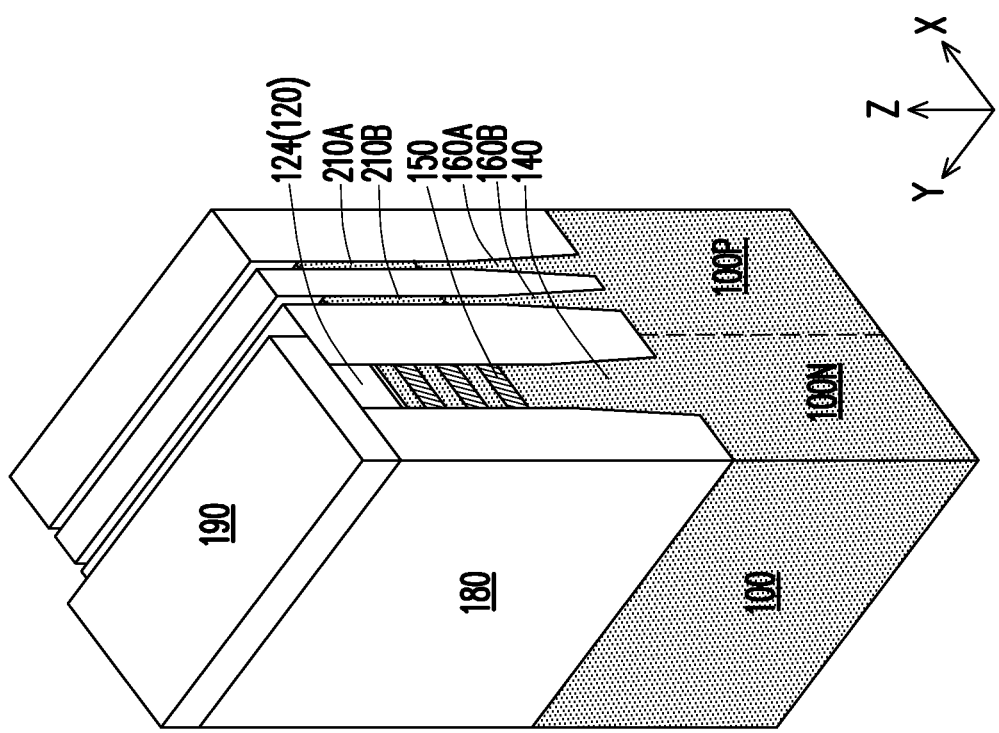

Referring to FIG. 3 and FIG. 4, in some embodiments a temporary mask 190 is provided on the insulating material 180 and the lower mask layer 124 over the n-type region 100N. The temporary mask 190 may leave exposed the insulating material 180 and the lower mask layers 134 in the p-type region 100P. Thereafter, the hard masks 130 and the underlying sacrificial fins 170 may be removed, for example during one or more etching steps. Following the etching steps, fissures 200 are formed in the insulating material 180 in correspondence of the place of the sacrificial fins 170 and the hard masks 130. The fin bases 160A and 160B are exposed at the bottom of the fissures 200A and 200B, respectively. The temporary mask 190 may protect the hard mask 120 and the nanosheets 150 during the etching steps, so that both remains in n-type region 100N. Referring to FIG. 4 and FIG. 5, semiconductor fins 210A and 210B are grown in the fissures 200A, 200B of the insulating material 180 on the fin bases 160A and 160B, respectively. In some embodiments, the semiconductor fins 210 are grown via selective homoepitaxy, so as to reduce or prevent defects in the semiconductor fins 210. As such, the semiconductor fins 210 may be made of the same material as the corresponding fin bases 160, and no clear interface may be visible between the semiconductor fins 210 and the fin bases 160. In some embodiments, the semiconductor fins 210 may be doped with n-type dopants or p-type dopants.

Figure 6:
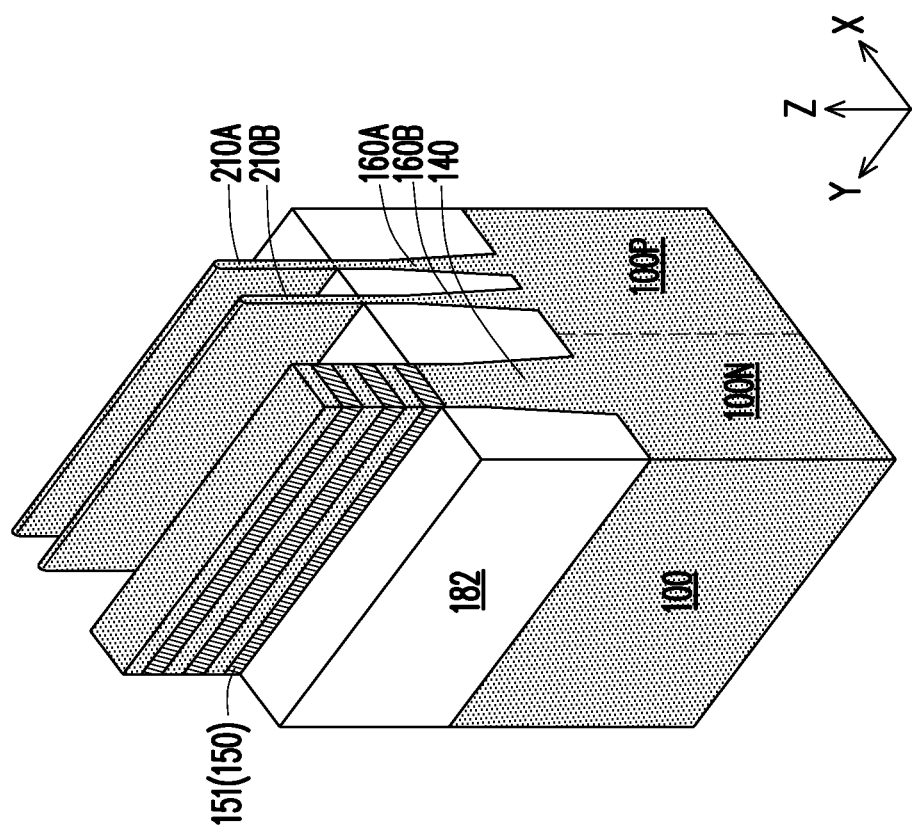

Referring to FIG. 5 and FIG. 6, the temporary mask 190 may be removed, and the insulating material 180 may be recessed to form isolation structures 182 in between the nanosheet base 140 and the fin bases 160. In some embodiments, the hard mask 120 is also removed from the top of the nanosheets 150. In some embodiments, the isolation structures 182 are shallow trench isolation (STI) structures. In some embodiments, the insulating material 180 may be recessed until the stacked semiconductor nanosheets 150 and the semiconductor fins 210 are exposed. As such, the isolation structures 182 may extend at both sides of the nanosheet base 140 and the fin bases 160, and in between the fin bases 160, until a height level in the z direction corresponding to the bottommost nanosheet of sacrificial material 151 of the nanosheets 150.

Figure 7:
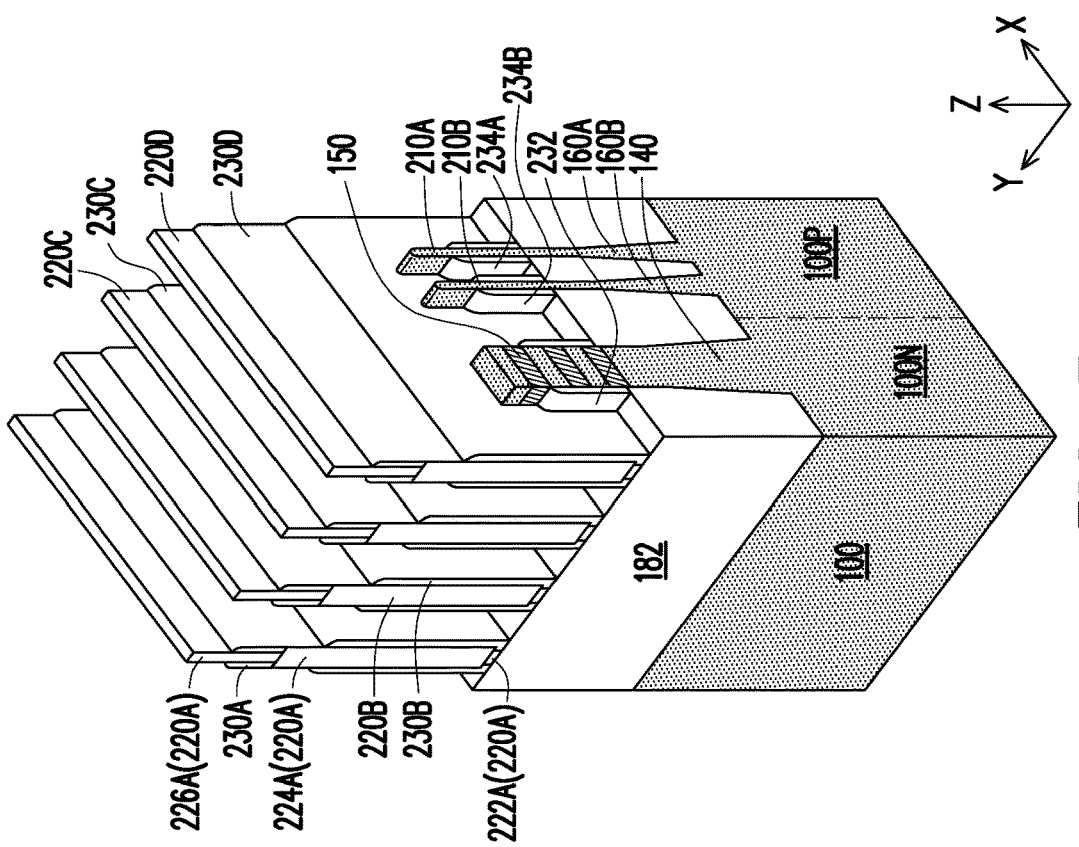

Referring to FIG. 7, one or more dummy gate structures 220 are formed over the nanosheets 150, the semiconductor fins 210 and the isolation structures 182. In some embodiments, if the semiconductor fins 210 and the nanosheets 150 extend in the Y direction, the dummy gate structures 220 extend in the X direction. That is, an extending direction of the dummy gate structures 220 may be perpendicular to an extending direction of the semiconductor fins 210 and the nanosheets 150. In FIG. 8 all four dummy gate structures 220A-220D are illustrated as extending across the stacked nanosheets 150 and the semiconductor fins 210. In this configuration, the dummy gate structures 220 may be considered shared between the semiconductor fins 210 and the nanosheets 150, but the disclosure is not limited thereto. In some embodiments at least one of the dummy gate structures 220 is shared between the semiconductor fins 210 and the nanosheets 150. In other words, at least one dummy gate structure 220 is formed across the semiconductor fins 210 and the nanosheets 150. In some alternative embodiments, different dummy gate structures 220 may be provided for the semiconductor fins 210 and the nanosheets 150, depending on the requirement of the circuit design.

In some embodiments, each dummy gate structure 220 includes a dummy gate dielectric layer 222, a dummy gate body 224 disposed over the dummy gate dielectric layer 222, and a dummy gate hard mask 226 disposed over the dummy gate body 224. In some embodiments, the dummy gate dielectric layer 222 is formed to separate the semiconductor fins 210 and the nanosheets 150 from the dummy gate body 224 and to function as an etch stop layer. The dummy gate dielectric layer 222 may include, for example, silicon oxide, silicon nitride, or silicon oxy-nitride. In some embodiments, the dummy gate dielectric layer 222 may be formed using a suitable process such as atomic layer deposition (ALD), chemical vapor deposition (CVD), physical vapor deposition (PVD), thermal oxidation, UV-ozone oxidation, or combinations thereof. In some embodiments, the dummy gate body 224 includes a silicon-containing material, such as poly-silicon, amorphous silicon, or a combination thereof. The dummy gate body 224 may be formed using a suitable process, such as ALD, CVD, PVD, plating, or combinations thereof. In some embodiments, the dummy gate body 224 may be a single-layered structure or a multi-layered structure.

In some embodiments, gate spacers 230 are formed on the isolation structures 182 and over the semiconductor fins 210 and the nanosheets 150, at opposite sides (with respect to the Y direction) of the dummy gate structures 220. Similar to the dummy gate structures 220, the gate spacers 230 may extend over multiple semiconductor fins 210 and nanosheets 150 along the X direction. In some embodiments, the gate spacers 230 are formed of dielectric materials, such as silicon oxide, silicon nitride, carbonized silicon nitride (SiCN), SiCON, or a combination thereof. In some embodiments, the gate spacers 230 are a single-layered structure. In some alternative embodiments, the gate spacers 230 are a multi-layered structure. In some embodiments, a pair of parallel gate spacers 230 disposed at the two sides of a dummy gate structure 220 is connected at opposite line-ends and forms a ring structure or an enclosed wall structure. In some embodiments, the spacers only partially cover the dummy gate hard masks 226. Depending on the aspect ratio of the dummy gate structure 220, the gate spacers 230 may or may not cover the entire dummy gate structure 220. Coverage of the dummy gate structure 220 by the gate spacers 230 can be tuned by the thickness of the gate spacers 230, height of the dummy gate hard mask 226, and etch conditions. In some embodiments, pairs of transversal spacers 232, 234 may extend along the Y direction at opposite sides (with respect to the X direction) of the nanosheets 150 and the semiconductor fins 210, respectively. In some embodiments, the transversal spacers 232, 234 may connect opposing gate spacers 230 extending along different dummy gate structures 220. For example, the transversal spacers formed between the dummy gate structure 220A and 220B may connect the spacer 230A closer to the dummy gate structure 220B with the spacer 230B closer to the dummy gate structure 220A. In some embodiments, top surfaces of the semiconductor fins 210 and the nanosheets 150 may be left exposed by the transversal spacers 232 and 234.

Referring to FIG. 8, in some embodiments an interlayer dielectric layer 240 is formed on the isolation structures 182, the nanosheets 150, the semiconductor fins 210, and the gate spacers 230, 232, 234. In other words, the first interlayer dielectric layer 240 is formed in between adjacent pairs of gate spacers 230 (e.g., in between the gate spacers 230A and the gate spacers 230B, and so on), at the sides of the dummy gate structures 220. In some embodiments, a material of the interlayer dielectric layer 240 includes low-k dielectric materials. Examples of low-k dielectric materials include Xerogel, Aerogel, amorphous fluorinated carbon, parylene, BCB (bis-benzocyclobutenes), flare, hydrogen silsesquioxane (HSQ), fluorinated silicon oxide (SiOF), or a combination thereof. It is understood that the interlayer dielectric layer 240 may include one or more dielectric materials or one or more dielectric layers. In some embodiments, the interlayer dielectric layer 240 is formed to a suitable thickness by flowable CVD (FCVD), CVD, HDPCVD, SACVD, spin-on, sputtering, or other suitable methods. For example, an interlayer dielectric material layer (not shown) may be initially formed to cover the dummy gate structures 220 and the gate spacers 230. Subsequently, the thickness of the interlayer dielectric material layer may be reduced until the dummy gate hard masks 226 are removed and the dummy gate bodies 224 are exposed. The thickness of the interlayer dielectric material layer may be adjusted via a chemical mechanical polishing (CMP) process, an etching process, or other suitable processes. In some embodiments, portions of the gate spacers 230 and of the dummy gate bodies 224 may also be removed when forming the interlayer dielectric layer 240, resulting in the interlayer dielectric layer 240 being substantially coplanar with the dummy gate bodies 224.

Figure 9:
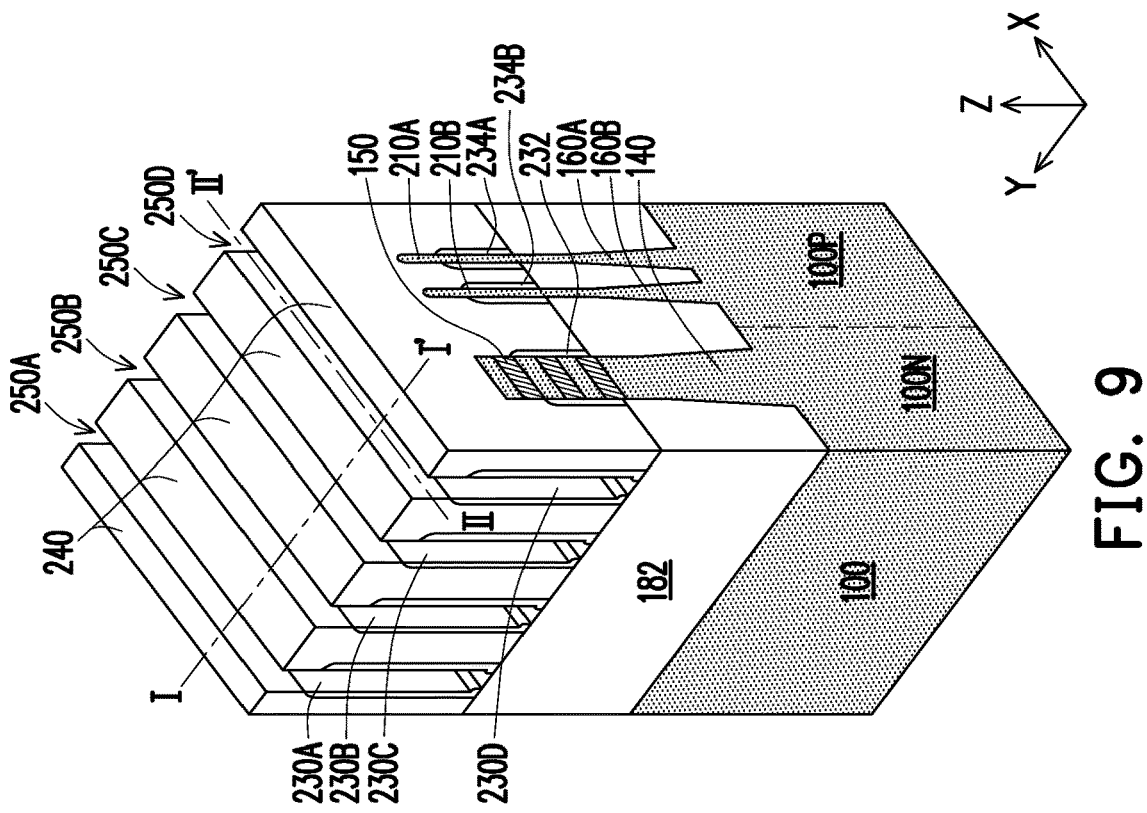
Figure 9B:
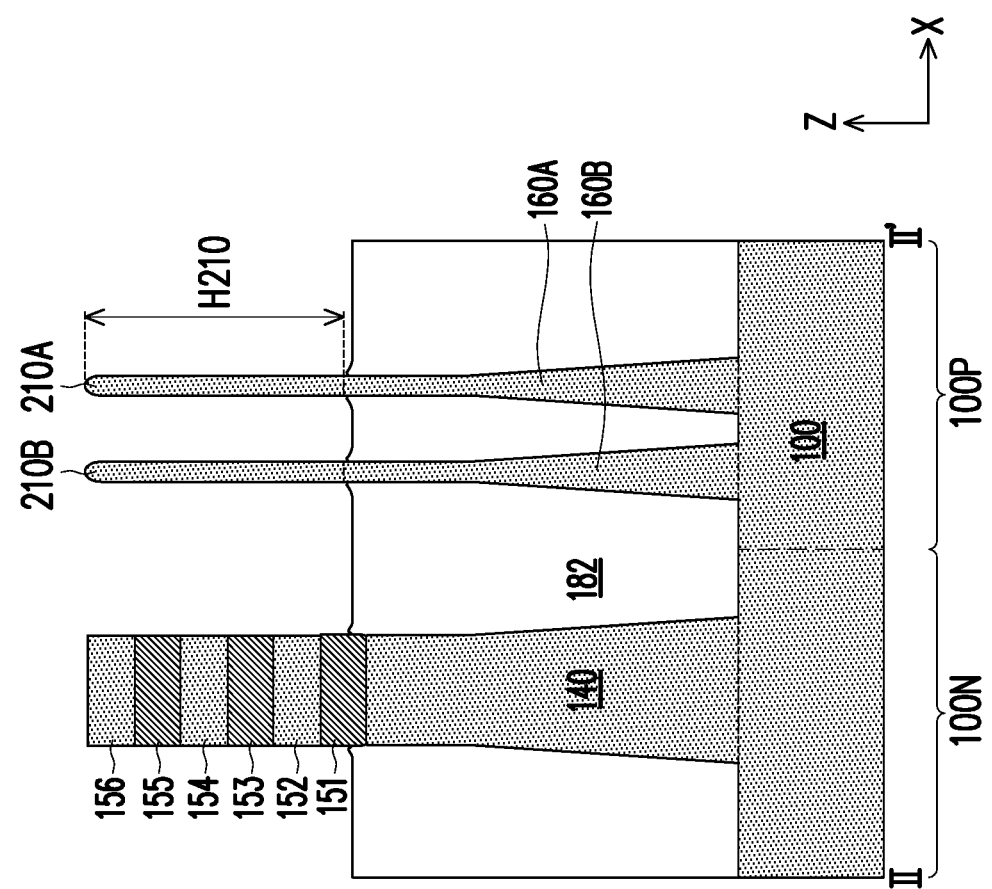
FIG. 9B, FIG. 10A, FIG. 11A, FIG. 12A, and FIG. 14B are schematic cross-sectional views of the structures respectively illustrated in FIG. 9 to FIG. 12 and FIG. 14 according to some embodiments of the present disclosure.

FIG. 9A is a schematic perspective sectional view of the structure illustrated in FIG. 9, in which the section was taken along a YZ plane at the level height of the line I-I' along the X direction. The YZ plane was selected so as to pass through the nanosheets 150. FIG. 9B is a schematic cross-sectional view of the structure illustrated in FIG. 9, cut at the XZ plane at the level height of the line II-II' along the Y direction. The line II-II' is selected so as to fall within one of the gate trenches 250 (for example, the gate trench 250D). Referring to FIG. 8, FIG. 9, FIG. 9A and FIG. 9B, the dummy gate structures 220 are removed to form the gate trenches 250 exposing portions of the semiconductor fins 210 and the nanosheets 150 in between the gate spacers 230. As illustrated in FIG. 9A and FIG. 9B, the sections of the semiconductor fins 210 and of all the nanosheets 151-156 within the gate trenches 250 in between the gate spacers 230 are exposed. On the other hand, the sections of the semiconductor fins 210 and of the nanosheets 151-156 outside the gate trenches 250 are covered by the gate spacers 230, 232, 234 and the interlayer dielectric layer 240. In some embodiments, the height H210 of the semiconductor fins 210 with respect to the isolation structures 182 may be in the range from 20 nm to 100 nm. For example, the height H210 may be of about 30 nm.

In some embodiments, the dummy gate bodies 224 and the dummy gate dielectric layers 222 are removed through an etching process or other suitable processes. For example, the dummy gate bodies 224 and the dummy gate dielectric layers 222 may be removed through a wet etching process or a dry etching process. Example of the wet etching process includes chemical etching and example of the dry etching process includes plasma etching. However, the disclosure is not limited thereto. Other etching method may also be adapted to remove the remains of the dummy gate structures 220.

Figure 10A:
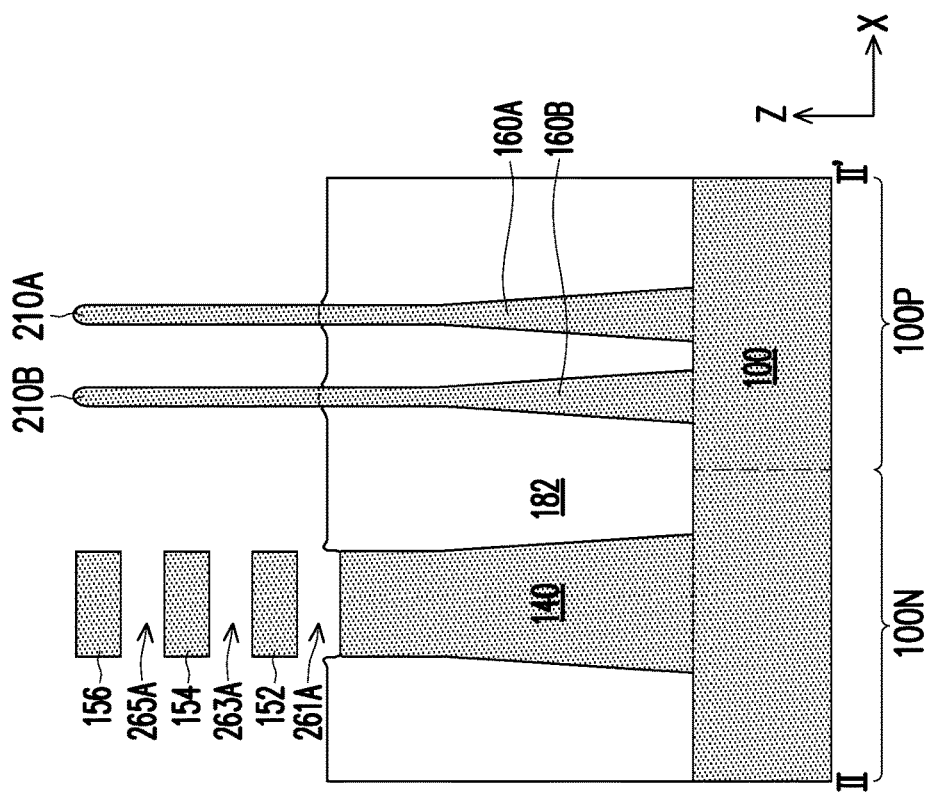
Figure 10:
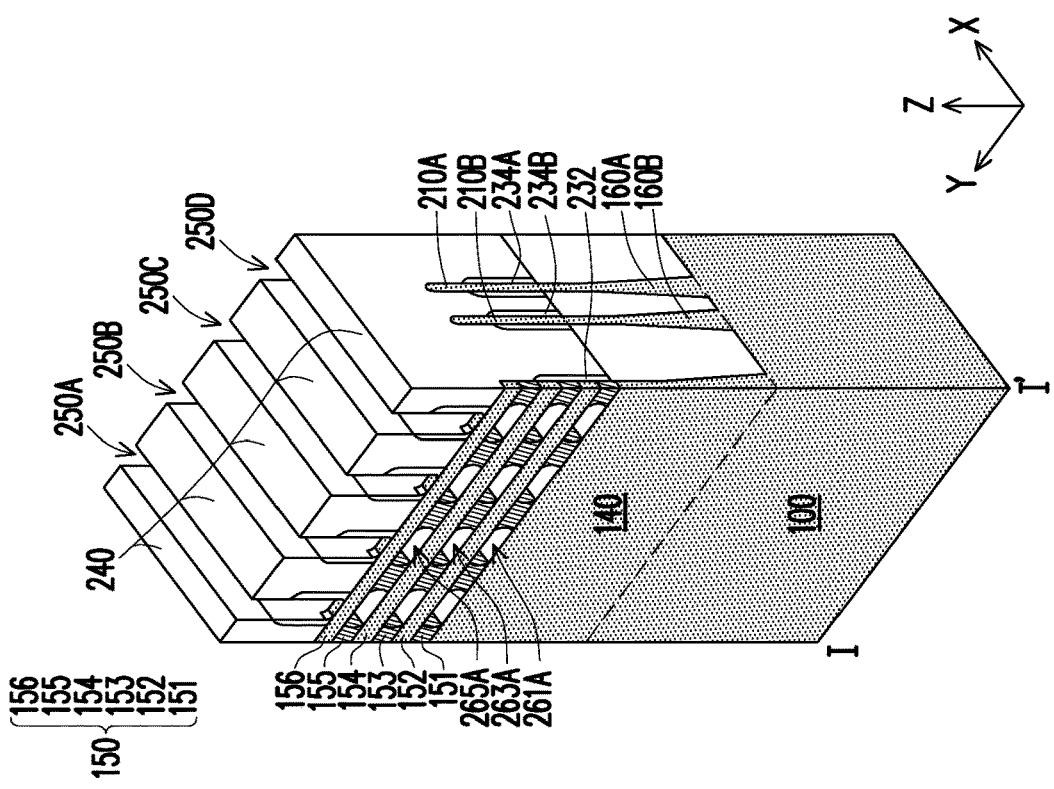
FIG. 10 is a schematic perspective sectional view of a structure produced during a manufacturing method of a CMOS device according to some embodiments of the present disclosure.

FIG. 10 is a schematic perspective sectional view of a structure produced at a subsequent stage of the manufacturing process, in which the section is taken along the same YZ plane as in FIG. 9A. FIG. 10A is a schematic cross-sectional view taken in the same XZ plane as FIG. 9B. Referring to FIG. 9A, FIG. 9B, FIG. 10, and FIG. 10A, the nanosheets of sacrificial material 151, 153, 155 may be removed, for example during a selective etching step, to form gaps 261, 263, 265, respectively. The gaps 261, 263, 265 are connected on both sides along the X direction with the corresponding gate trench 250, and separate the nanosheets of channel material 152, 154, 156 from each other and from the nanosheet base 140. That is, after removing the nanosheets of sacrificial material 151, 153, 155, sections of the nanosheets of channel material 152, 154, 156 extend through and are completely surrounded by the gate trenches 250.

Figure 11A:
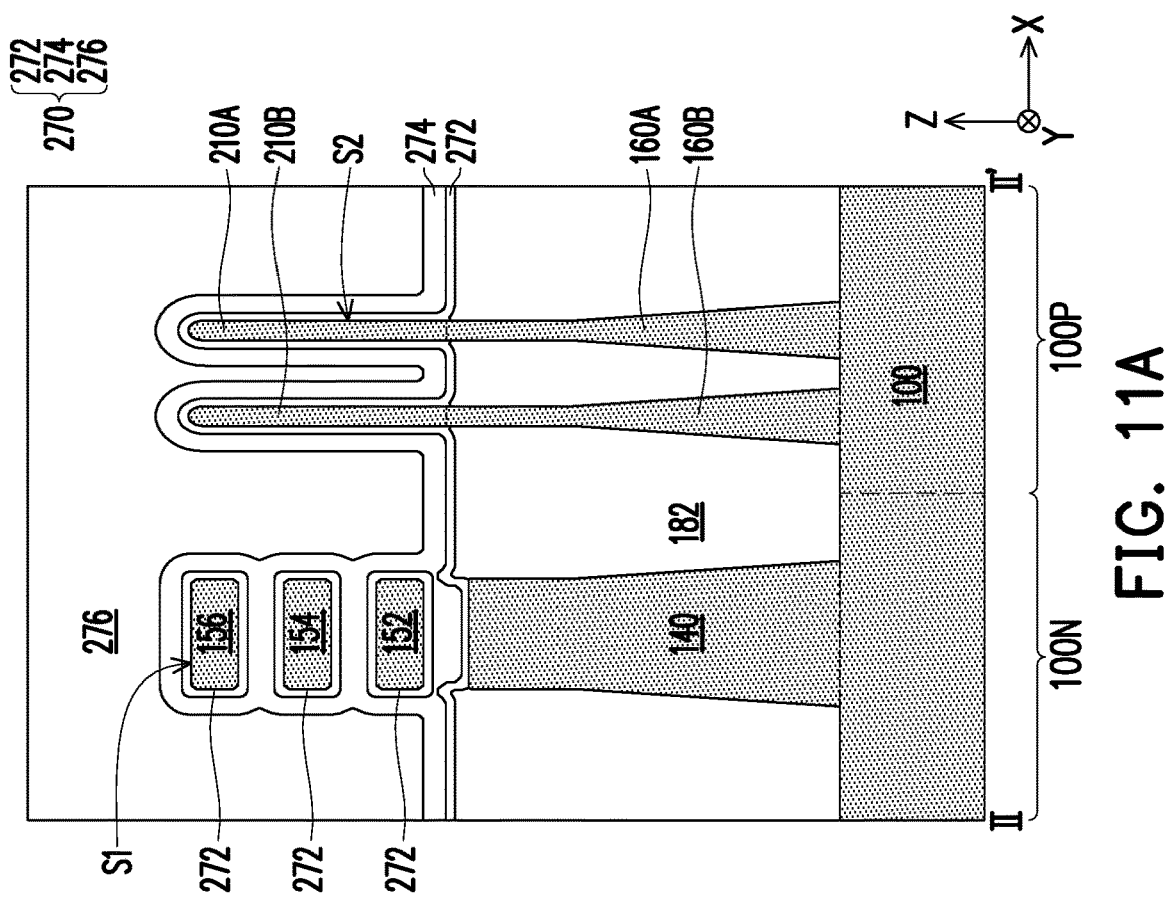
Figure 11:
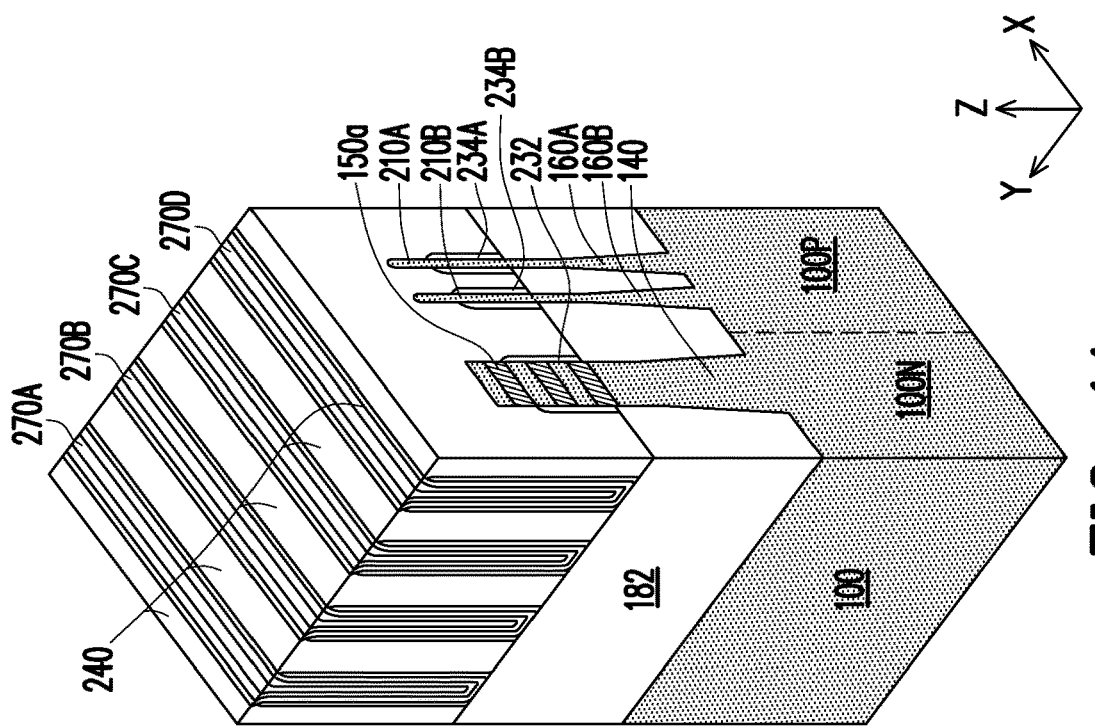

FIG. 11A is a cross-sectional view of the structure illustrated in the perspective view of FIG. 11 taken along the same XZ plane of the views of FIG. 10B. Referring to FIG. 10, FIG. 11, and FIG. 11A, in some embodiments, gate structures 270 are formed in the gate trenches 250 to contact the semiconductor fins 210 and the nanosheets of channel material 152, 154, 156. The gate structures 270 may extend along the X direction on the isolation structures 182, conformally cover the semiconductor fins 210, and wrap around the exposed sections of the nanosheets of channel material 152, 154, 156. In some embodiments, multiple gate structures 270 extend parallel with respect to each other along the X direction and are spaced from each other along the Y direction. In some embodiments, the gate structures 270 fill the gate trenches 250. In some embodiments, the gate structures 270 are formed by sequential deposition of multiple layers to form a blanket gate structure (not shown) filling the gate trenches 250 and further extending over the interlayer dielectric layer 240. A planarization process may be performed on the blanket gate structure until the interlayer dielectric layer 240 is exposed, resulting in the gate structures 270 being substantially coplanar with the interlayer dielectric layer 240. In some embodiments, each gate structure 270 includes a gate dielectric layer 272, a work function layer 274, and a gate electrode 276. In some embodiments, the gate dielectric layer 272 may include an oxide interface layer and a high-k dielectric layer. In some alternative embodiments, the oxide interface layer may be omitted.

The oxide interface layer may include a dielectric material such as silicon oxide or silicon oxynitride (SiON). In some embodiments, the oxide interface layer may be formed by a deposition process such as atomic layer deposition (ALD), chemical vapor deposition (CVD), and/or other suitable deposition methods. In some alternative embodiments, the oxide interface layer may be formed on the exposed sections of channel material of the nanosheets 152, 154, 156 and of the semiconductor fins 210 through an oxidation process. For example, the channel material may be oxidized with a wet process or via thermal oxidation. In some embodiments, the oxide interface layer may provide increased adhesion between the semiconductor surfaces (i.e., the nanosheets of channel material 152, 154, 156 and the semiconductor fins 210) and the high-k dielectric layer.

In some embodiments, the high-k dielectric layer is formed over the oxide interface layer. In some embodiments, the high-k dielectric layer has a dielectric constant greater than about 4, greater than about 12, greater than about 16, or even greater than about 20. For example, a material of the high-k dielectric layer may include a metal oxide, such as $ZrO_2$, $Gd_2O_3$, $HfO_2$, $BaTiO_3$, $Al_2O_3$, $LaO_2$, $TiO_2$, $Ta_2O_5$, $Y_2O_3$, STO, BTO, BaZrO, HfZrO, HfLaO, HfTaO, HfTiO, a combination thereof, or other suitable materials. In some alternative embodiments, the material of the high-k dielectric layer may include a silicate such as HfSiO, HfSiON LaSiO, AlSiO, or a combination thereof. In some embodiments, the method of forming the high-k dielectric layer includes performing at least one suitable deposition technique, such as CVD, PECVD, metal oxide chemical vapor deposition (MOCVD), ALD, remote plasma atomic layer deposition (RPALD), plasma-enhanced atomic layer deposition (PEALD), molecular beam deposition (MBD), or the like.

In some embodiments, the work function layer 274 is formed over the gate dielectric layer 272. A material of the work function layer 274 may include p-type work function materials such as TiN, TaN, Ru, Mo, Al, WN, $ZrSi_2$, $MoSi_2$, $TaSi_2$, $NiSi_2$, WN, and/or n-type work function materials such as Ti, Ag, TaAl, TaAlC, TiAlN, TaC, TaCN, TaSiN, Mn, Zr. In some embodiments, the method of forming the work function layer 274 includes performing at least one suitable deposition technique, such as CVD, PECVD, ALD, RPALD, PEALD, MBD, or the like. In some embodiments, the work function layer 274 serves the purpose of adjusting a threshold voltage of the transistors.

In some embodiments, the gate electrode 276 is formed over the work function layer 274. Depending on the spacing between the nanosheets of channel material 152, 154, 156 (which, in turns, depends on the original thickness of the layer of sacrificial materials 111, 113, 115 illustrated in FIG. 1), the gaps 265 (illustrated, e.g., in FIG. 11B) may be filled by the gate dielectric layer 272 and the work function layer 274. In some alternative embodiments, the gate electrode 276 also extends in between adjacent nanosheets of channel material 152, 154, 156. In some embodiments, a material of the gate electrode 276 includes titanium (Ti), tantalum (Ta), tungsten (W), aluminum (Al), zirconium (Zr), hafnium (Hf), titanium aluminum (TiAl), tantalum aluminum (TaAl), tungsten aluminum (WAl), zirconium aluminum (ZrAl), hafnium aluminum (HfAl), titanium nitride (TiN), tantalum nitride (TaN), titanium silicon nitride (TiSiN), tantalum silicon nitride (TaSiN), tungsten silicon nitride (WSiN), titanium carbide (TiC), tantalum carbide (TaC), titanium aluminum carbide (TiAlC), tantalum aluminum carbide (TaAlC), titanium aluminum nitride (TiAlN), tantalum aluminum nitride (TaAlN), any other suitable metal-containing material, or a combination thereof. In some embodiments, the gate structures 270 may further include barrier layers, work function layers, liner layers, interface layers, seed layers, adhesion layers, etc.

As illustrated in FIG. 11A, in some embodiments the gate structures 270 mostly contact the nanosheets of channel material 152, 154, 156 along surfaces (such as the surface S1) extending in XY planes. On the other hand, the gate structures 270 mostly contact the semiconductor fins 210 along surfaces (such as the surface S2) extending in YZ planes. That is, the contact areas between the nanosheets of channel material 152, 154, 156 and the gate structures 270 are mostly located in XY planes, while the contact areas between the semiconductor fins and the gate structures are mostly located in YZ planes. As such, the charge transport will happen mostly along XY planes in the nanosheets of channel material 152, 154, 156, and mostly along YZ planes in the semiconductor fins 210. In some embodiments, when materials such as silicon are used as channel material, the surfaces extending in XY planes like the surface S1 correspond to the surfaces indicated as (100) by the Miller crystallographic indexes, and the surfaces extending in YZ planes like the surface S2 correspond to the (110) crystallographic surfaces. In some embodiments, the crystallographic surfaces (100) may have superior electron mobility than the crystallographic surfaces (110), while the crystallographic surfaces (110) may have superior hole mobility than the crystallographic surfaces (100). In some embodiments, this difference in carrier properties of the crystallographic surfaces of the channel material is exploited by realizing coupled transistors having different transistor architectures. In the example illustrated in FIG. 11A, a gate-all-around transistor with nanosheets of channel material 152, 154, 156 having larger gate contact areas in XY planes is fabricated as n-type FET in the n-type region 100N, and a finFET with semiconductor fins 210 having larger gate contact areas in YZ planes is fabricated as p-type FET in the p-type region 100P. By doing so, negative charges in the n-type FET are mostly carried along (100) crystallographic surfaces, while positive charges in the p-type FET are mostly carrier along (110) crystallographic surfaces. That is, in some embodiments, the charge carrier properties of both the n-type FET and the p-type FET can be enhanced. It will be apparent that use of different transistor architectures (e.g., omega-gate transistors, π-gate, TriGate, etc.) or other combinations of transistor architectures are also conceivable, as a function, for example, of the channel material used (which determines the orientation of the crystallographic surfaces). That is, the examples of the disclosures may be adapted to different combinations of transistor architectures by considering, for example, the orientation of the contact areas between the gate structures and the semiconductor structures (e.g., the nanosheets of channel material 152, 154, 156, the semiconductor fins 210, etc.) in which the charges are carried for a given transistor architecture, and matching the orientation of these areas with the crystallographic surfaces of the channel material that more efficiently transport the desired charge carriers.

Figure 12A:
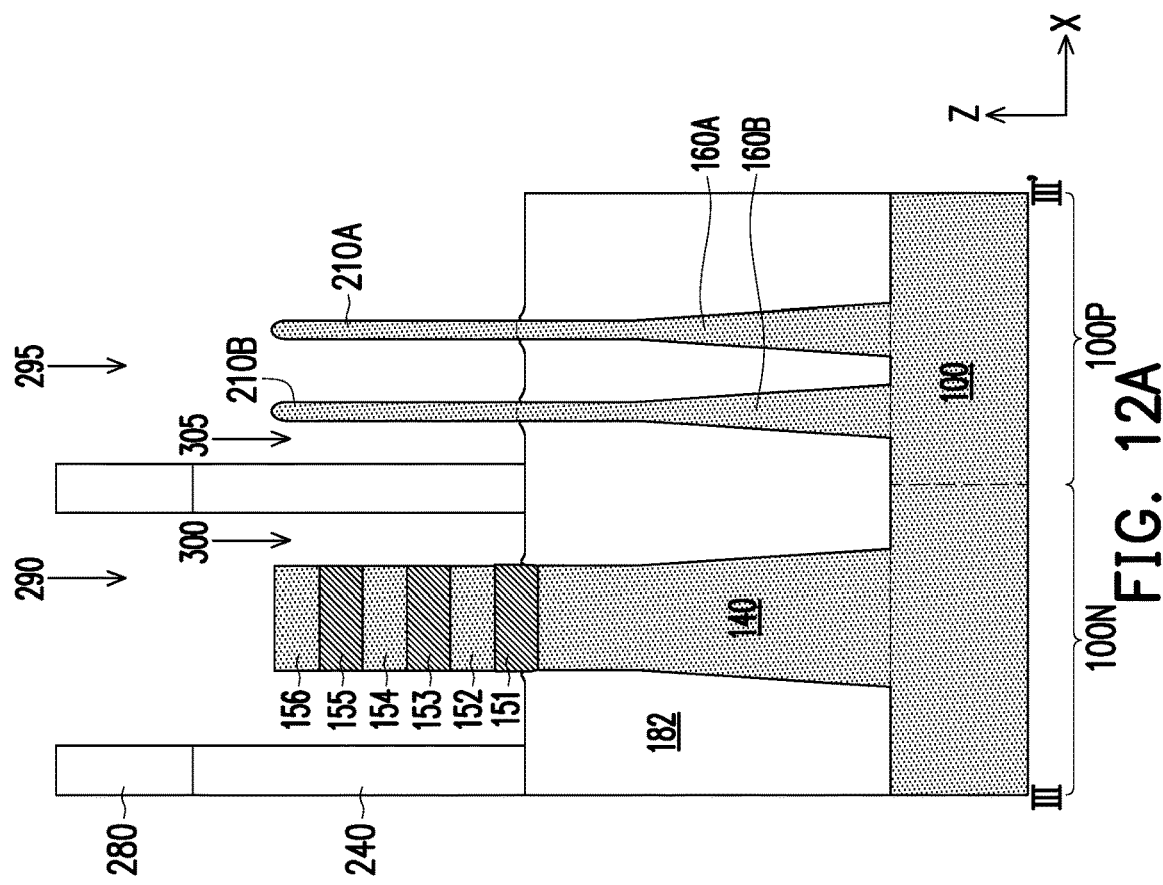
Figure 12:
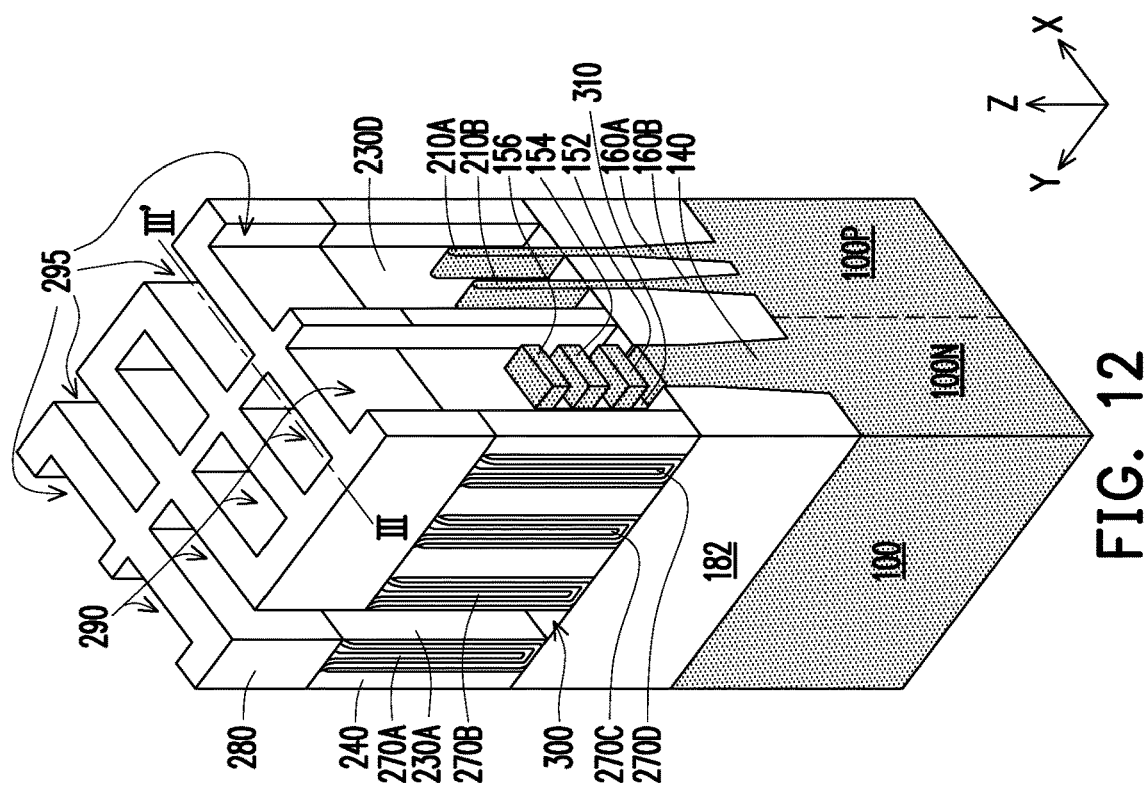

FIG. 12A is a schematic cross-sectional view of the structure illustrated in FIG. 12. The cross-sectional view of FIG. 12A is taken in a XZ plane at the level indicated by the line along the Y direction. Referring to FIG. 12 and FIG. 12A, in some embodiments a patterned mask 280 is provided on the interlayer dielectric layer 240 and the gate structures 270. The patterned mask may include openings 290 formed over the region 100N of the semiconductor substrate 100 and openings 295 formed over the region 100P of the semiconductor substrate 100. A material of the patterned mask 280 may include a positive photoresist or a negative photoresist. The patterned mask 280 may be formed, for example, via a sequence of deposition, photolithography, and etching steps. The openings 290, 295 of the patterned mask 280 are used to pattern the interlayer dielectric layer 240 to form the source and drain trenches 300, 305 at opposite sides of the gate structure 270 along the Y direction. That is, portions of the interlayer dielectric layer 240 are removed to form the source and drain trenches 300, 305 exposing sections of the nanosheets 151a-156 and of the semiconductor fins 210 in between adjacent gate structures 270. As illustrated in FIG. 12A, because the newly exposed sections of the nanosheets 151a-156 were protected by the interlayer dielectric layer 240 during formation of the gaps 261, 263, 265 (illustrated in FIG. 11B), sections of the nanosheets of sacrificial material 151a, 153a, 155a are still present in the source and drain trenches 300. In some embodiments, outer sidewalls of the gate spacers 230 may also be exposed by the source and drain trenches 300, 305. In some embodiments, each gate structure 270 has one source and drain trenches 300 or 305 formed on one side along the Y direction, and another source and drain trenches 300 or 305 formed on the opposite side along the Y direction.

FIG. 13 is a schematic cross-sectional view of a structure formed at a later stage of the manufacturing process. The cross-sectional view of FIG. 13 is taken along the same XZ plane of the view of FIG. 12A. Referring to FIG. 12A and FIG. 13, in some embodiments, the sections of the nanosheets of sacrificial material 151a, 153a, and 155a may be selectively removed. Source and drain regions 320 and 330 may be epitaxially grown in the source and drain trenches 300, 305 from the nanosheet base 140 and the nanosheets of channel material 152, 154, 156, and from the semiconductor fins 210, respectively. The source and drain regions 320 are formed in the source and drain trenches 300 of the interlayer dielectric layer 240 and may wrap around the sections of the nanosheets of channel material 152, 154 156 exposed in the source and drain trenches 300. Similarly, the source and drain regions 330 are formed in the source and drain trenches 305, on the exposed surfaces of the semiconductor fins 210. In some alternative embodiments, the channel material of the nanosheets 152, 154, 156 and the semiconductor fins 210 may be removed before epitaxially growing the source and drain regions 320, 330. In such cases, the source and drain regions may grow from the nanosheet base 140, the fin bases 160, and the surfaces of the nanosheets of channel material 152, 154, 156 and the semiconductor fins 210 exposed along the sidewalls of the source and drain trenches 300, 305.

In some embodiments, a material of the source and drain regions 320, 330 may differ from the channel material of the nanosheets 152, 154, 156 or the semiconductor fins 210 sandwiched in between. In some embodiments, the material of the source and drain regions 320, 330 is doped with a conductive dopant. For example, a strained material, such as SiGe, is epitaxially grown with a p-type dopant for straining the source and drain region 330 in the p-type region 100P. That is, the strained material is doped with the p-type dopant to be the source and drain regions 330 of the p-type FET including the semiconductor fins 210. Possible p-type dopants include, for example, boron or $BF_2$, and the strained material may be epitaxially grown by LPCVD process with in-situ doping. In some alternative embodiments, the strained material, such as SiC, SiP, a combination of SiC/SiP, or SiCP, is epitaxially grown with an n-type dopant for straining the source and drain regions 320 in the n-type region 100N. That is, the strained material is doped with the n-type dopant to be the source and drain regions 320 of the n-type FET including the nanosheets of channel material 152, 154, 156. Possible n-type dopants include arsenic and/or phosphorus, and the strained material may be epitaxially grown by LPCVD process with in-situ doping. In some embodiments, the material within the source and drain regions 320, 330 may be disposed as a single-layered structure. In some alternative embodiments, the material of the source and drain regions 320, 330 is disposed as a multi-layered structure, with different layers having different degrees of doping.

Figure 14:
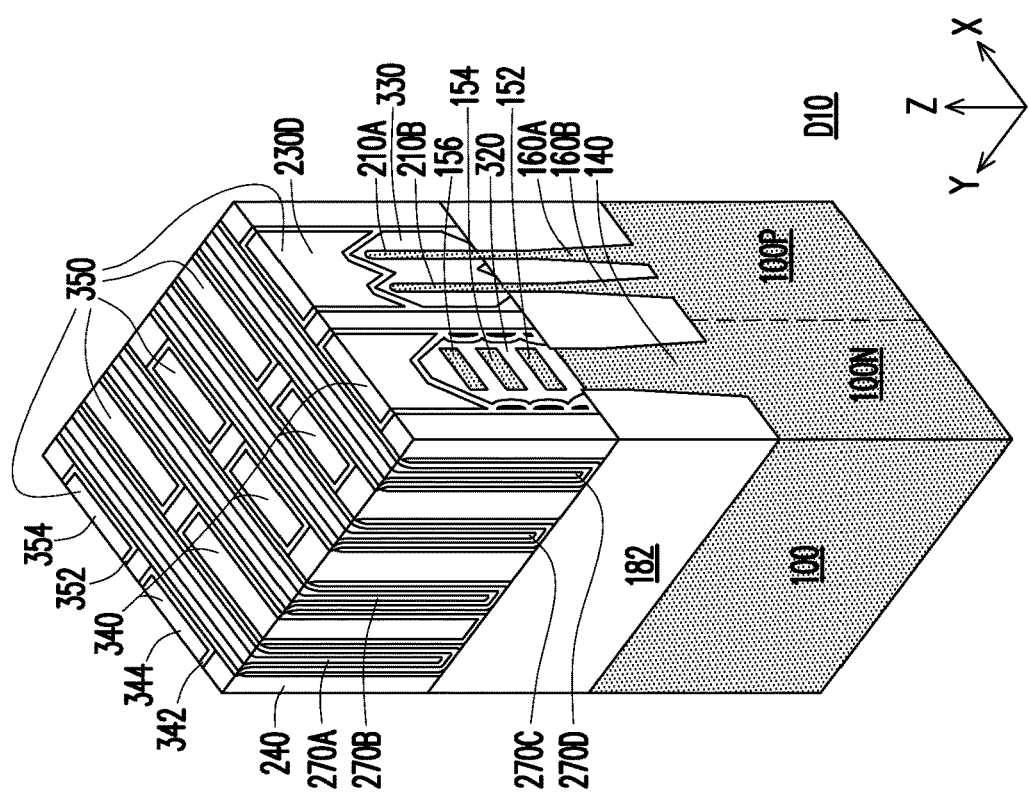
Figure 14B:
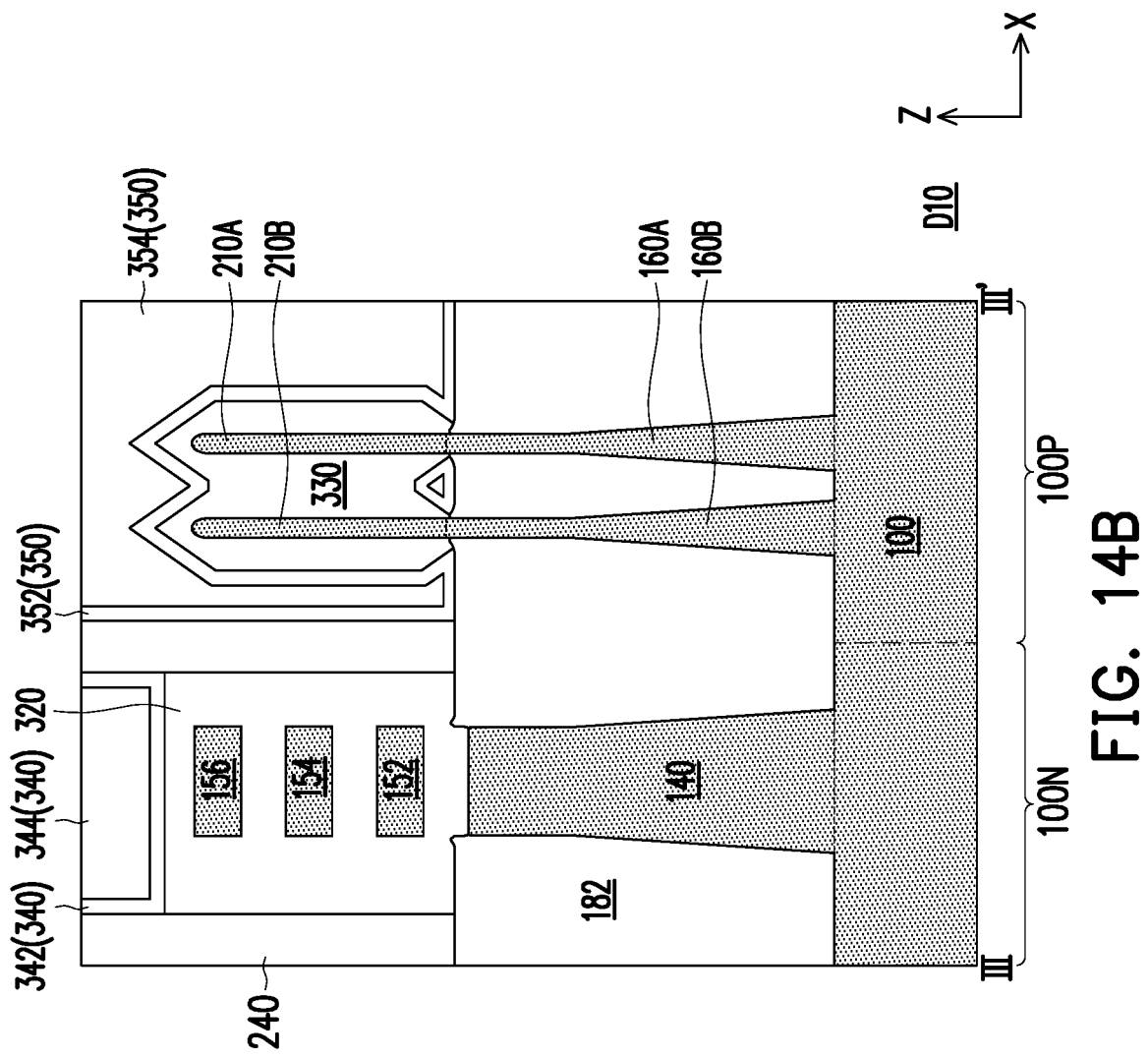

FIG. 14A is a schematic perspective sectional view of the CMOS device D10 illustrated in FIG. 14, taken along the same YZ plane of the view of FIG. 10A. FIG. 14B is a schematic cross-sectional view of the CMOS device D10 taken along the same XZ plane as FIG. 13. Referring to FIG. 13, FIG. 14, FIG. 14A, and FIG. 14B, in some embodiments, source and drain contacts 340 and 350 are formed in the source and drain trenches 300 and 305, respectively. In some embodiments, the source and drain contacts 340, 350 may each include a seed layer 342 or 352 with a metallic contact 344 or 354 disposed thereon. In some embodiments, the seed layers 342, 352 are first formed in the openings, and the metallic contacts 344, 354 are formed on the seed layers 342, 352 for example via a plating process. In some embodiments, the seed layers 342, 352 may include, for example, copper, tantalum, titanium, a combination thereof, or other suitable materials. In some embodiments, the seed layers 342, 352 may be formed from a common seed material layer (not shown) blanketly formed over the semiconductor substrate 100 after removal of the patterned mask 280. The seed material layer may be conformally formed on the source and drain regions 320, 330, the interlayer dielectric layer 240, and the gate spacers 230 in the source and drain trenches 300, 305. The seed material layer may be formed through, for example, a sputtering process, a physical vapor deposition (PVD) process, or the like. In some embodiments, a barrier layer (not shown) may be deposited before forming the seed material layer to prevent out-diffusion of the material of the seed material layer. The material of the metallic contacts 344, 354 may then be plated on the seed material layer. The material of the metallic contacts 344, 354 may include cobalt (Co), tungsten (W), copper (Cu), titanium (Ti), tantalum (Ta), aluminum (Al), zirconium (Zr), hafnium (Hf), or other suitable metals. In some embodiments, the metallic contacts 344, 354 may include cobalt, tungsten, or copper. In some embodiments, the material of the metallic contacts 344 354 may initially extend also on the interlayer dielectric layer 240. A planarization process may be performed to remove excess material of the metallic contacts 344 and the portions of the seed material layer extending on the interlayer dielectric layer 240, thus forming source and drain contacts 340, 350 which are substantially coplanar with the interlayer dielectric layer 240. In some embodiments, the source and drain contacts 340 are alternately disposed with the gate structures 270 over the nanosheets of channel material 152, 154, 156 along the Y direction. Similarly, the source and drain contacts 350 are alternately disposed with the gate structures 270 over the semiconductor fins 210 along the Y direction. In some embodiments, the gate spacers 230, the interlayer dielectric layer 240 and or the gate dielectric layers 272 avoid electrical short-cuts between the gate structures 270 and the source and drain contacts 340, 350.

In some embodiments, the CMOS device D10 may be integrated into larger circuits (not shown). For example, additional interlayer dielectric layers (not shown) may be formed on and/or around the CMOS device D10, and via contacts (not shown) may be formed to contact the gate structures 270 and the source and drain contacts 340, 350. It should be noted that while the CMOS device D10 is illustrated as having the structure of a NAND logic gate, the disclosure is not limited thereto. That is, CMOS devices according to some embodiments of the disclosure may be other logic gates, memory cells, or any other type of CMOS devices.

Figure 16:
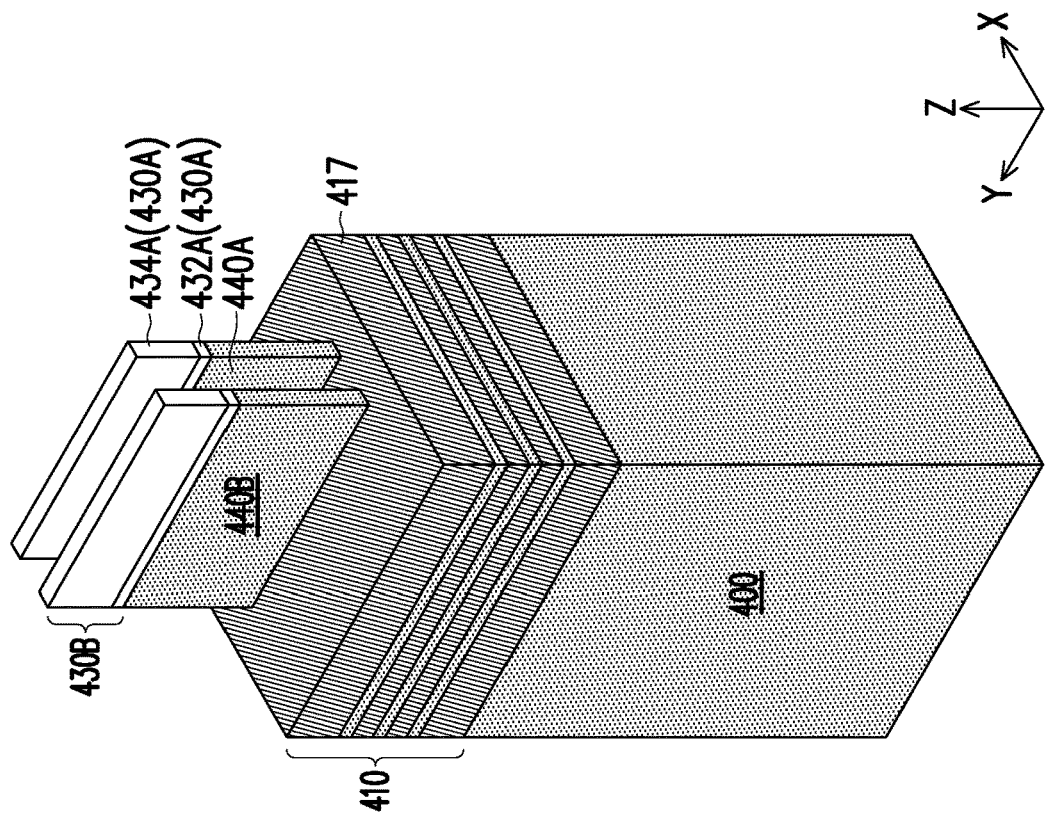
FIG. 15 to FIG. 19, FIG. 22, FIG. 26, FIG. 27, FIG. 30, FIG. 31, and FIG. 33 are schematic perspective views of structures produced during a manufacturing method of a CMOS device according to some embodiments of the present disclosure.
Figure 15:
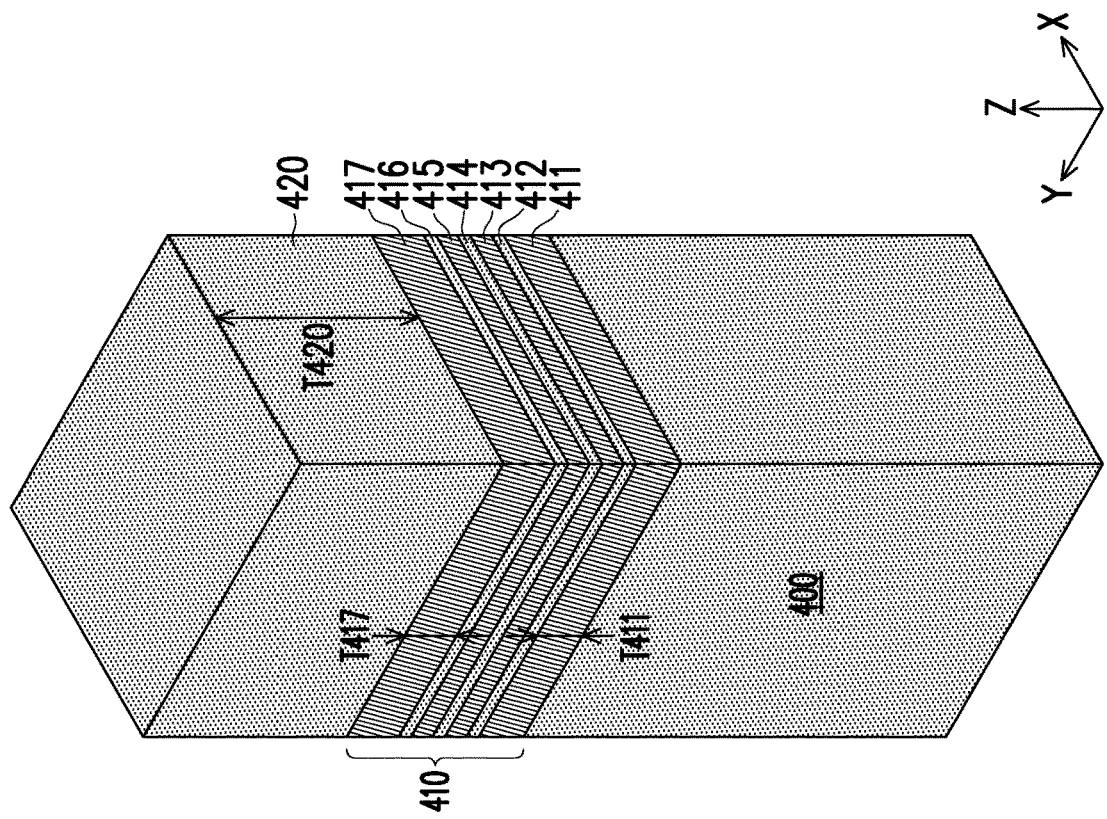

FIG. 15 to FIG. 43 are schematic views of structures produced during a manufacturing method of a CMOS device D20 according to some embodiments of the disclosure. FIG. 15 to FIG. 19, FIG. 22, FIG. 26, FIG. 27, FIG. 30, FIG. 31, and FIG. 33 are schematic perspective views, FIG. 27A to FIG. 29, FIG. 30A, FIG. 20B, FIG. 31A, FIG. 32, and FIG. 33A to FIG. 43 are schematic perspective sectional views, and FIG. 17A to FIG. 19A, to FIG. 21, FIG. 22A to FIG. 25, FIG. 26A, and FIG. 26B are schematic cross-sectional views. For clarity of illustrations, in the drawings are illustrated the orthogonal axes (X, Y and Z) of the Cartesian coordinate system according to which the views are oriented. Referring to FIG. 15, in some embodiments a semiconductor substrate 400 is provided. In some embodiments, the semiconductor substrate 400 includes similar materials as the semiconductor substrate 100 (illustrated, e.g., in FIG. 1) and a detailed description thereof is omitted herein for brevity's sake. In some embodiments, the portion of semiconductor substrate 400 illustrated in FIG. 15 is not divided in n-type or p-type regions (as, for example, the regions 100N and 100P illustrated in FIG. 1). In some embodiments, the stacked semiconductor layers 410 are provided on the semiconductor substrate 400 similar to what was previously described for the stacked semiconductor layers 110. A difference between the structure illustrated in FIG. 15 with the structure illustrated in FIG. 1 lies in the stacked semiconductor layers 410 having, as uppermost layer, a layer of sacrificial material 417. In some embodiments, the bottommost layer of sacrificial material 411 and the uppermost layer of sacrificial material 417 may independently have the respective thicknesses T411 and T417 along the Z direction in the range from 10 nm to 40 nm. The other layers 412-416 may independently have the corresponding thicknesses in the Z direction in the range from 5 nm to 15 nm. As illustrated in FIG. 15, a block of channel material 420 is formed on top of the stacked semiconductor layers 410. For example, the block of channel material 420 may be epitaxially grown on the stacked semiconductor layers 410. In some embodiments, the layers of channel materials 412, 414, 416 may have been doped with n-type dopants, while the block of channel material 420 may have been doped with p-type dopants. In the following, as a way of example, it will be considered that the semiconductor substrate 400, the layers of channel material 412, 414, 416, and the block of channel material 420 are made of silicon, optionally doped, while silicon germanium (SiGe) will be considered as sacrificial material for the layers 411, 413, 415, 417. However, the disclosure is not limited thereto, and other combinations of materials are contemplated within the scope of the disclosure. In some embodiments, the thickness T420 in the Z direction of the block of channel material 420 may be in the range from 20 nm to 100 nm, for example in the range from 30 nm to 60 nm Referring to FIG. 15 and FIG. 16, hard masks 430 are formed on the block of channel material 420, and are used to pattern semiconductor fins 440 out of the block of channel material 420. In some embodiments, the hard masks 430 include etch stop layers 432 and one or more mask layers 434. Upon formation of the semiconductor fins 440, the uppermost layer of sacrificial material 417 may be at least partially exposed. In some embodiments, the semiconductor fins 440 may have a height in the Z direction in the range from 30 nm to 100 nm. In some embodiments, the height of the semiconductor fins 440 in the Z direction may be in the range from 30 nm to 60 nm. Materials and fabrication methods of the hard masks 430 may be selected from similar options as previously discussed for the hard masks 120, 130 illustrated in FIG. 2, and a detailed description thereof is omitted herein. While only two hard masks 430A, 430B and two semiconductor fins 440 are illustrated in FIG. 16, the disclosure is not limited by the number of semiconductor fins 440 formed from the block of channel material 420.

Figure 17A:
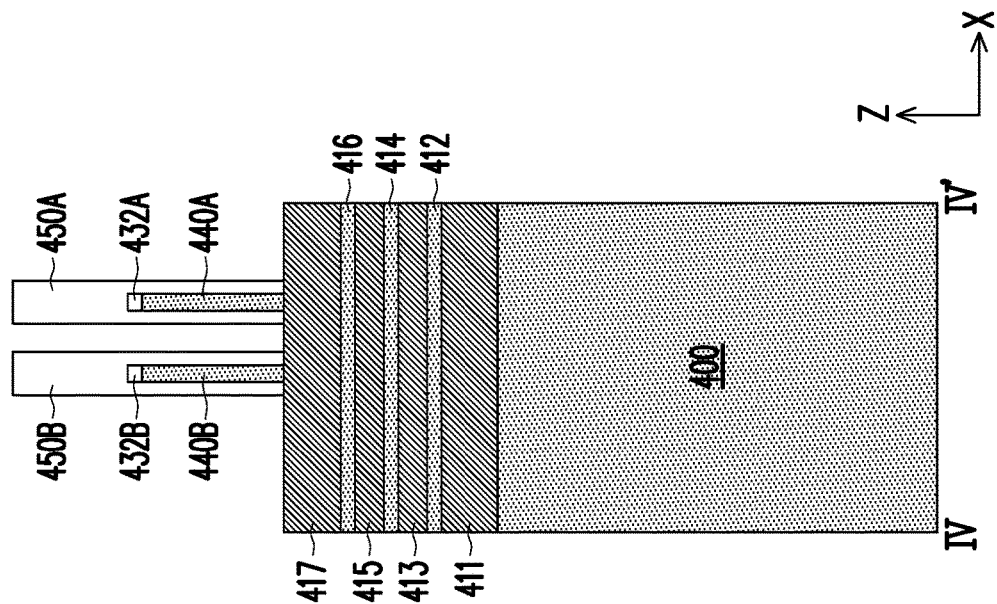
FIG. 17A, FIG. 18A, FIG. 19A, FIG. 22A, FIG. 26A, FIG. 26B are schematic cross-sectional views of the respective structures illustrated in FIG. 17, FIG. 18, FIG. 19, FIG. 22, and FIG. 26 according to some embodiments of the present disclosure.
Figure 17:
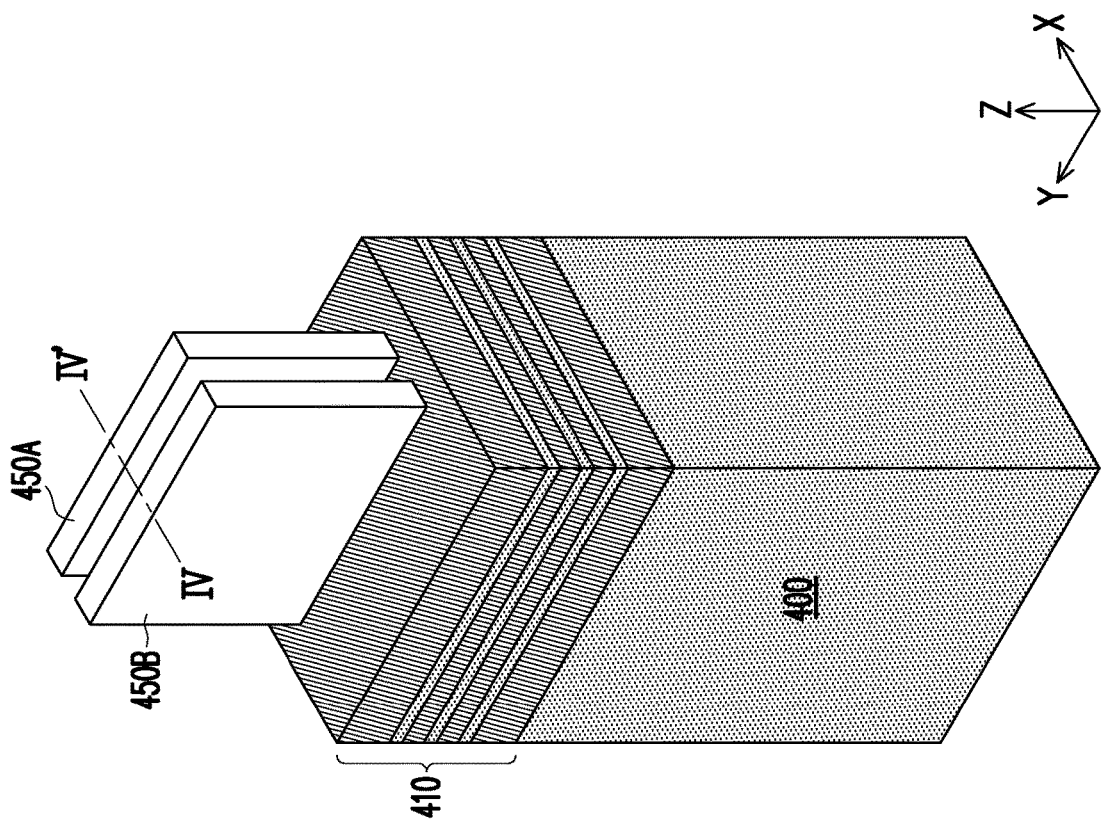
Figure 18A:
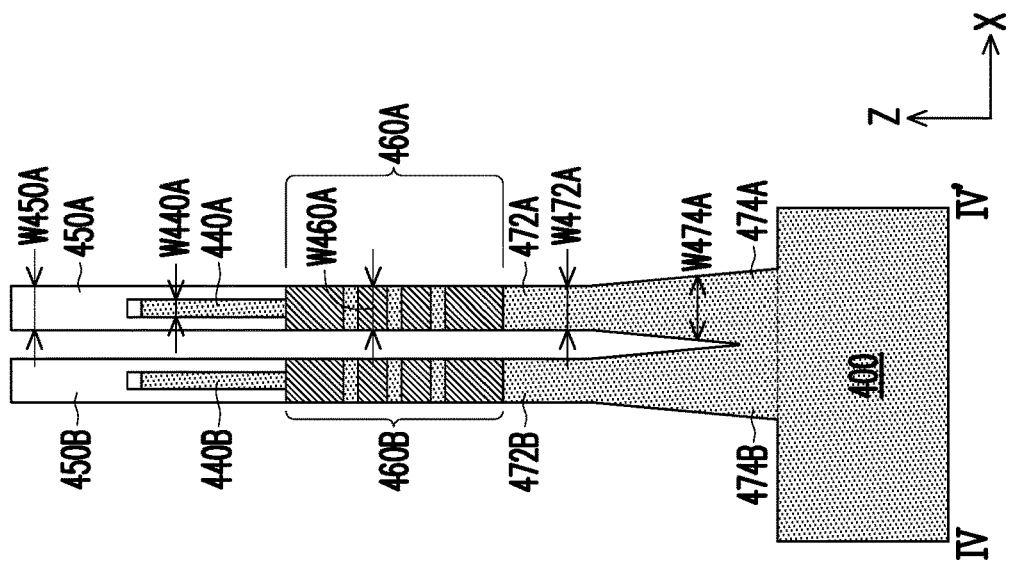
Figure 18:
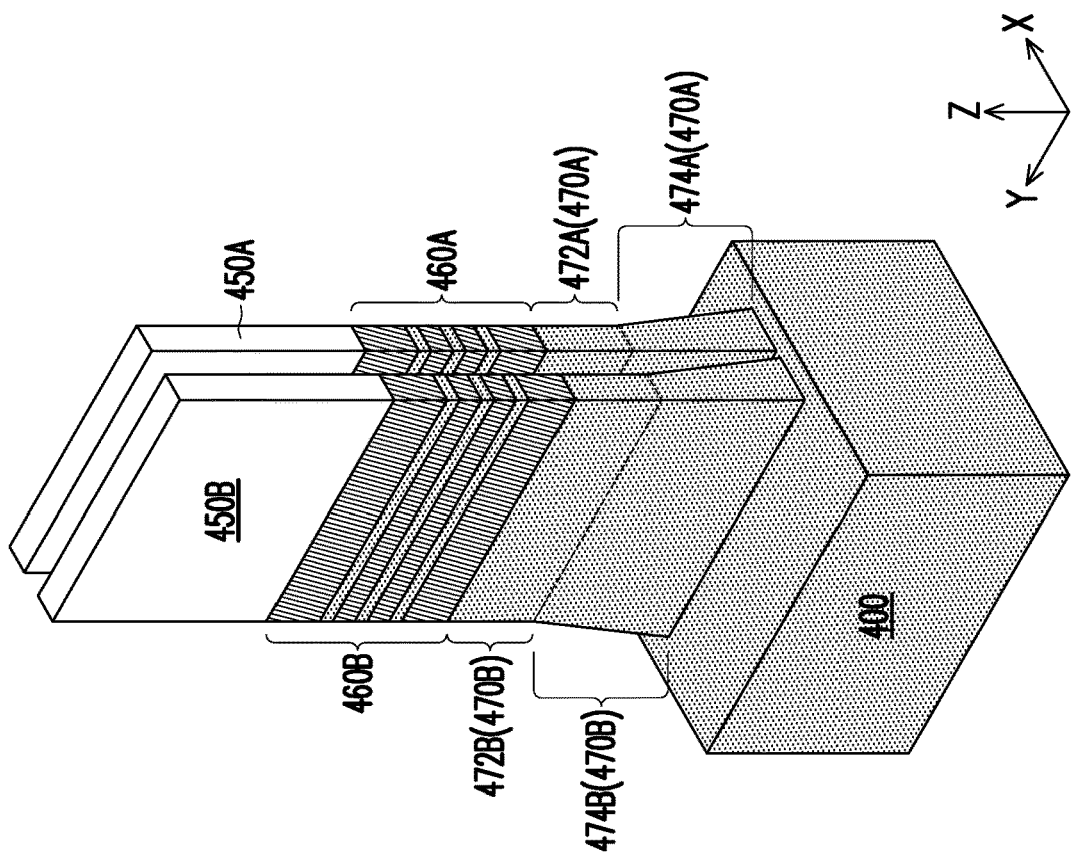
Figure 19A:
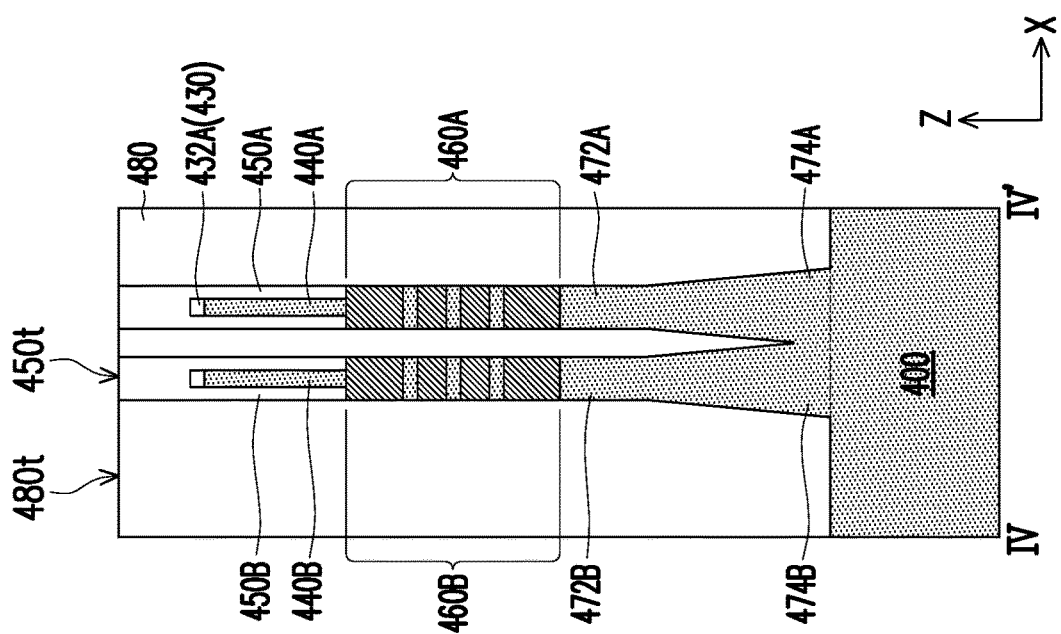
Figure 19:
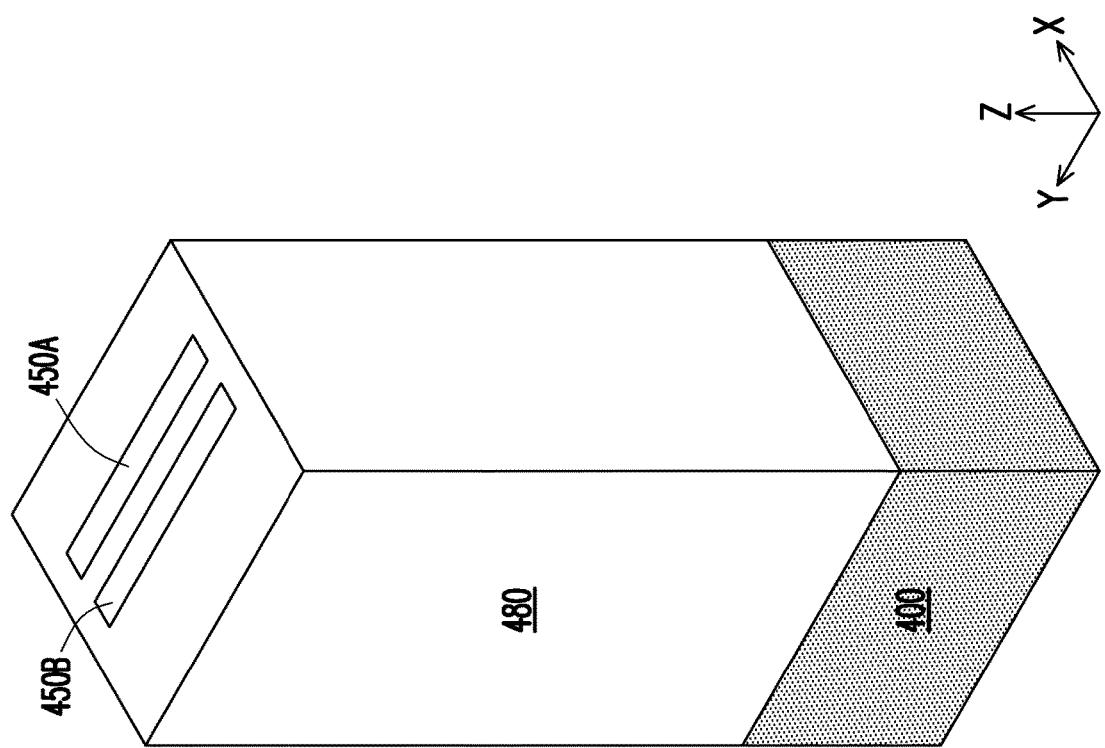

FIG. 17A to FIG. 19A are schematic cross-sectional views of the structure respectively illustrated in FIG. 17 to FIG. 19 in an XZ plane at the level indicated by the line IV-IV' along the Y direction. Referring to FIG. 16, FIG. 17, and FIG. 17A, fin spacers 450 are formed on the semiconductor fins 440 and the hard masks 430 over the layer of sacrificial material 417. The fin spacers 450 may cover the hard masks 430 as well as the sidewalls of the semiconductor fins 440. That is, the footprint of the fin spacers 450 may be larger than the footprint of the semiconductor fins 440. In some embodiments, a material of the fin spacers 450 may be the same as a material of the mask layers 434. In some embodiments, the fin spacers 450 may be formed by blanketly depositing the material of the fin spacers 450, followed by one or more etching steps. Auxiliary masks (not shown) may be provided to determine the shape of the fin spacers 450 during the etching steps. As illustrated in FIG. 18 and FIG. 18A, the fin spacers 450 may be used as hard masks to etch the stacked semiconductor layers 410 and the semiconductor substrate 400 to respectively form nanosheets 460 on top of nanosheets bases 470. In some embodiments, the width W450 of the area occupied by the fin spacers 450 along the X direction may be selected as a function of the desired width W460 for the nanosheets 460. In some embodiments, the width W450 of the fin spacers 450 (and, hence, the width W460 of the nanosheets 460) is larger than the width W440 of the corresponding semiconductor fins 440. For example, the width W440 of the semiconductor fins 440 may be in the range from 5 to 15 nm, while the width W460 of the nanosheets 460 may be in the range from 10 to 40 nm. In some embodiments, W440 and W460 are separately optimized to serve the performance needs of pFET and nFET. In some embodiments, the nanosheets bases 470 include an upper straight portion 472 and a lower tapered portion 474. In some embodiments, the width W472 of the upper straight portion 472 may be substantially equal to the width W460 of the nanosheets, while the width W474 of the tapered portion may gradually increase proceeding from the upper straight portion 472 towards the semiconductor substrate 400. In some embodiments, depending on the tapering angle of the tapered portions 474 and the spacing between the nanosheets 460, the nanosheets bases 470 may merge with each other before merging into the semiconductor substrate 400.

Referring to FIG. 19 and FIG. 19A, an insulating material 480 is disposed on the semiconductor substrate 400. The insulating material 480 may be produced so as to reach a level height in the Z direction sufficient to cover the nanosheets 460 and the semiconductor fins 440. In some embodiments, the insulating material 480 may include similar material as the ones listed above for the insulating material 180 (illustrated, e.g., in FIG. 3). In some embodiments, the insulating material 480 may be planarized following its deposition, so that the top surface 480t may be substantially coplanar with the top surfaces 450t of the fin spacers 450. In some embodiments, portions of the fin spacers 450 may be removed during planarization of the insulating material 480.

Figure 21:
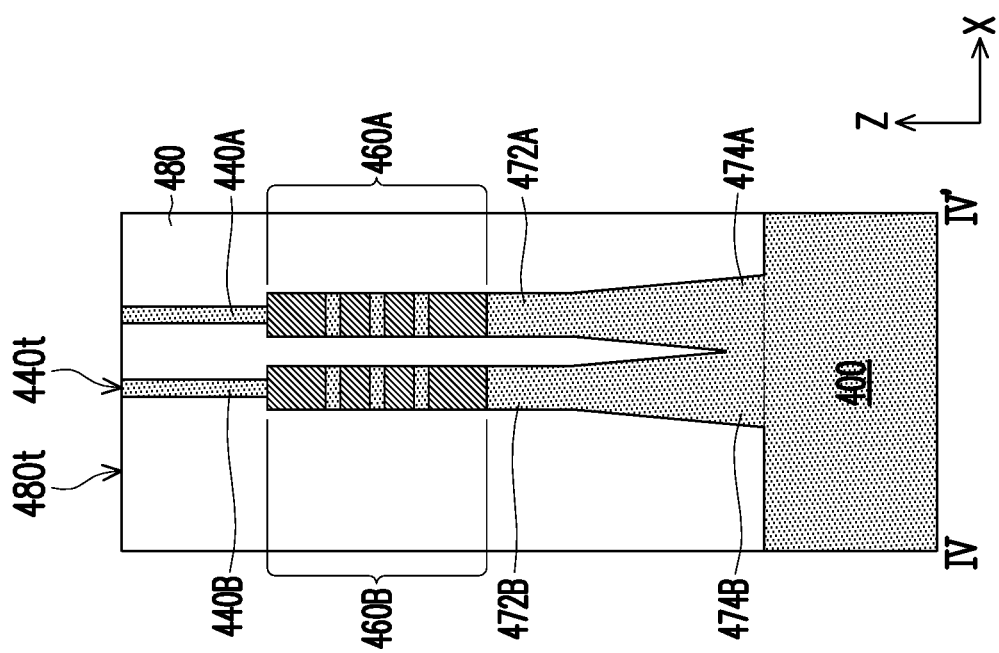
Figure 20:
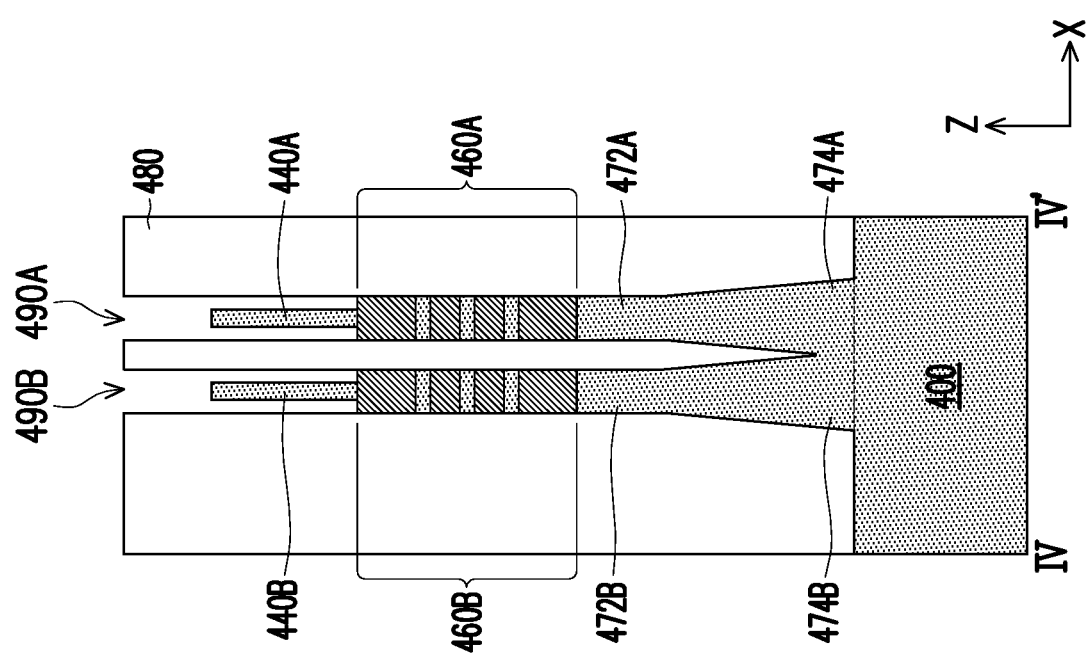

FIG. 20 and FIG. 21 are schematic cross-sectional views of structures produced at later stages of the manufacturing process. The views of FIG. 20 and FIG. 21 are taken in the same XZ plane as the view of FIG. 19A. Referring to FIG. 19 to FIG. 21, the fin spacers 450 and any residual layer of the hard masks 430 may be removed from over the semiconductor fins 440, for example via selective etching. Following removal of the fin spacers 450, the semiconductor fins 440 may be exposed within recesses 490 formed in the insulating material 480. Thereafter, additional insulating material 480 may be deposited in the recesses 490 to cover the semiconductor fins 440, and a planarization process may be performed to remove portions of the insulating material 480 until the top surfaces 440t of the semiconductor fins 440 are exposed. Following planarization, the top surfaces 440t of the semiconductor fins 440 may be substantially coplanar with the top surface 480t of the insulating material 480.

Figure 22A:
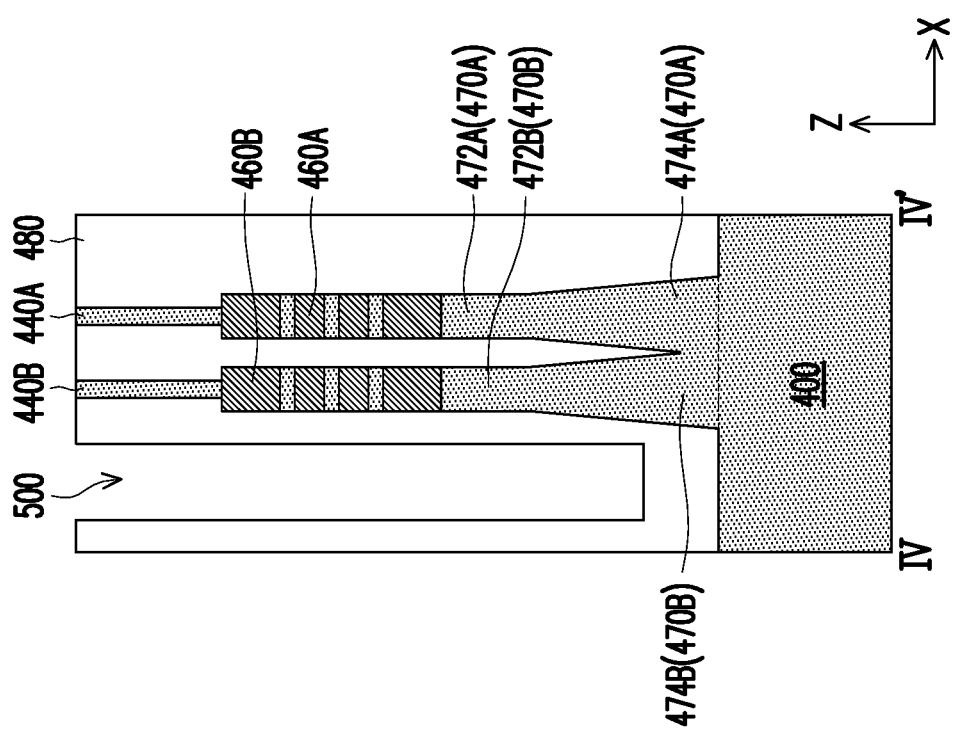
Figure 22:
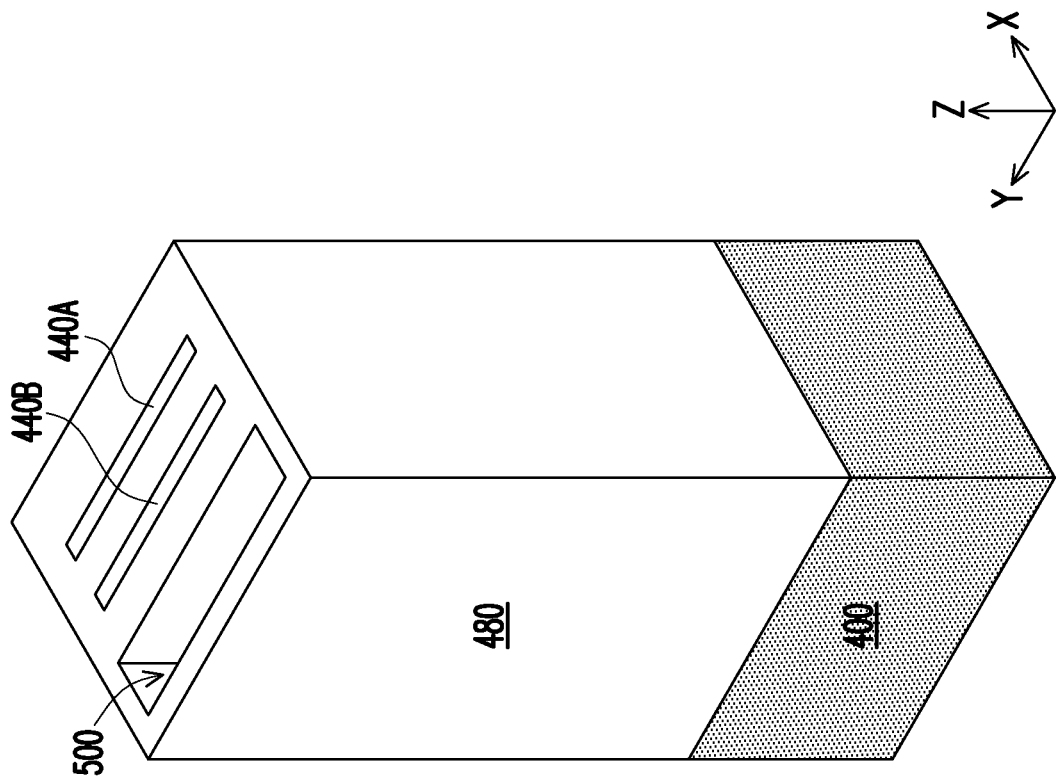

FIG. 22A is a schematic cross-sectional view of the structure illustrated in FIG. 22, taken in the same XZ plane as the view of FIG. 21. Referring to FIG. 22 and FIG. 22A, a deep trench 500 may be opened in the insulating material 480 on the side of the semiconductor fins 440 and the nanosheets 460. The deep trench 500 may extend parallel to the semiconductor fins 440 and the nanosheets 460 along the Y direction. In some embodiments, the width along the X direction of the deep trench 500 may be smaller than the length along the Y direction. In some embodiments, the deep trench 500 is located on a side of the semiconductor fin 440B and the nanosheets 460B opposite along the X direction with respect to the semiconductor fin 440A and the nanosheets 460A. That is, the semiconductor fin 440B and the nanosheets 460B may be disposed in between the deep trench 500 on one side and the semiconductor fins 440A with the underlying nanosheets 460A on the other side. In the Z direction, the deep trench 500 may reach all the way down to the tapered portions 474 of the nanosheets bases 470, falling just short of reaching the semiconductor substrate 400. That is, a portion of the insulating material 480 may separate the bottom of the deep trench 500 from the semiconductor substrate 400.

FIG. 23 to FIG. 25 are schematic cross-sectional views of structures produced at some later stages of the manufacturing process. The views of FIG. 23 to FIG. 25 are taken in the same XZ plane as the view of FIG. 22A. Referring to FIG. 22 and FIG. 23, in some embodiments, the deep trench 500 may be filled by a metallic material 510a, for example via a sequence of deposition and planarization steps. In some embodiments, the metallic material 510a may include Ru, W, or any other metal which is used in the interconnect. Barrier layers, for example including TiN or TaN, may be optionally formed in the deep trench 500 before depositing the metallic material 510a. Referring to FIG. 23 and FIG. 24, the metallic material 510a may be etched to partially reopen the deep trench 500, leaving a metal plug 510 at the bottom of the deep trench 500. In some embodiments, the metal plug 510 may extend from the bottom of the deep trench to a level height in the Z direction lower with respect to the bottom of the nanosheets 460. That is, the metal plug 510 may reach a height level in the Z direction lower than the interfaces between the nanosheets bases 470 and the nanosheets 460. Referring to FIG. 24 and FIG. 25, the metal plug 510 may be buried by depositing additional insulating material 480 in the deep trench 500. A planarization process may be optionally performed following filling of the deep trench 500.

Figure 26:
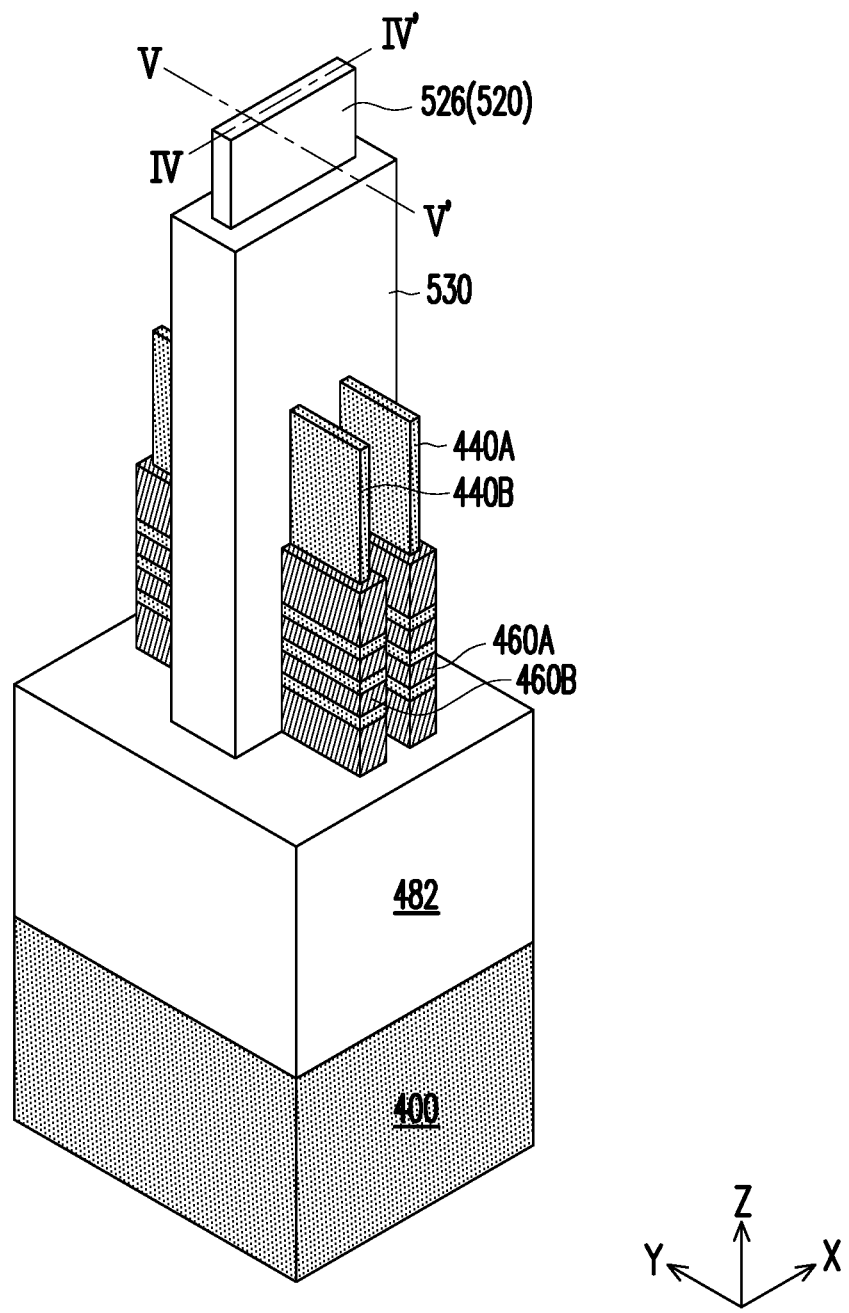
Figure 26B:
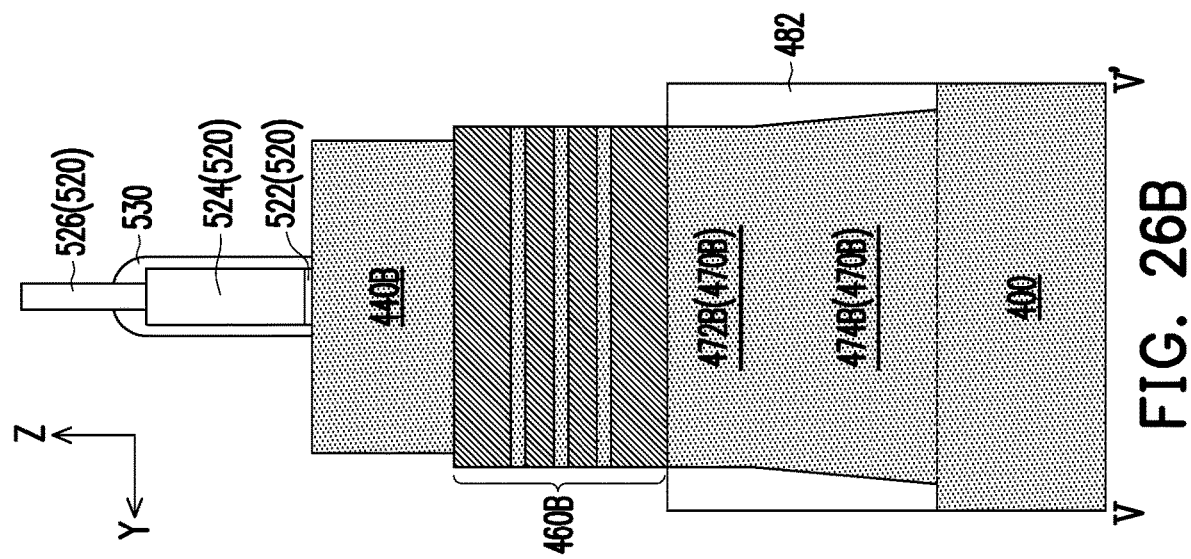
Figure 26A:
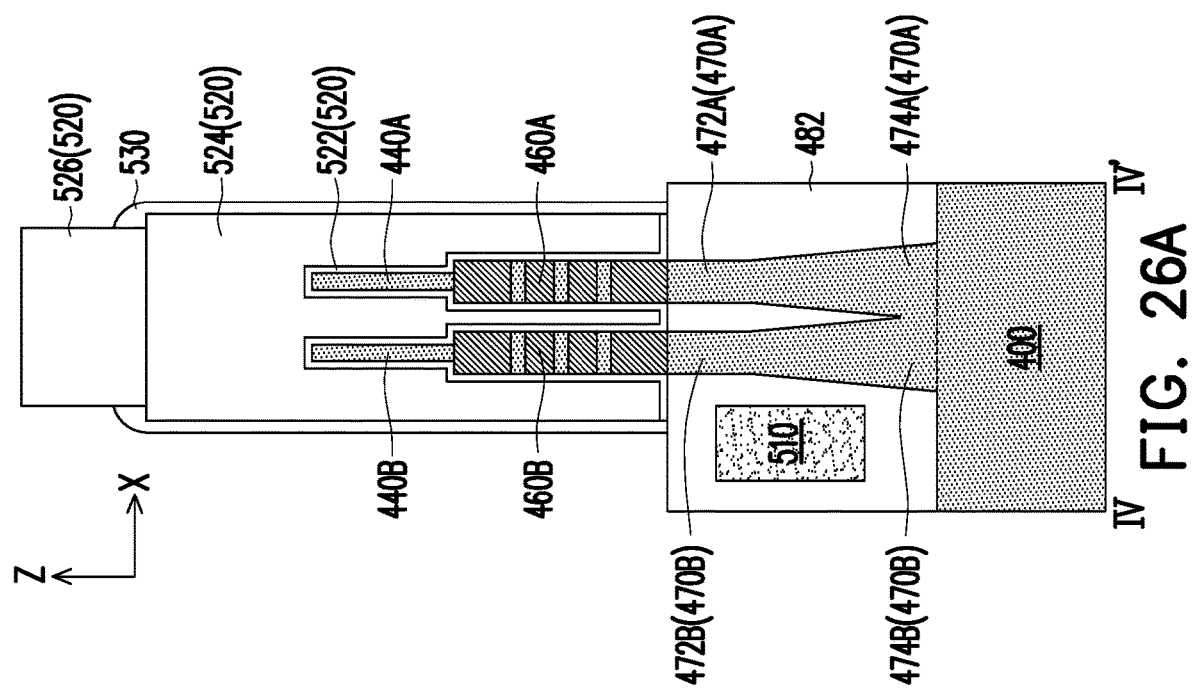

FIG. 26A is a schematic cross-sectional view of the structure illustrated in FIG. 26 taken along the same XZ plane of the view of FIG. 25. FIG. 26B is a schematic cross-sectional view of the structure illustrated in FIG. 26 taken along the YZ plane in at the level height of the line V-V' along the X direction. Referring to FIG. 25, FIG. 26, FIG. 26A, and FIG. 26B, in some embodiments the insulating material 480 is selectively recessed to form isolation structures 482 over the semiconductor substrate 400. The isolation structures 482 may surround the nanosheets bases 470 and completely bury the metal plug 510, while leaving exposed the nanosheets 460. Thereafter, one or more dummy gate structures 520 may be provided on the isolation structure 482, extending in the X direction across the semiconductor fins 440 and the underlying nanosheets 460. While only one dummy gate structure 520 is illustrated in the drawings, the disclosure is not limited by the number of dummy gate structures 520, which may be decided according to the requirements of the circuit design. The dummy gate structure 520 may include the dummy gate dielectric layer 522, the dummy gate body 524, and the dummy gate hard mask 526. The dummy gate structure(s) 520 may be fabricated employing similar materials and following similar processes as previously described for the dummy gate structures 220 with reference to FIG. 7. Gate spacers 530 are formed around the dummy gate structure(s) 520, covering the dummy gate body 524, the dummy gate dielectric layer 522, and portions of the dummy gate hard mask 526. The dummy gate hard mask 526 may be at least partially exposed by the gate spacers 530.

Figure 27:
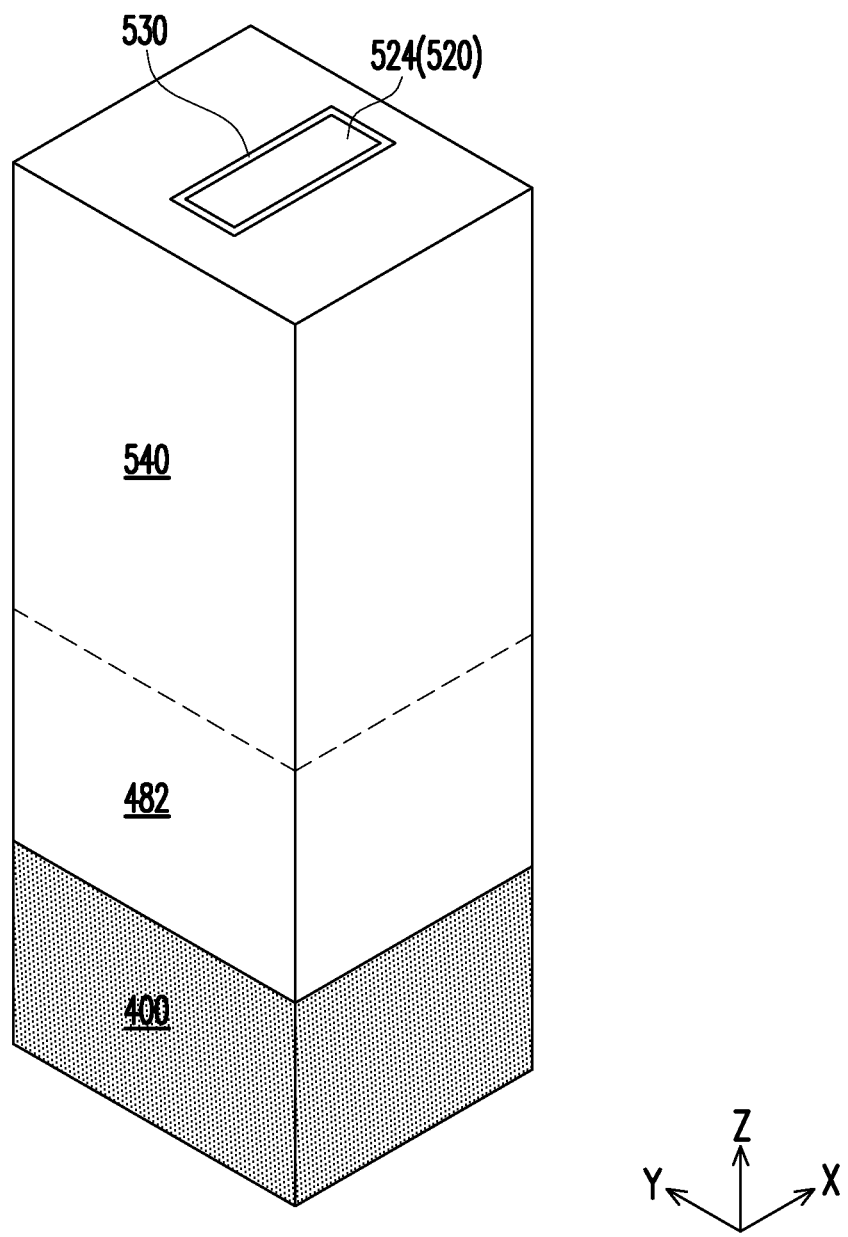
Figure 27A:
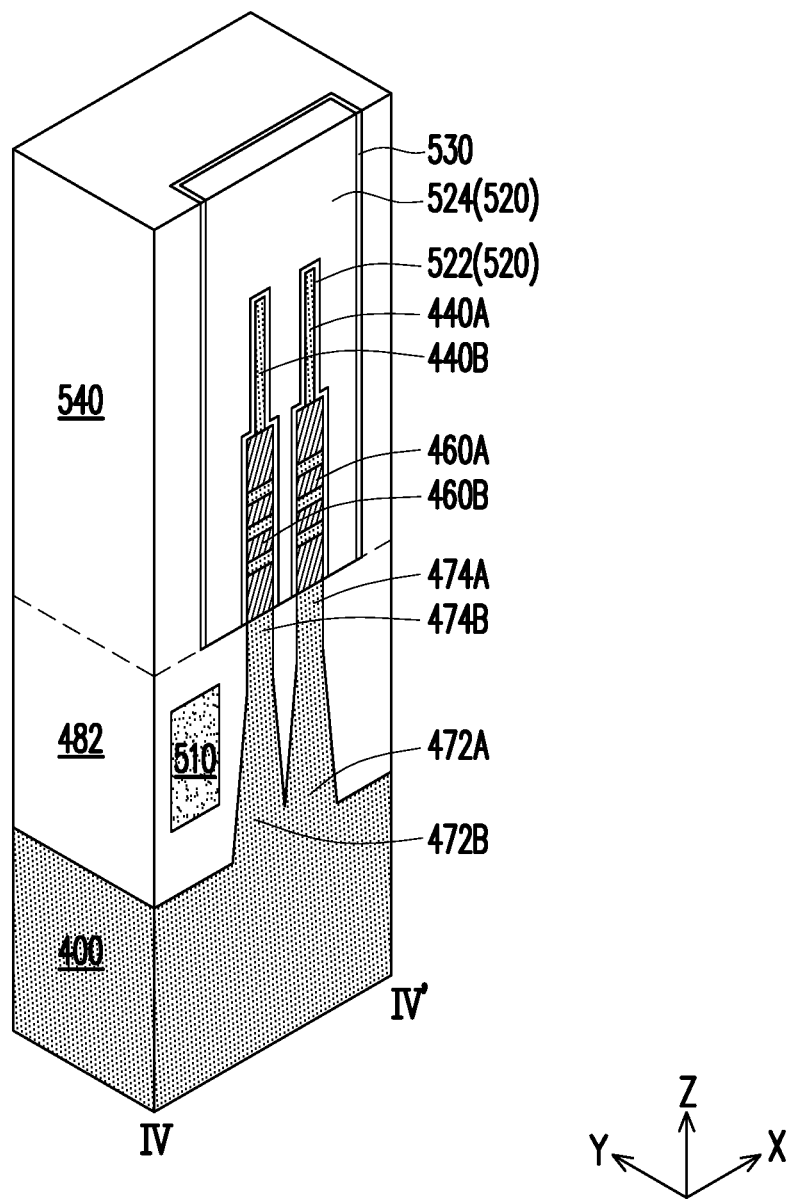
FIG. 27A, FIG. 30A and FIG. 30B, FIG. 31A, and FIG. 33A are schematic perspective sectional views of the structures respectively illustrated in FIG. 27, FIG. 30, FIG. 31, and FIG. 33 according to some embodiments of the present disclosure.

FIG. 27A is a schematic perspective sectional view of the structure illustrated in FIG. 27, cut at the XZ plane at the level height of the line IV-IV' (illustrated in FIG. 26) along the Y direction. Referring to FIG. 26, FIG. 27, and FIG. 27A, an interlayer dielectric layer 540 may be formed on the isolation structure 482, encapsulating the nanosheets 460, the semiconductor fins 440, the dummy gate structure(s) 520, and the gate spacers 530. The interlayer dielectric layer 540 may be formed employing similar materials and following a similar process as previously described for the interlayer dielectric layer 240 with reference to FIG. 8. In some embodiments, the insulating material of the interlayer dielectric layer 540 may be deposited to originally cover the dummy gate hard mask 526, and then planarized until the dummy gate body 524 is exposed. That is, during the planarization step, the dummy gate hard mask 526 may be removed. Following planarization, the gate spacers 530 and the dummy gate body 524 are exposed at the top surface of the interlayer dielectric layer 540.

Figure 28:
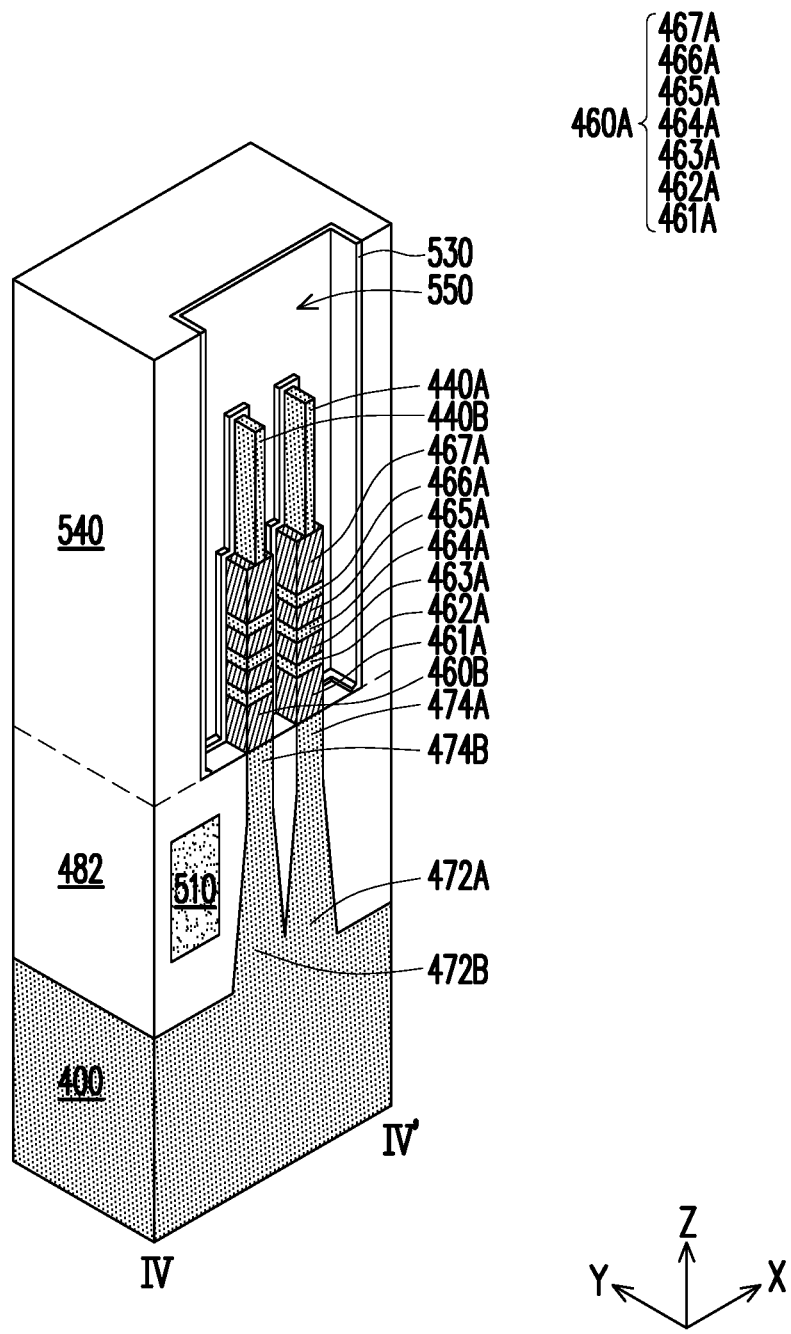
FIG. 28, FIG. 29, FIG. 32, and FIG. 34 to FIG. 43 are schematic perspective sectional views of structures produced during a manufacturing method of a CMOS device according to some embodiments of the present disclosure.
Figure 29:
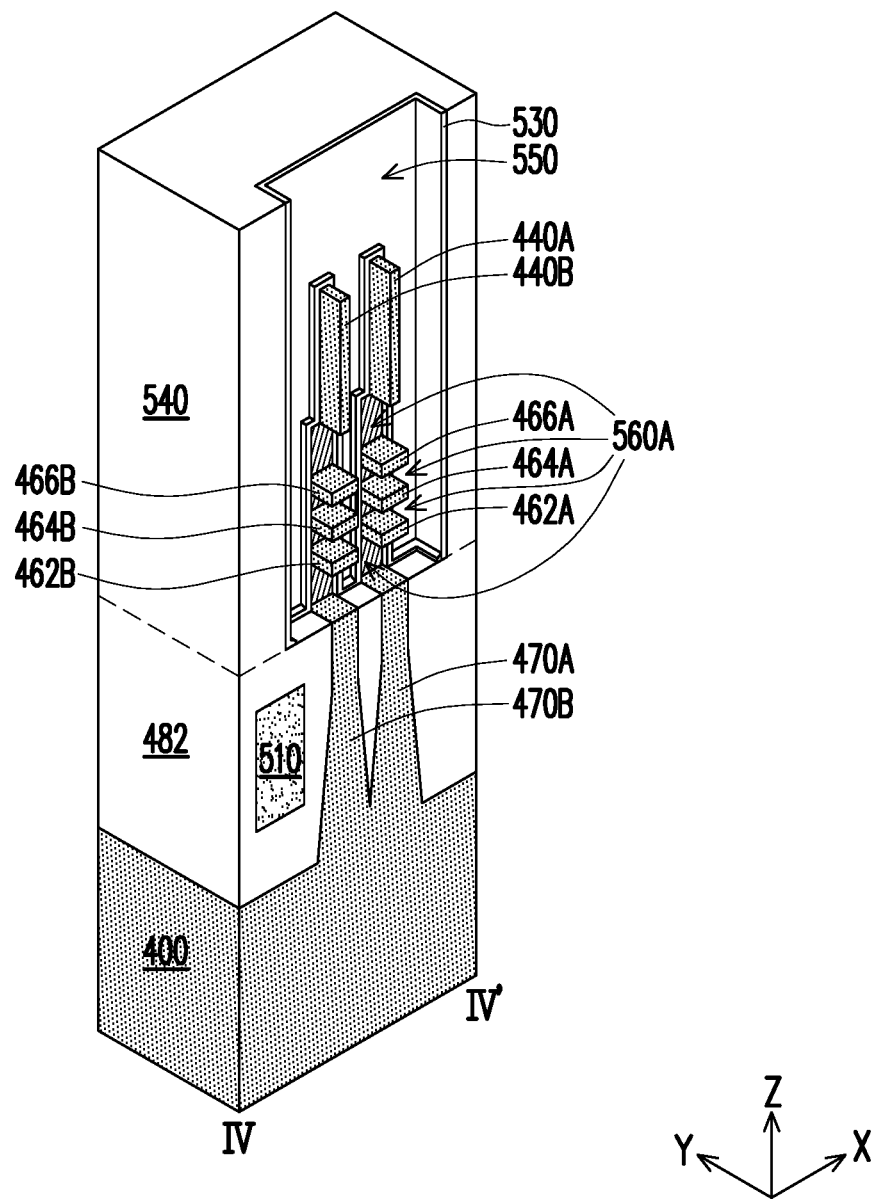

FIG. 28 and FIG. 29 are schematic perspective sectional views of structures produced during at later stages of the manufacturing process according to some embodiments of the disclosure. The schematic perspective sectional views of FIG. 28 and FIG. 29 may be cut at the same XZ plane as the view of FIG. 27A. Referring to FIG. 27A and FIG. 28, in some embodiments the dummy gate structure 520 is removed to form a gate trench 550 surrounded by the gate spacers 530. In the gate trench 550 portions of the semiconductor fins 440 and the nanosheets 460 in between the gate spacers 530 are exposed. Referring to FIG. 28 and FIG. 29, the exposed portions of the nanosheets of sacrificial material 461, 463, 465, 467 may be selectively removed, producing gaps 560 which separate the exposed portions of the semiconductor fins 440 from the underlying nanosheets 466, and the exposed portions of the nanosheets of channel material 462, 464, 466 from each other and from the nanosheets bases 470.

Figure 30:
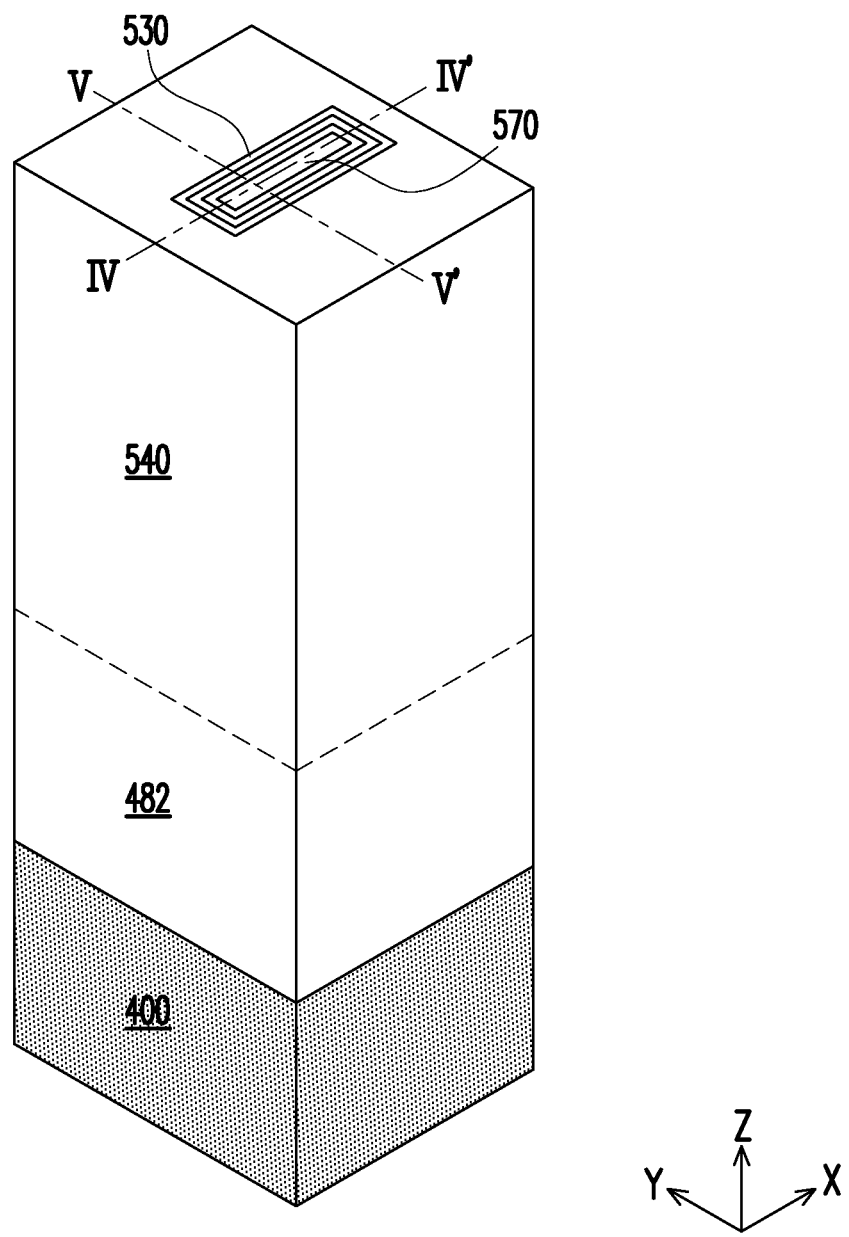
Figure 30A:
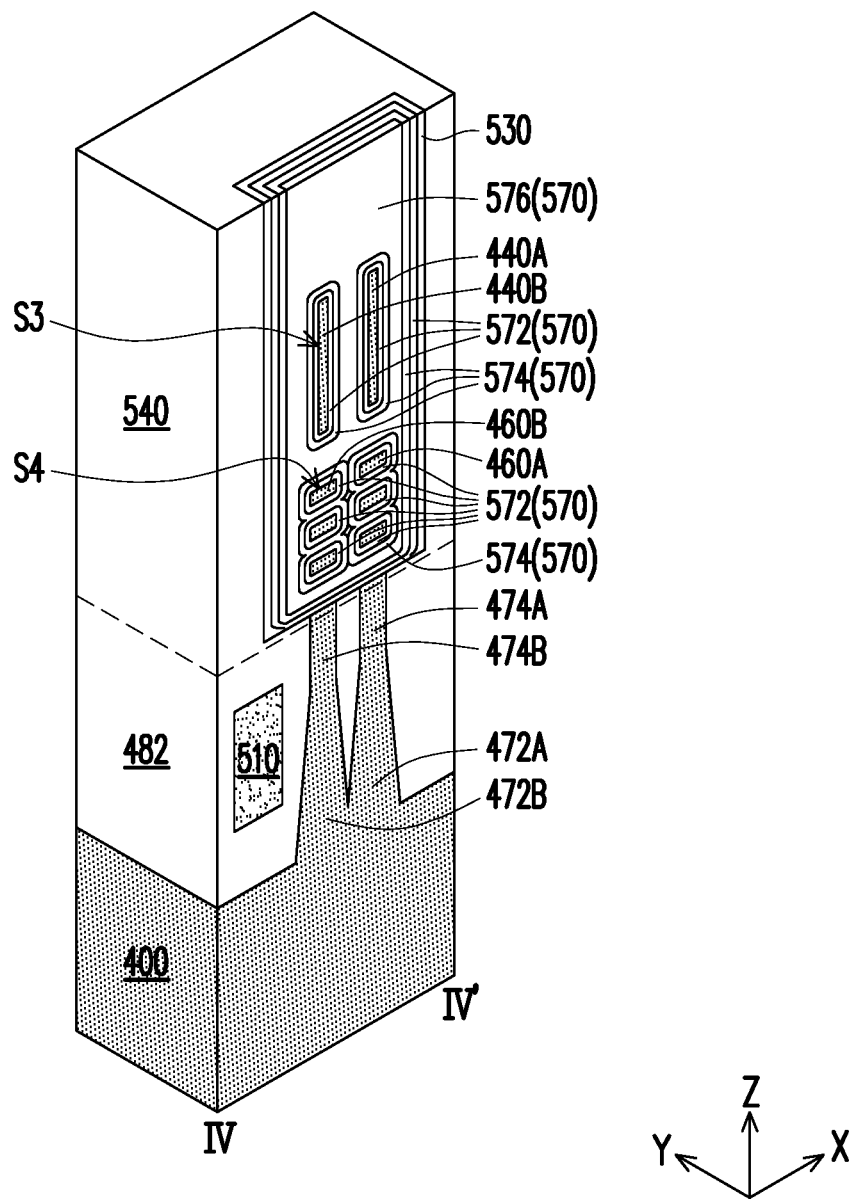
Figure 30B:
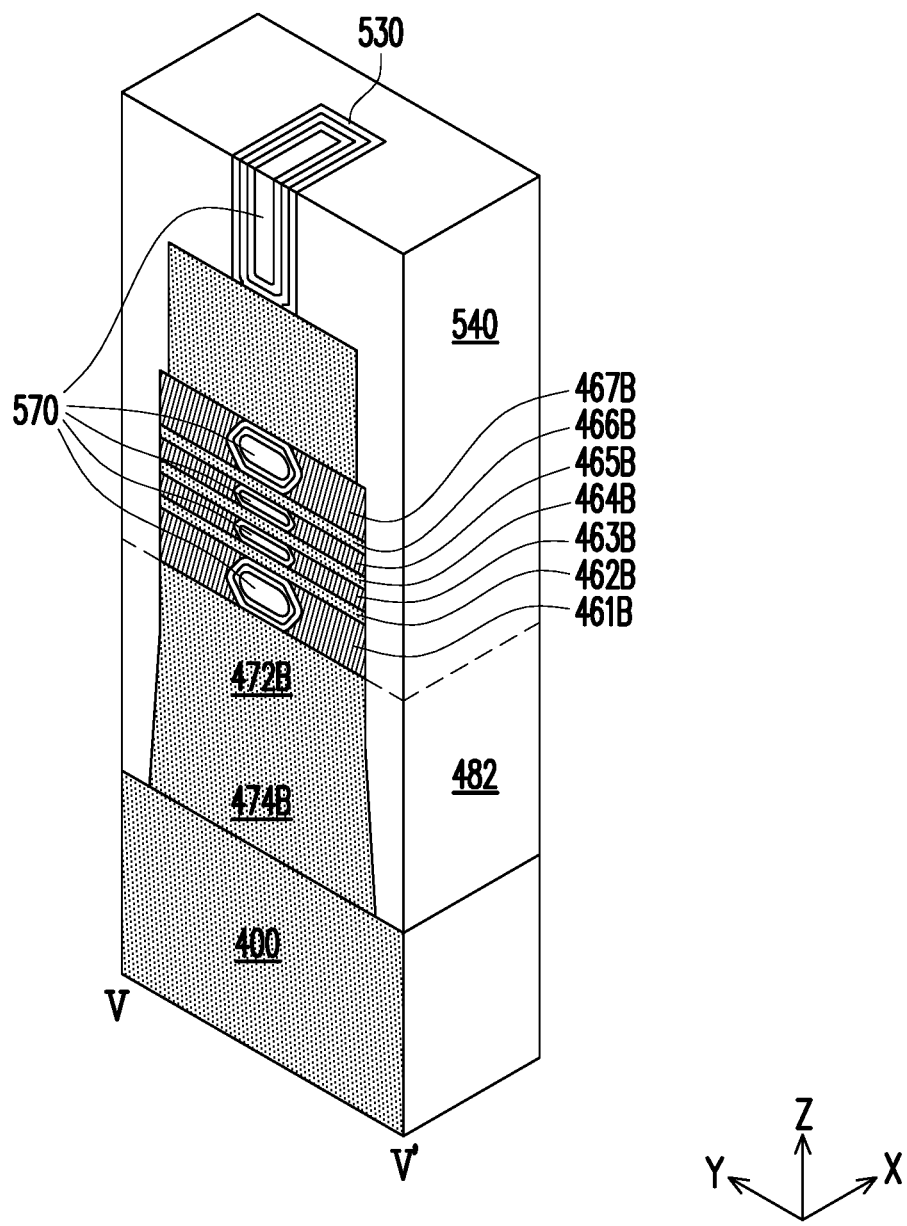

FIG. 30A is a schematic perspective sectional view of the structure illustrated in FIG. 30, cut at the same XZ plane as the view of FIG. 27A. FIG. 30B is a schematic perspective sectional view of the structure illustrated in FIG. 30, cut at the YZ plane located at the level height of the line V-V' along the X direction. Referring to FIG. 29, FIG. 30, FIG. 30A, and FIG. 30B, in some embodiments, a gate structure 570 is formed in the gate trench 550 in between the gate spacers 530, contacting the semiconductor fins 440 and the nanosheets of channel material 462, 464, 466. The gate structure may include a gate dielectric layer 572, a work function layer 574, and a gate electrode 576. The gate structure 570 may include the same materials and be manufacturing following similar processes as discussed above for the gate structures 270 with reference to FIG. 11. In some embodiments, the gate structure 570 extends directly on the nanosheets bases 470, wraps around each of the nanosheets of channel material 462, 464, 466, and further wraps around the semiconductor fins 440. In some embodiments, the portions of the nanosheets 462, 464, 466 in contact with the gate structure 570 act as channel regions of an nFET, while the portions of semiconductor fins 440 in contact with the gate structure 570 act as channel regions of a pFET. That is, even though the pFET is being described as including the semiconductor fins 440, the geometry of contact between the gate structure 570 and the semiconductor fins 440 may be different from the finFET design, as the gate structure 570 further wraps below the semiconductor fins 440. That is, the pFET device may be closer to a gate-all-around transistor, than to a finFET transistor. While both the nFET and the pFET of the present embodiment may have a gate-all-around type of contact between the gate and the semiconductor structures forming the channel regions, the architecture of the two transistors is not the same. As illustrated in FIG. 30A, the largest contact areas between the gate structure 570 and the semiconductor fins 440 lies along surfaces S3 extending in YZ planes, while the largest contact areas between the gate structure 570 and the nanosheets 460 lies along surfaces S4 extending in XY planes. That is, the largest contact areas between the gate structure 570 and the semiconductor fins 440 or the nanosheets 460 may correspond to different crystallographic surfaces of the channel material of the semiconductor fins 440 and the nanosheets 460. In some embodiments, when materials such as silicon are used as channel material, the surfaces extending in XY planes like the surface S4 correspond to the surfaces indicated as (100) by the Miller crystallographic indexes, and the surfaces extending in YZ planes like the surface S3 correspond to the (110) crystallographic surfaces. In some embodiments, by coupling together different transistor architectures it is possible to exploit the difference in carrier properties of different crystallographic surfaces (e.g., (100) and (110)) of the channel material. In the example illustrated in FIG. 30A, a gate-all-around FET with nanosheets of channel material 152, 154, 156 having larger gate contact areas in XY planes is fabricated as n-type FET, and a gate all-around FET with semiconductor fins 440 having larger gate contact areas in YZ planes is fabricated as p-type FET on top of the n-type FET. By doing so, negative charges in the n-type FET are mostly carried along (100) crystallographic surfaces, while positive charges in the p-type FET are mostly carrier along (110) crystallographic surfaces. That is, in some embodiments, the charge carrier properties of both the n-type FET and the p-type FET can be enhanced.

Figure 31:
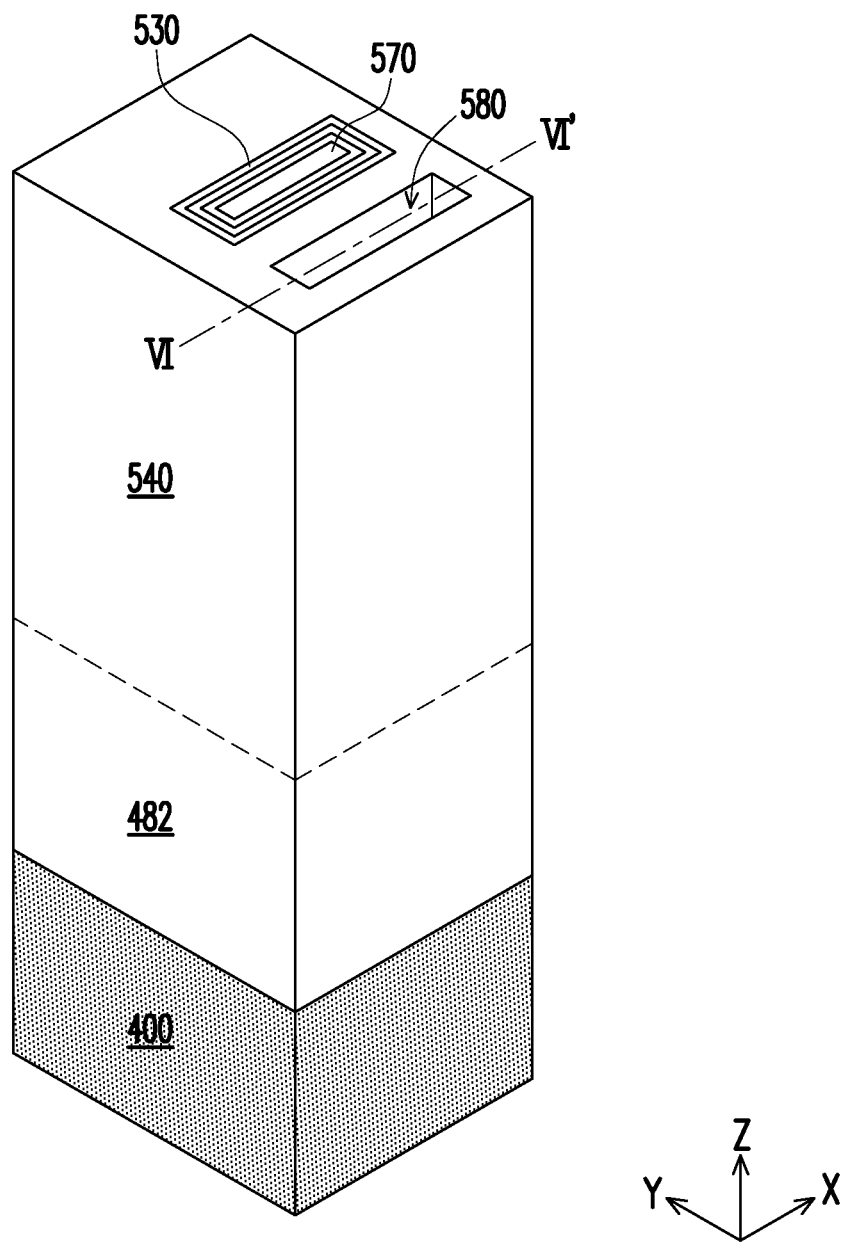
Figure 31A:
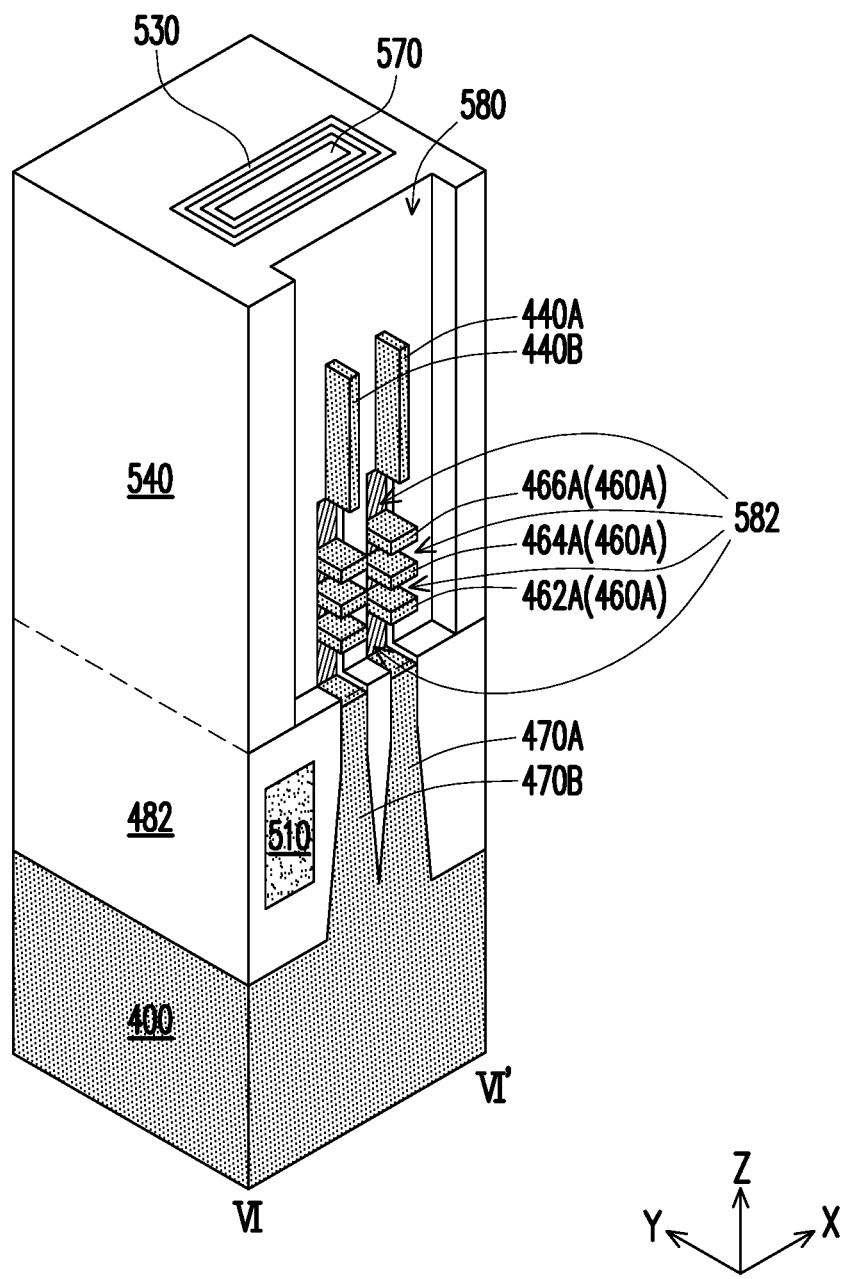

FIG. 31A is a schematic perspective sectional view of the structure illustrated in FIG. 31, cut at the XZ plane located at the level height of the line VI-VI' along the Y direction. Referring to FIG. 31 and FIG. 31A, a source and drain trench 580 is opened in the interlayer dielectric layer 540 on one side of the gate structure 570. The source and drain trench 380 may extend substantially parallel to the gate structure 570 along the X direction, and be of sufficient depth along the Z direction to expose the nanosheets 460 and the semiconductor fins 440. In some embodiments, the source and drain trench 580 may extend across both sides of the semiconductor fins 440 and the nanosheets 460 along the X direction. In some embodiments, the source and drain trench 580 reaches a level height along the Z direction corresponding to the top of the nanosheets bases 470, without exposing the buried metal plug 510. In some embodiments, a selective etching step may be performed to remove the portions of the nanosheet of sacrificial material 461, 463, 465, 467 (illustrated, e.g., in FIG. 28) to form gaps 582 communicating with the source and drain trench 580 and separating the semiconductor fins 440 from the uppermost nanosheets of channel material 466, as well as the nanosheets of channel material 462, 464, 466 from each other and from the nanosheets bases 470. In some alternative embodiments, the portions of semiconductor fins 440 and nanosheets of channel material 462, 464, 466 exposed by the source and drain trench 580 may also be removed. In some alternative embodiments, the portions of the nanosheets 461-467 and the semiconductor fins 440 are both remained within the source and drain trench 580. That is, neither the semiconductor fins 440 nor some or all of the nanosheets 460 are etched away from the source and drain trench 580.

Figure 32:
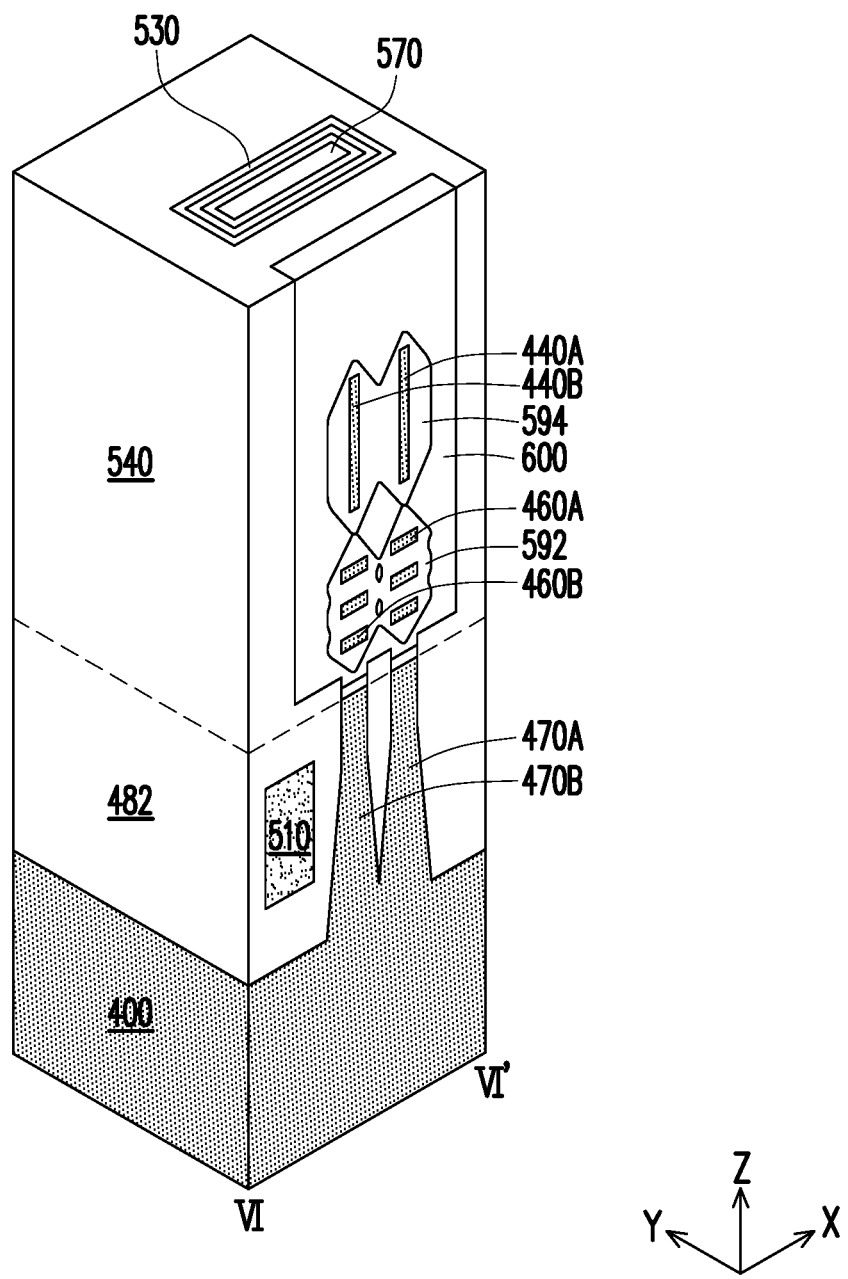

FIG. 32 is a schematic perspective sectional view of a structure formed at a subsequent step of the manufacturing process. The perspective sectional view of FIG. 32 is cut along the same XZ plane as the view of FIG. 31A. Referring to FIG. 31A and FIG. 32, in some embodiments source and drain regions 592, 594 are epitaxially grown around the nanosheets 460 and the semiconductor fins 440. The source and drain regions 592, 594, may be formed including similar materials and following similar processes as previously described for the source and drain regions 320, 330 with reference to FIG. 13. In some embodiments, the source and drain regions 592, 594 only partially fill the source and drain trench 580. A conductive material may be disposed in the source and drain trench 580 in contact with the source and drain regions 592, 594 to form a source and drain contact 600. In some embodiments, the source and drain contact 600 contacts both of the source and drain regions 592, 594. In some embodiments, the source and drain regions 592, 594 may also be in contact with each other (e.g., forming a shared source and drain region). Materials and processes to form the source and drain contact 600 may be similar to the to the ones previously described for the source and drain contacts 340, 350 with reference to FIG. 14. In some embodiments, a planarization process may be performed to render substantially coplanar the top surfaces of the interlayer dielectric layer 540, the gate structure 570 and the source and drain contact 600. As illustrated in FIG. 32, the source and drain regions 592, 594 are formed on one side of the gate structure 570. As such, it is understood that even though they are referred to as source and drain regions, these will act as source or drain for the corresponding channel. For example, according to the configuration of the CMOS device, the source and drain region 592 may act as a source or drain for the corresponding transistor.

Figure 33:
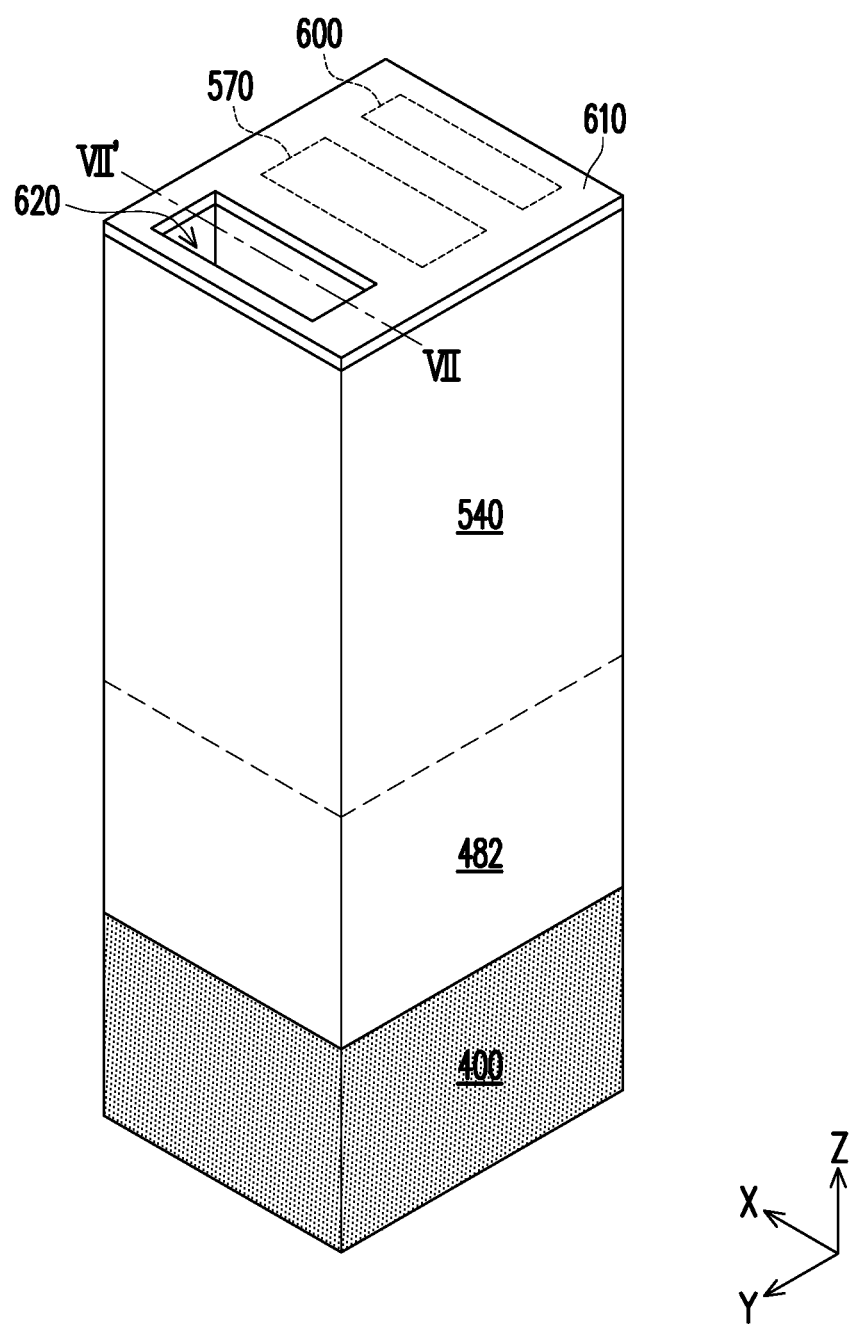
Figure 33A:
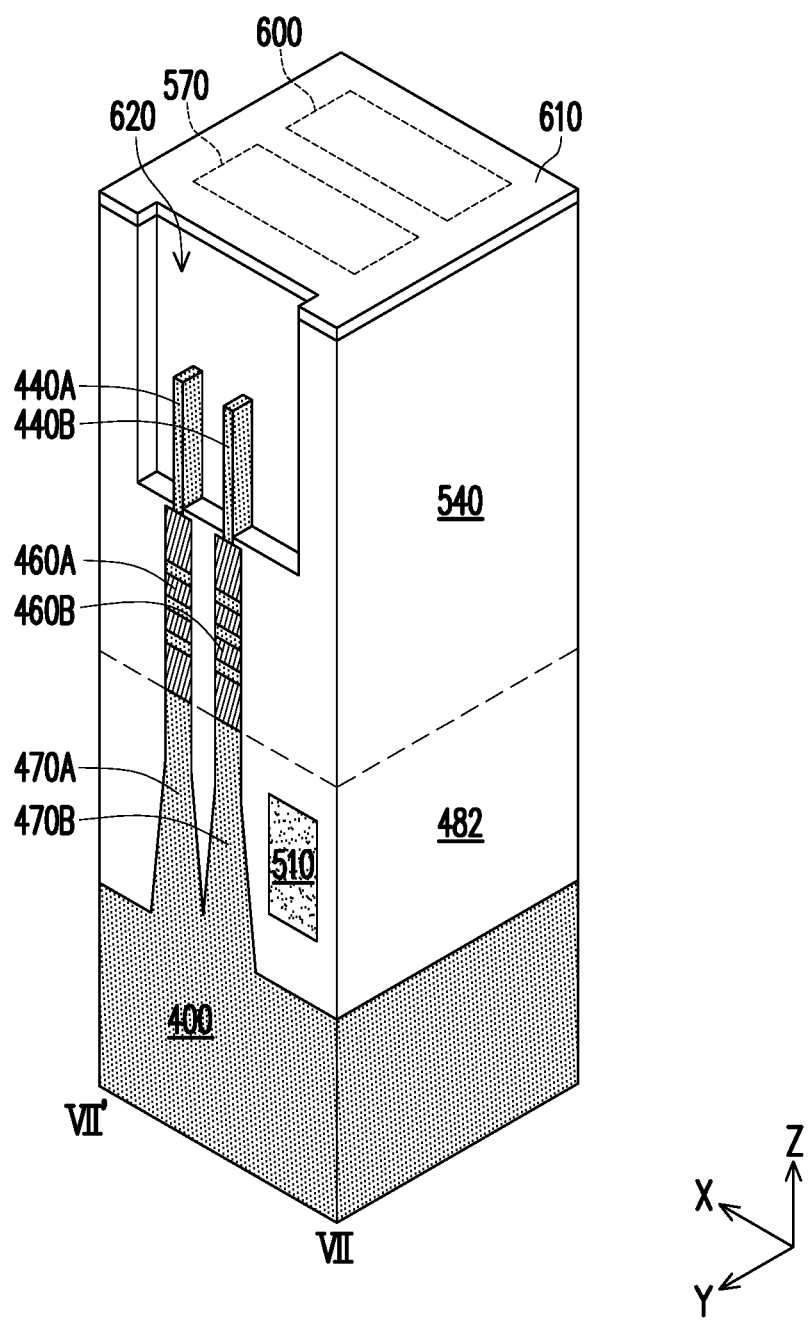

FIG. 33A is a schematic perspective sectional view of the structure illustrated in FIG. 33, cut at the XZ plane at the level height of the line VII-VII' along the Y direction. As indicated by the orientation of the Cartesian coordinates in the corresponding drawings, the views of FIG. 33 and FIG. 33A are rotated of 90 degrees with respect to the previous drawings (e.g., the view of FIG. 32). Referring to FIG. 32, FIG. 33, and FIG. 33A, in some embodiments a patterned mask 610 is disposed on the interlayer dielectric layer 540, covering the gate structure 570 and the source and drain contact 600. In the views of FIG. 33 and FIG. 33A the footprints of the gate structure 570 and the source and drain contact 600 are illustrated for the sake of clarity, but, in practice, both the gate structure 570 and the source and drain contact 600 are buried underneath the patterned mask 610. In some embodiments, the patterned mask 610 is used to pattern the interlayer dielectric layer 540 to form a shallow source and drain trench 620 on an opposite side of the gate structure 570 along the Y direction with respect to the source and drain contact 600. The shallow source and drain trench 620 may extend substantially parallel to the gate structure 570 and the source and drain contact 600 along the X direction. In some embodiments, the shallow source and drain trench 620 reaches a height level along the Z direction sufficient to expose the semiconductor fins 440 while leaving the nanosheets 460 buried within the interlayer dielectric layer 540. That is, the shallow source and drain trench 620 may reach as deep along the Z direction as the semiconductor fins 440.

Figure 34:
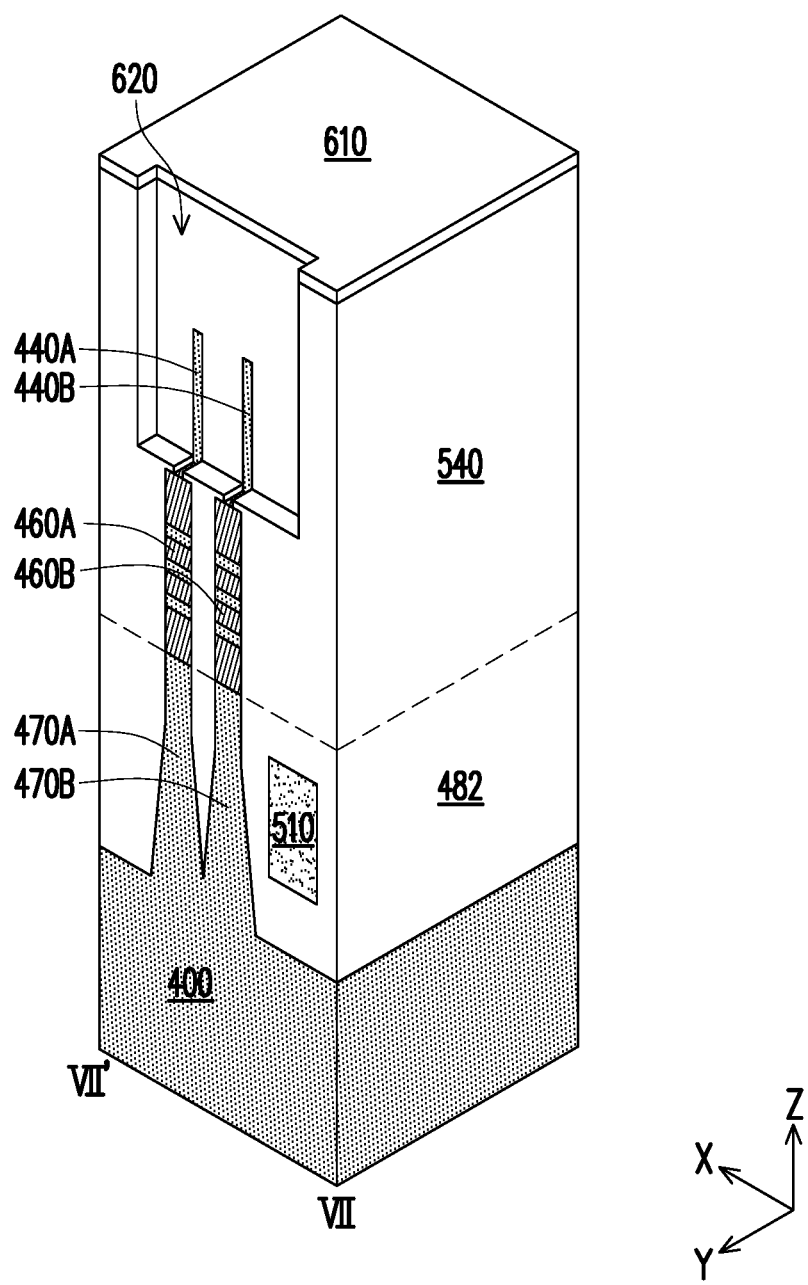
Figure 35:
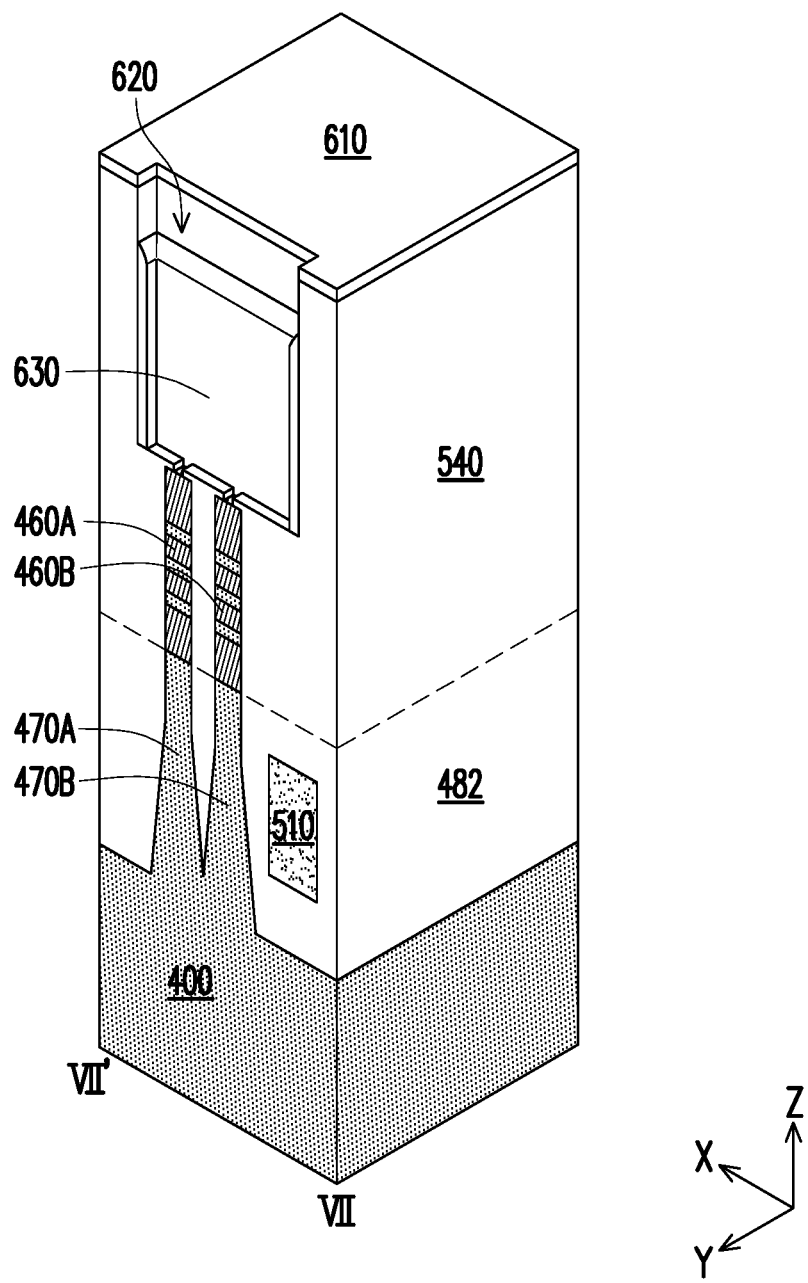

FIG. 34 to FIG. 43 are schematic perspective sectional views of structures formed at subsequent steps of the manufacturing process, oriented as and cut along the same XZ plane as the view of FIG. 33A. Referring to FIG. 33A and FIG. 34, in some embodiments the portions of semiconductor fins 440 exposed by the shallow source and drain trench 620 may be removed, for example via an etching step. Following the etching of the semiconductor fins 440, the nanosheets 460 may be exposed at the bottom of the shallow source and drain trench 620. Referring to FIG. 34 and FIG. 35, a source and drain spacer 630 may be formed along the sidewalls of the shallow source and drain trench 620. In some embodiments, an insulating material (e.g. SiN), may be deposited in the shallow source and drain trench 620 until the semiconductor fins 440 are completely covered. Thereafter, a portion of the insulating material may be removed (for example, via selective etching) to expose the bottom of the shallow source and drain trench 620 without exposing the semiconductor fins 440. That is, after formation of the source and drain spacer 630, the sidewalls of the shallow source and drain trench 620 may be covered by the source and drain spacer 630, while, at the bottom of the shallow source and drain trench 620, the interlayer dielectric layer 540 and the nanosheets 460 may be exposed.

Figure 36:
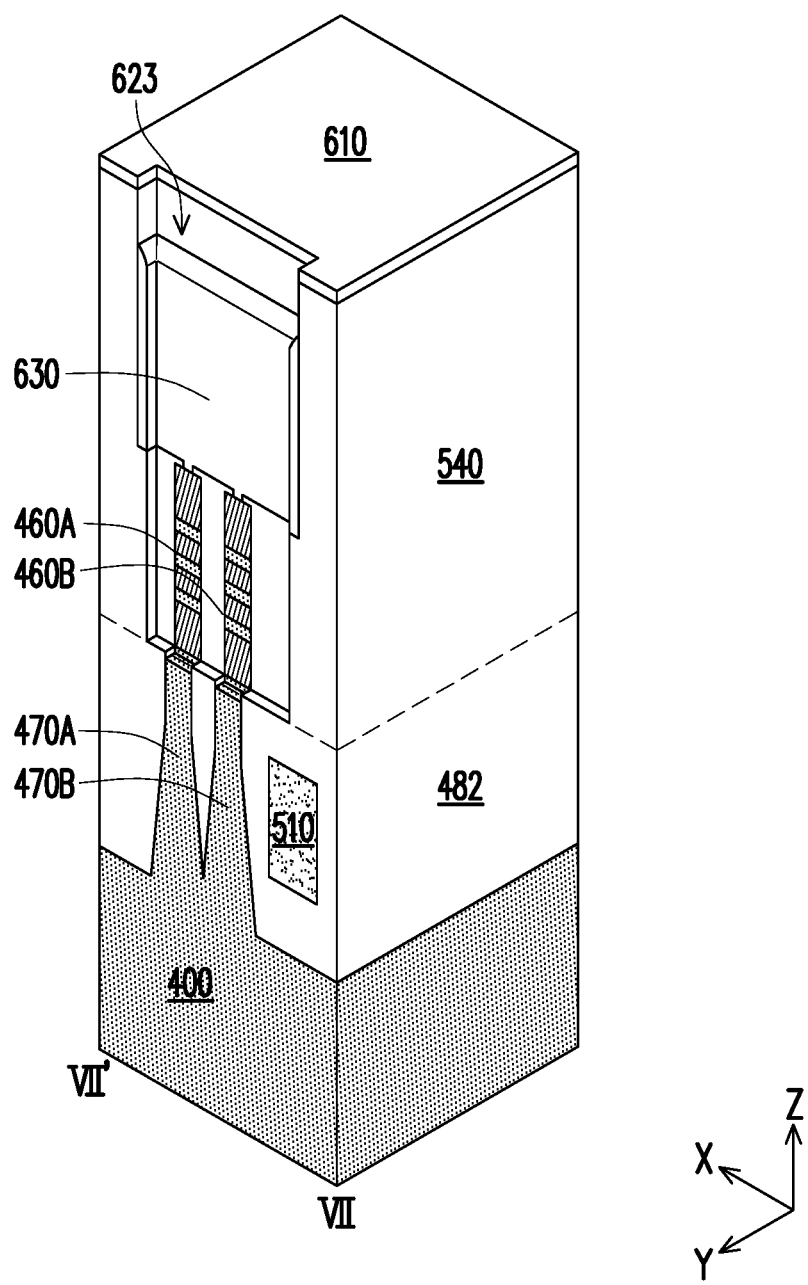

Referring to FIG. 35 and FIG. 36, portions of the interlayer dielectric layer 540 may be removed to extend the shallow source and drain trench 620 until the nanosheets 460 are exposed, thus forming a deep source and drain trench 623. The deep source and drain trench 623 may reach a height level along the Z direction sufficient to completely expose the nanosheets 460. In some embodiments, the deep source and drain trench 623 reaches as deep as the nanosheets bases 470. In some embodiments, the deep source and drain trench 623 leaves the metal plug 510 buried within the isolation structure 482. That is, the metal plug 510 may not be exposed by the deep source and drain trench 623.

In some embodiments, the portions of the nanosheets 460 exposed by the deep source and drain trench 623 may be removed, for example via an etching step. After removal of the exposed portions, the nanosheets 460 may be exposed at the sidewall of the deep source and drain trench 623, without extending in the deep source and drain trench 623.

Figure 37:
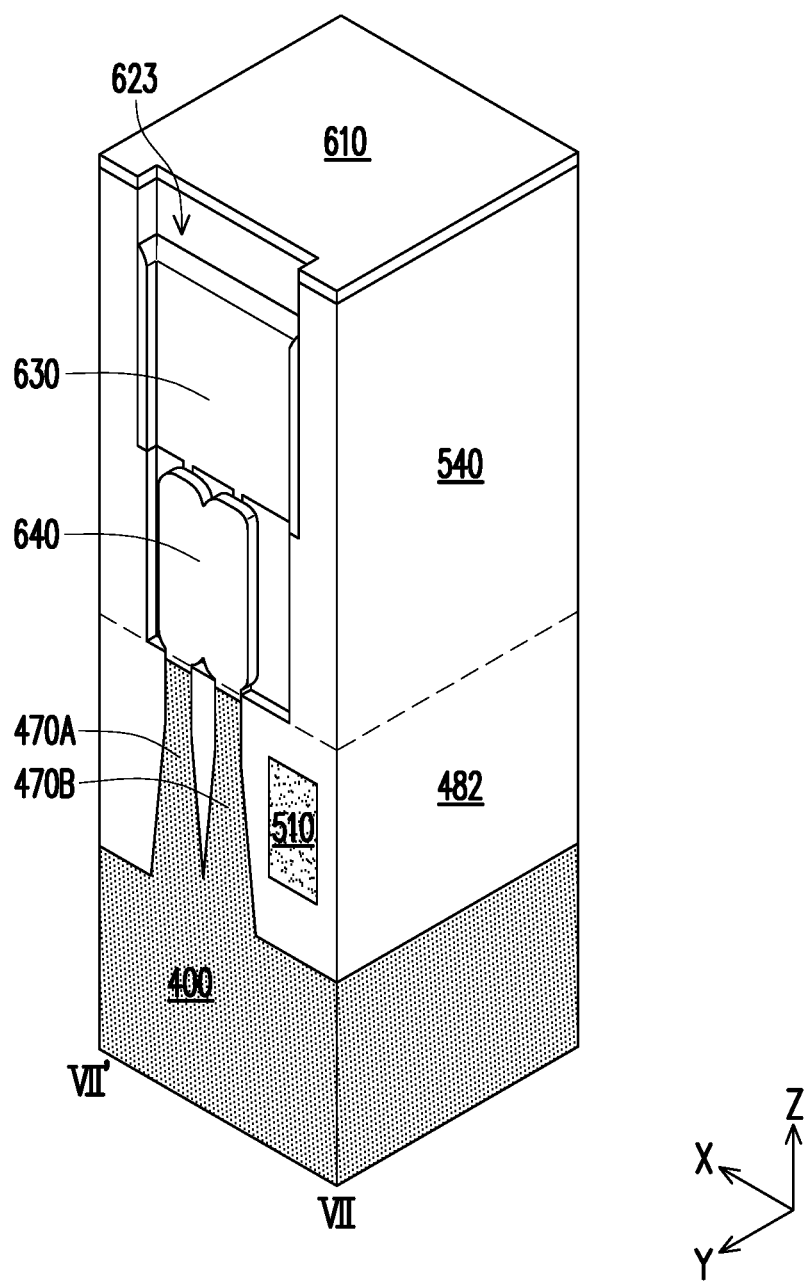
Figure 38:
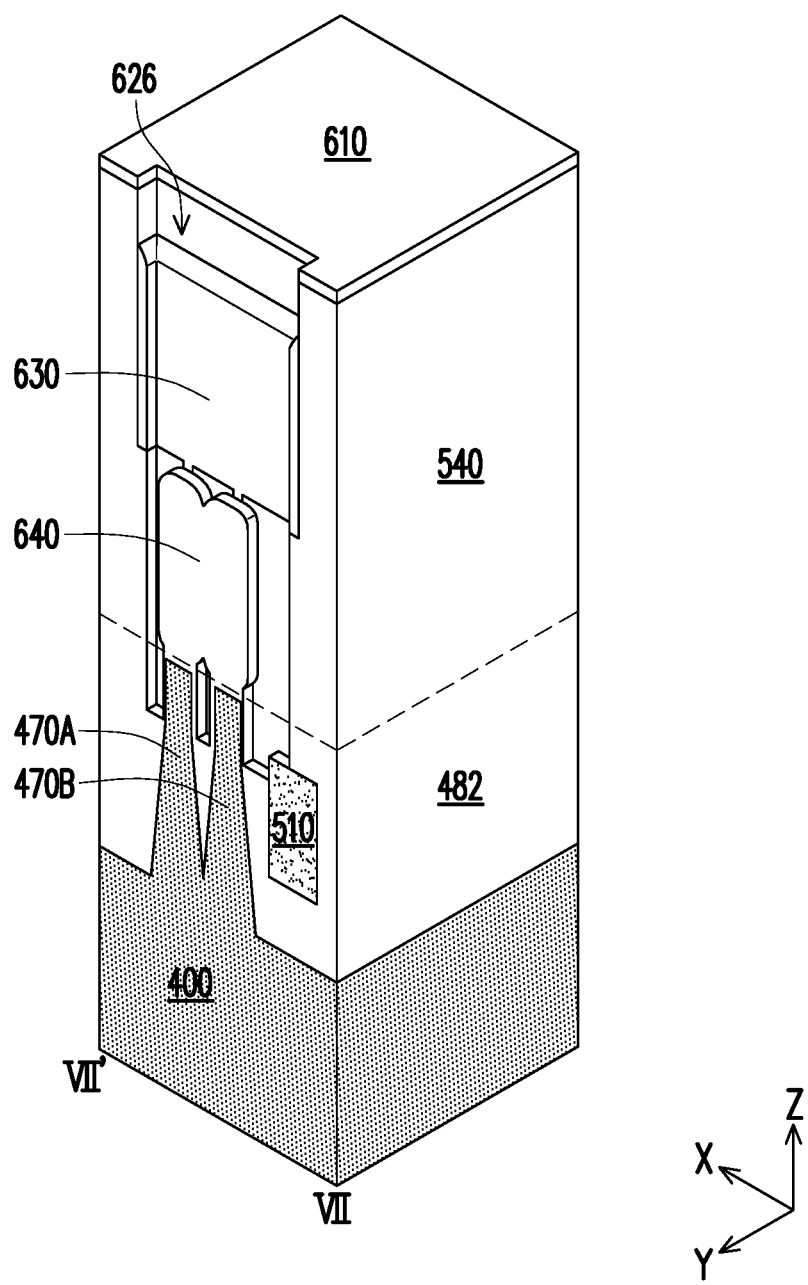

Referring to FIG. 36 and FIG. 37, a source and drain region 640 may be grown from the nanosheets 460 exposed at the sidewalls of the deep source and drain trench 623 and the nanosheets bases 470 exposed at the bottom of the deep source and drain trench 623. In some embodiments, the source and drain region 640 is formed so as not to reach the level height along the Z direction of the source and drain spacers 630. That is, the source and drain region 640 may be grown along the sidewalls of the deep source and drain trench 623 without covering the source and drain spacers 630. Materials and processes to form the source and drain region 640 may be similar to the ones previously discussed for the source and drain regions 320, 330 with respect to FIG. 13. Referring to FIG. 37 and FIG. 38, the deep source and drain trench 623 may be further extended along the Z direction to at least partially expose the metal plug 510, thus forming an extended source and drain trench 626. In some embodiments, the extended source and drain trench 626 partially exposes the nanosheets bases 470 below the source and drain region 640 as well as at least a portion of the metal plug 510. For example, as illustrated in FIG. 38, the extended source and drain trench 626 may reveal an upper corner of the metal plug 510.

Figure 39:
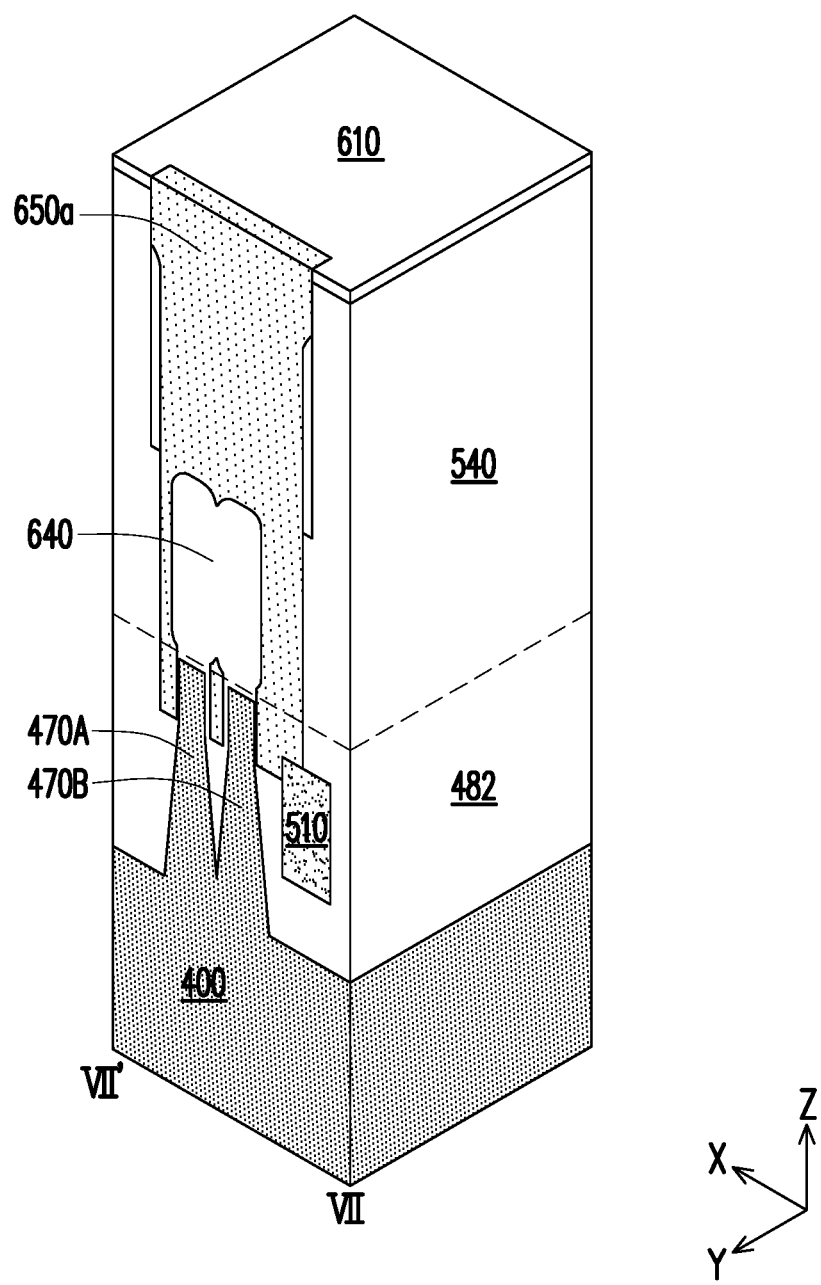

Referring to FIG. 38 and FIG. 39, the deep source and drain trench 626 may be filled with a conductive material 650a, for example via deposition and planarization steps. The conductive material 650a may reach all the way to the bottom of the extended source and drain trench 626, contacting the metal plug 510, surrounding the source and drain region 640 and the top of the nanosheets bases 470 exposed by the extended source and drain trench 626. Thereafter, the conductive material 650a may be partially removed to form a source and drain contact 650 at the bottom of the extended source and drain trench 626, as illustrated, for example, in FIG. 40. The source and drain contact 650 may be in electrical contact with the metal plug 510 and the source and drain region 640. In some embodiments, an upper part of the source and drain region 640 is left exposed by the source and drain contact 650, while the lower parts of the source and drain region 640 is buried within the source and drain contact 650. In some embodiments, after the partial removal of the conductive material 650a, the source and drain spacers 630 are exposed within the partially filled extended source and drain trench 626. In some embodiments, the source and drain contact 650 may include a seed layer and a metallic contact, similarly to what was previously discussed for the source and drain contacts 340, 350 with reference to FIG. 14.

Figure 40:
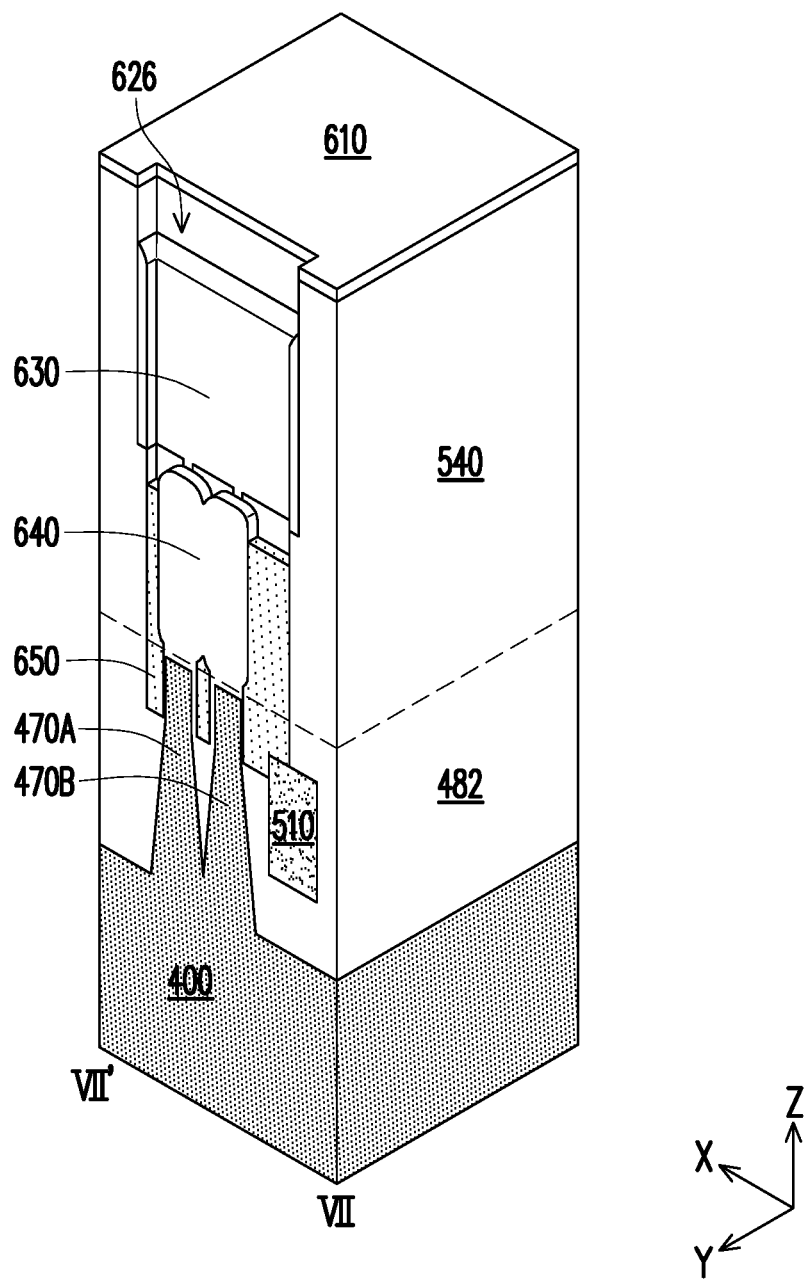
Figure 41:
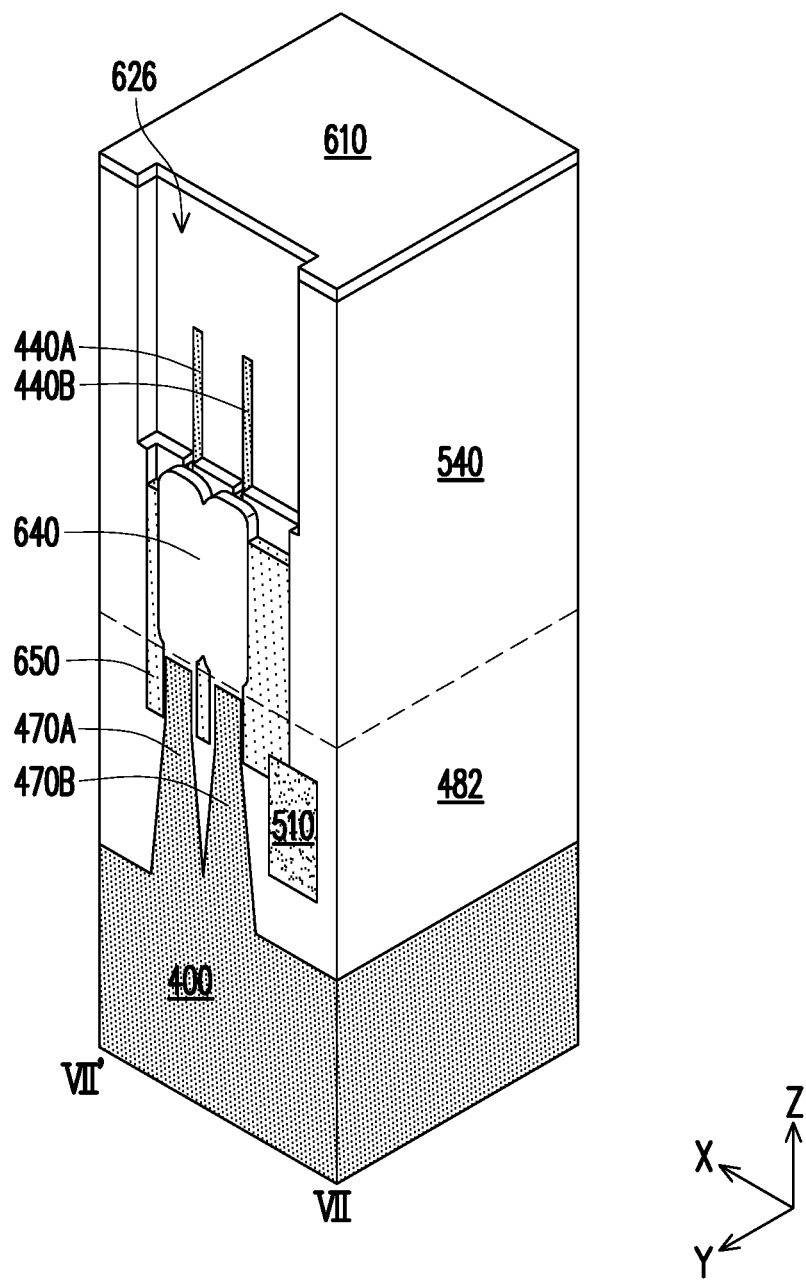
Figure 42:
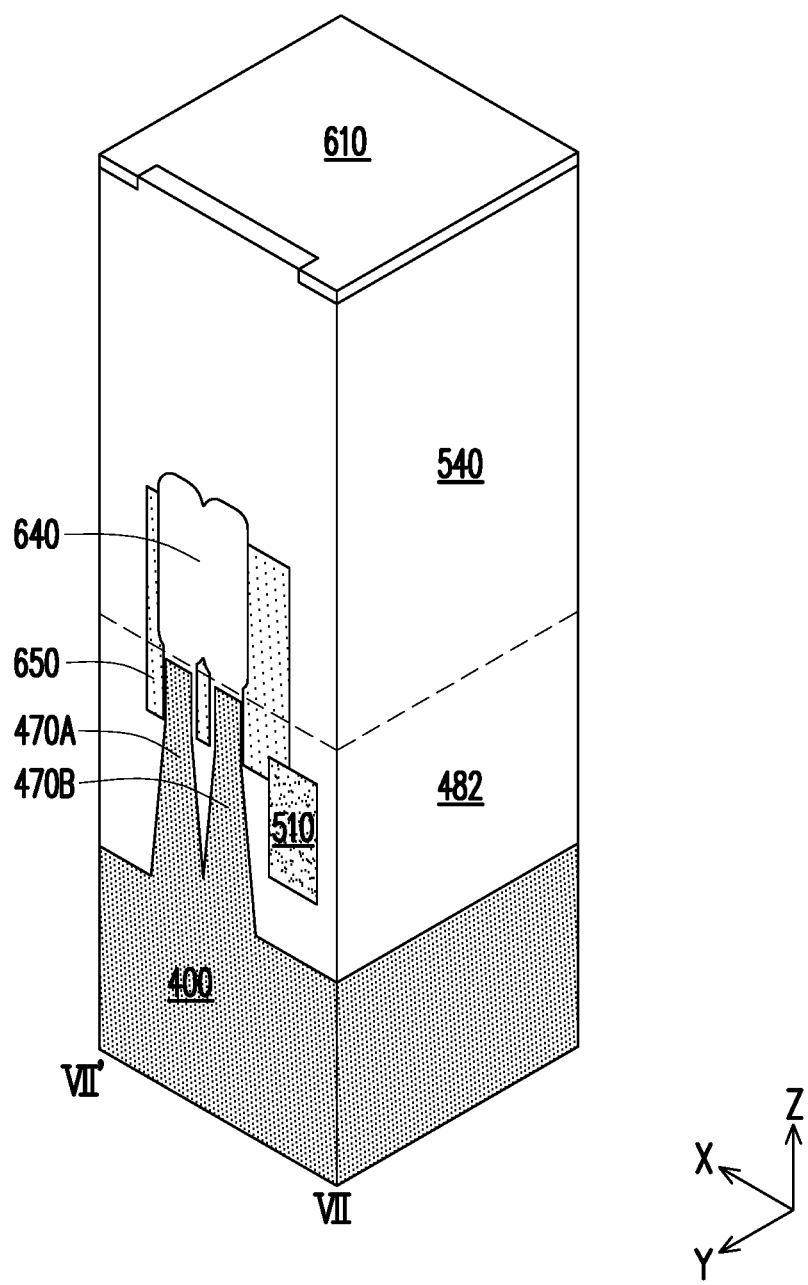

Referring to FIG. 40 and FIG. 41, in some embodiments, the source and drain spacers 630 are removed, thus exposing once again the semiconductor fins 440A along the sidewalls of the extended source and drain trench 626. Thereafter, insulating material is disposed on the source and drain region 640 and the source and drain contact 650 in the extended source and drain trench 626 until the extended source and drain trench 626 is filled, as illustrated in FIG. 42. That is, following removal of the source and drain spacers 630, the source and drain trench 626 is filled, for example, via deposition of insulating material and subsequent planarization processes.

Figure 43:
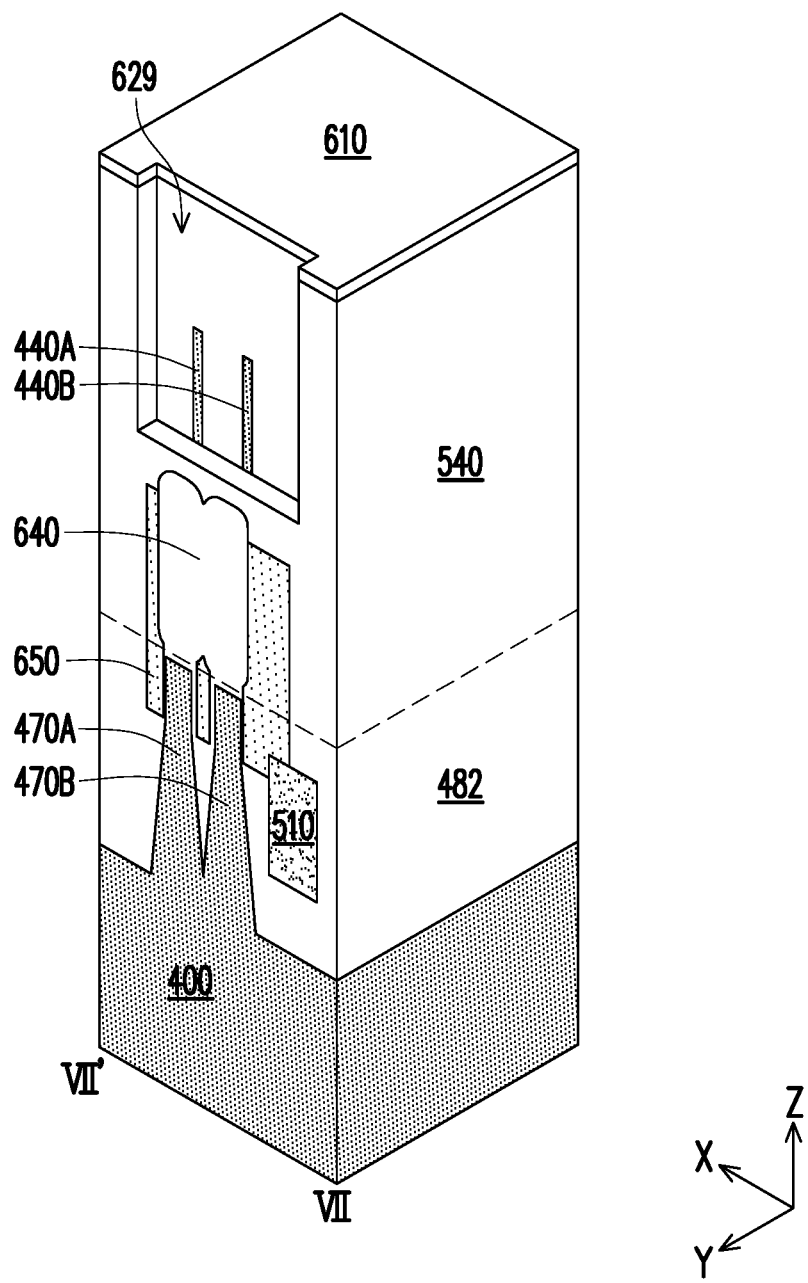

Referring to FIG. 42 and FIG. 43, in some embodiments, an upper source and drain trench 629 is opened over the source and drain regions 640 and the source and drain contact 650. The patterned mask 610 may be used to determine the position of the upper source and drain trench 629, so that the upper source and drain trench 629 may be formed substantially at the same place as the extended source and drain trench 626 (illustrated, e.g., in FIG. 41). The upper source and drain trench 629 may expose the semiconductor fins 440 along its sidewalls. Because the semiconductor fins 440 were partially removed before forming the source and drain spacers 630 (illustrated, e.g., in FIG. 40), the semiconductor fins 440 may not extend within the upper source and drain trench 629. In some embodiments, the upper source and drain trench 629 is not sufficiently deep to expose the source and drain region 640 and the source and drain contact 650. That is, even after the upper source and drain trench 629 is opened in the interlayer dielectric layer 540, at least a layer of insulating material extends on top of the source and drain region 640 and the source and drain contact 650.

Figure 44:
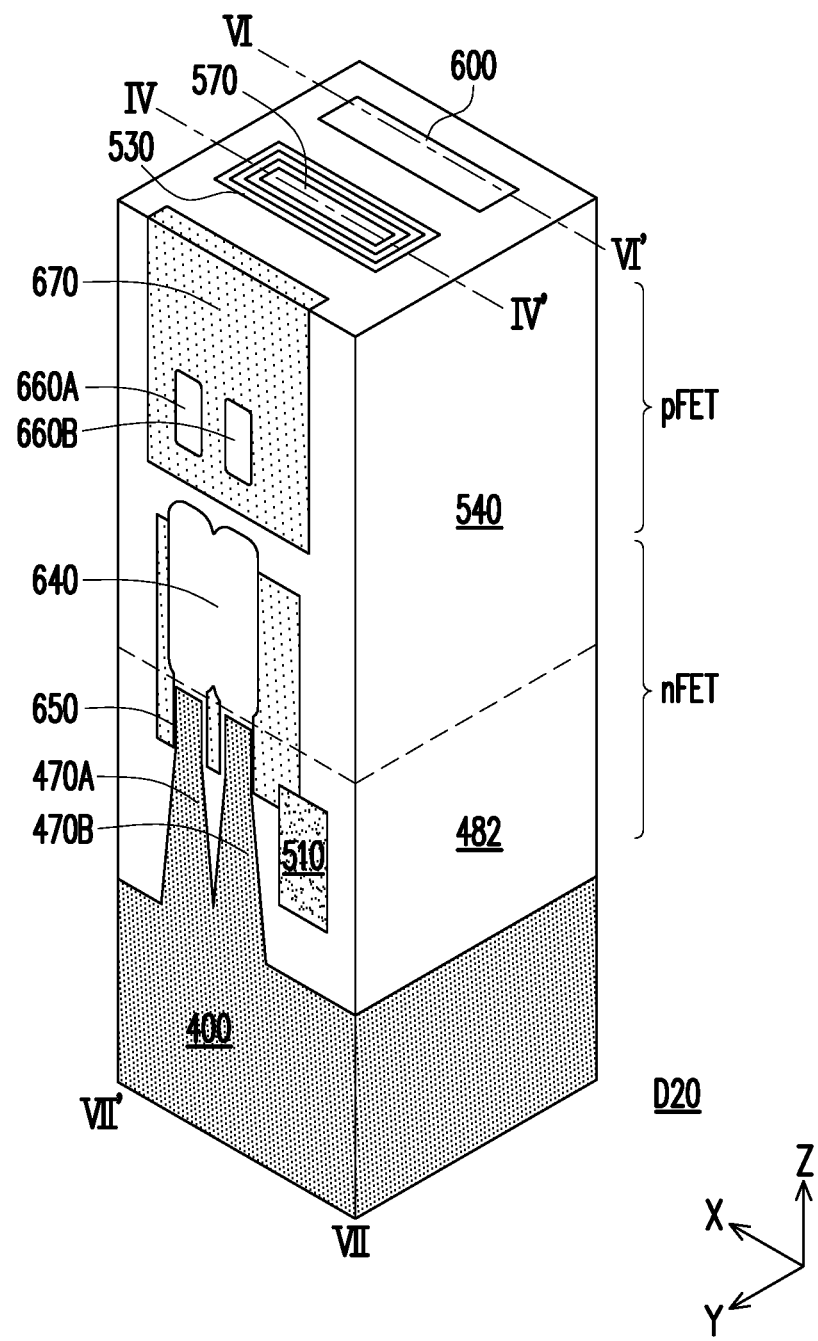
FIG. 44 is a schematic perspective sectional view of a CMOS device according to some embodiments of the present disclosure.

Referring to FIG. 43 and FIG. 44, a source and drain region 660 is formed in contact with the exposed semiconductor fins 440 within the upper source and drain trench 629. In some embodiments, materials and processes to form the source and drain region 660 may be similar to what was previously discussed for the source and drain regions 320, 330 with reference to FIG. 13. Thereafter, the upper source and drain trench 629 is filled with conductive material to form the source and drain contact 670. In some embodiments, the source and drain contact 670 may be formed by deposition of the conductive material in the upper source and drain trench 629, followed by a planarization process. In some embodiments, excess conductive material as well as the patterned mask 610 may be removed during the planarization process. That is, following planarization, the gate structure 570 and the source and drain contact 600 may also be exposed.

Figure 44A:
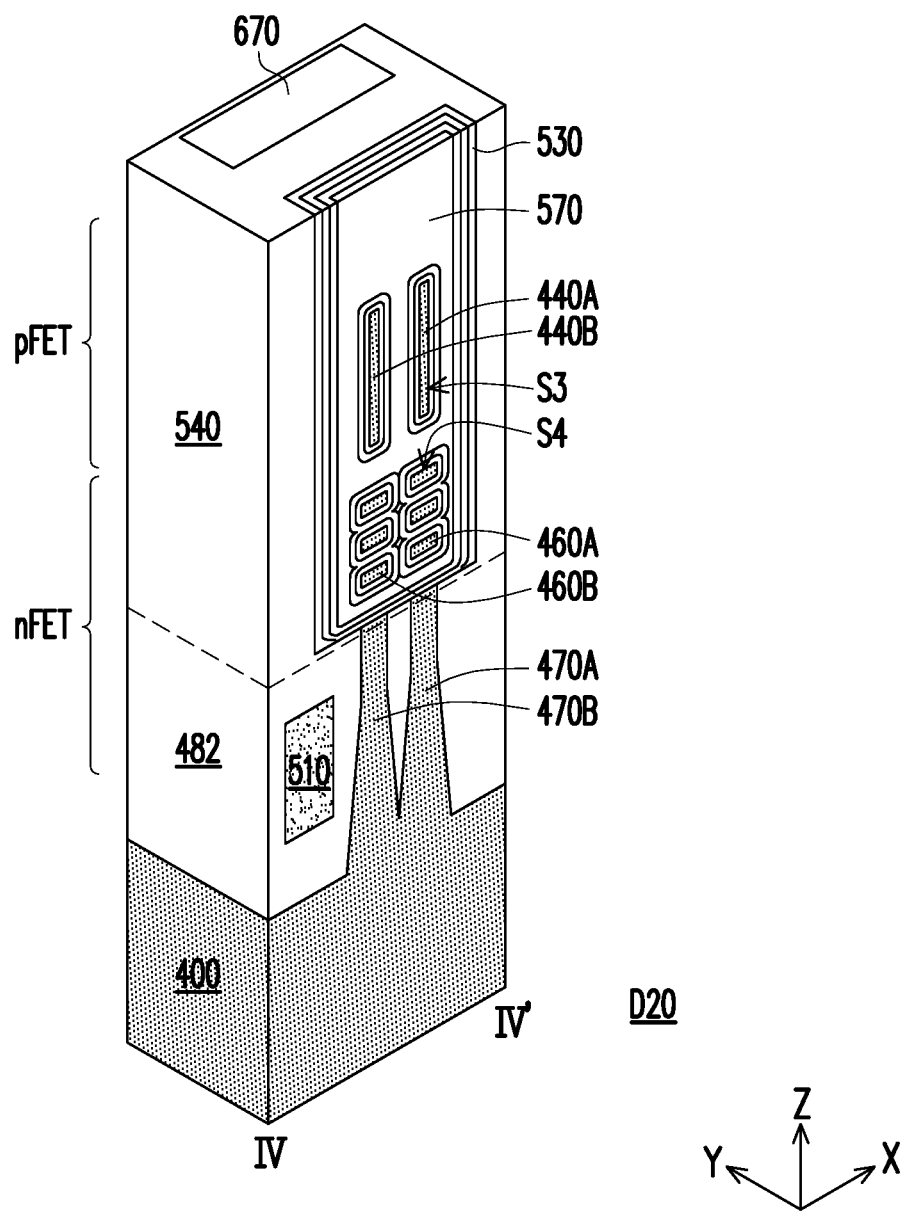
FIG. 44A and FIG. 44B are schematic perspective sectional views of the CMOS device illustrated in FIG. 44 according to some embodiments of the present disclosure.
Figure 44B:
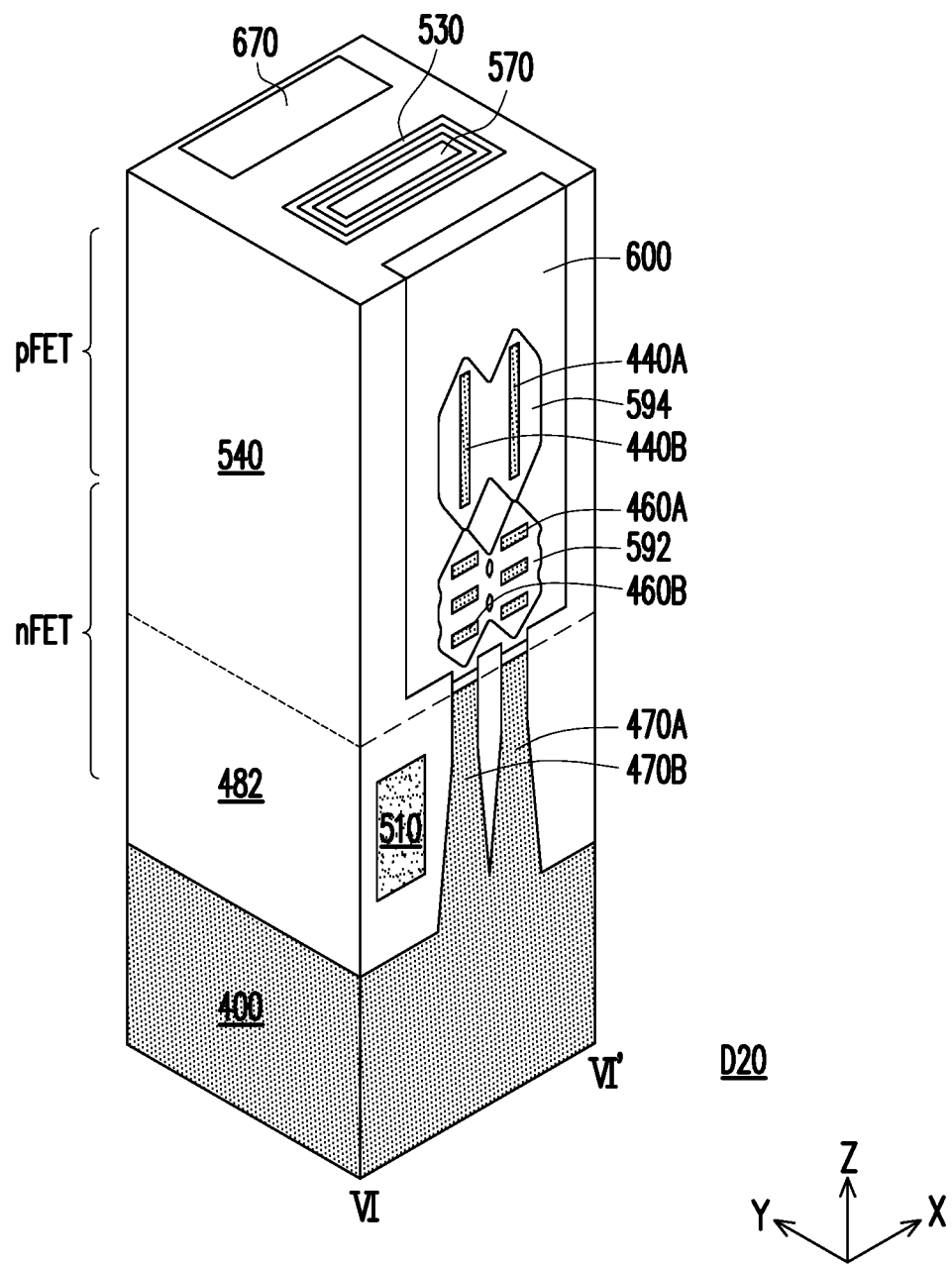

FIG. 44A and FIG. 44B are perspective sectional views of the structure illustrated in FIG. 44 respectively cut along the XZ planes located at the same level heights as the lines IV-IV' and VI-VI' along the Y direction. Referring to FIG. 44, FIG. 44A and FIG. 44B, in the CMOS device D20 the pFET is vertically stacked with the nFET. Furthermore, the pFET and the nFET have different transistor architectures, so that in the pFET and the nFET the charges are carried along different crystallographic surfaces of the channel material. For example, in the CMOS device D20, the pFET is stacked on the nFET. The pFET has a gate all around architecture in which the gate structure 570 wraps around the semiconductor fins 440, and mostly contact the semiconductor fins 440 along the YZ plane (e.g., the surface S3). On the other hand, the nFET has a gate all around architecture with nanosheets 460 extending (and contacted by the gate structure 570) mostly along the XY plane (e.g., surface S4). By doing so, the charges in the pFET may be transported along a different crystallographic surface of the channel material with respect to the nFET. In some embodiments, by adopting different crystallographic surfaces for charge transport in the coupled pFET and nFET, it may be possible to simultaneously enhance the transport efficiency of both holes and electrons.

In some embodiments, there is a common source and drain contact 600 for the nFET and the pFET on one side of the gate structure 570, and separate source and drain contacts 670, 650 on the opposite side of the gate structure 570. In some embodiments, the CMOS device D20 has the configuration of an inverter, however, the disclosure is not limited thereto. That is, CMOS devices according to some embodiments of the disclosure may be other logic gates, memory cells, or any other types of CMOS devices.

Figure 45:
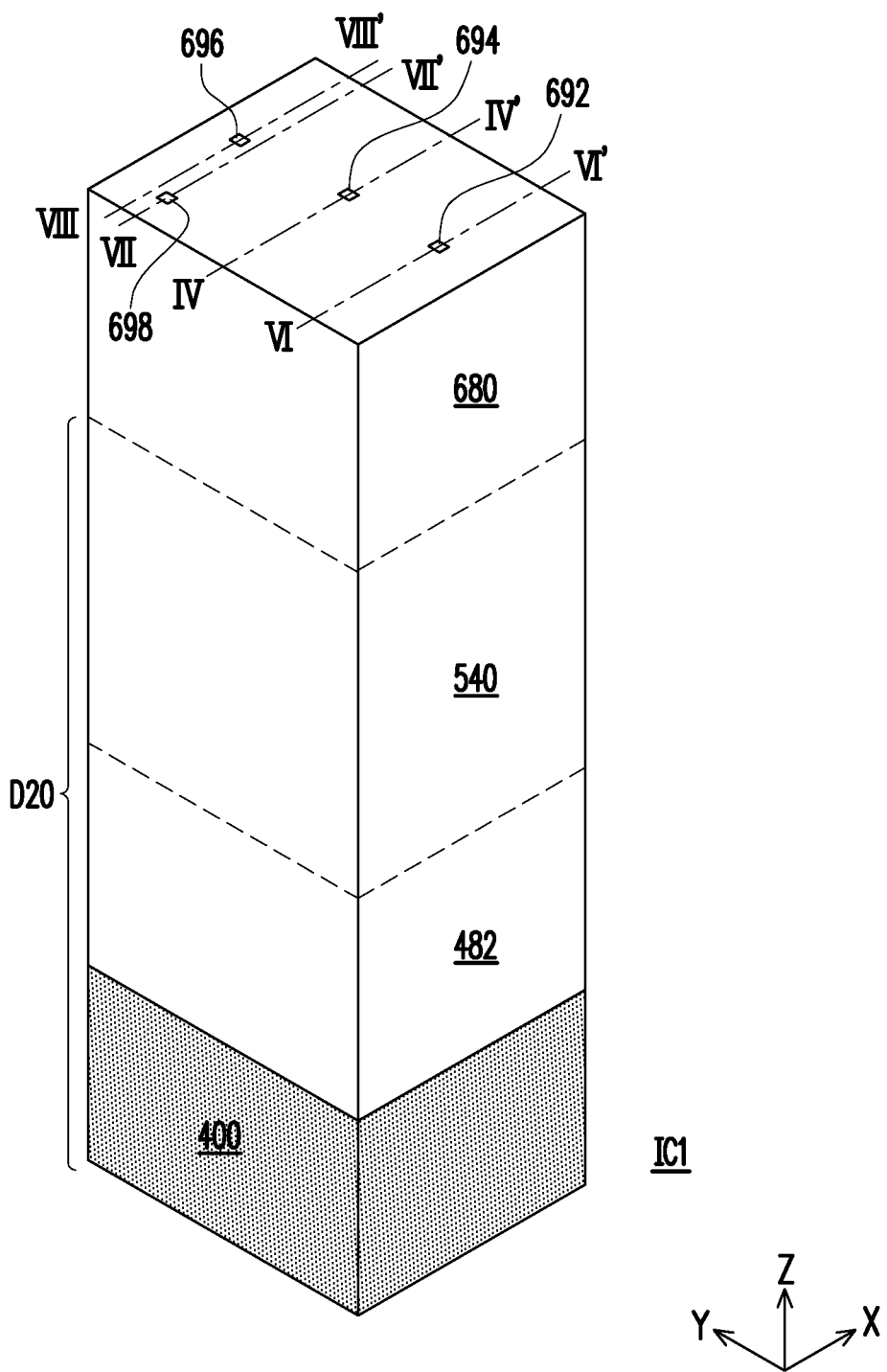
FIG. 45 is a schematic perspective view of a portion of an integrated circuit according to some embodiments of the present disclosure.
Figure 45A:
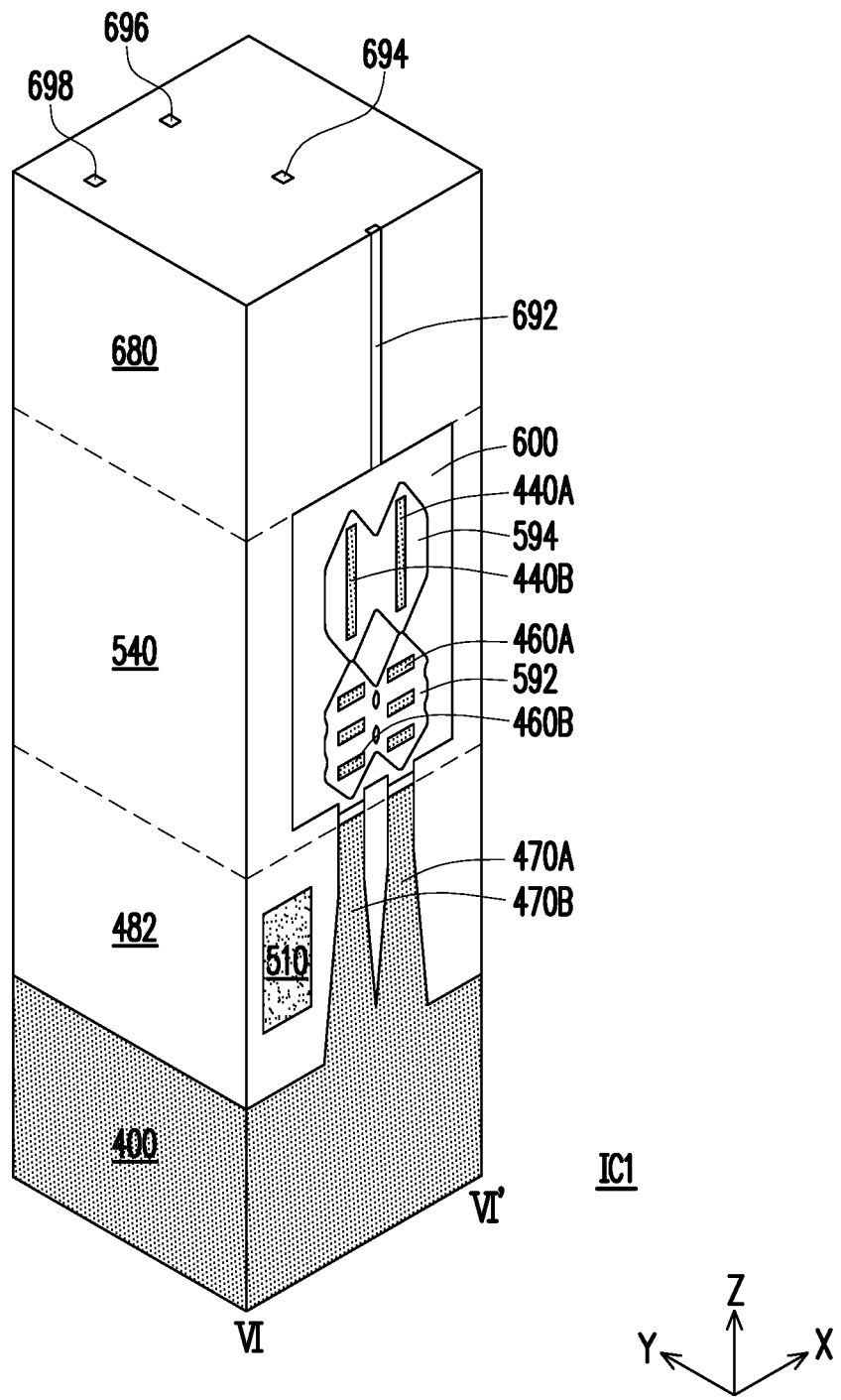
FIG. 45A to FIG. 45D are schematic perspective sectional views of the structure illustrated in FIG. 45 according to some embodiments of the present disclosure.
Figure 45B:
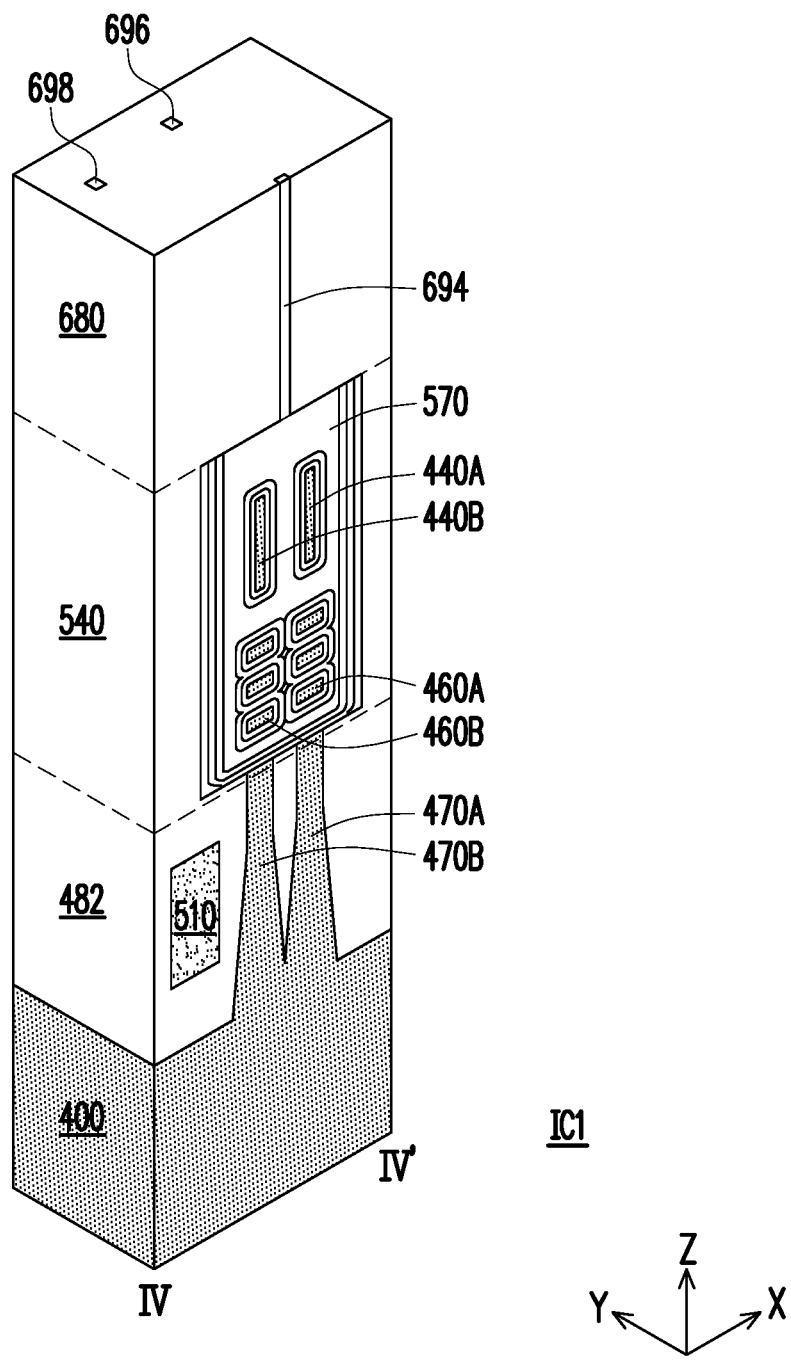
Figure 45C:
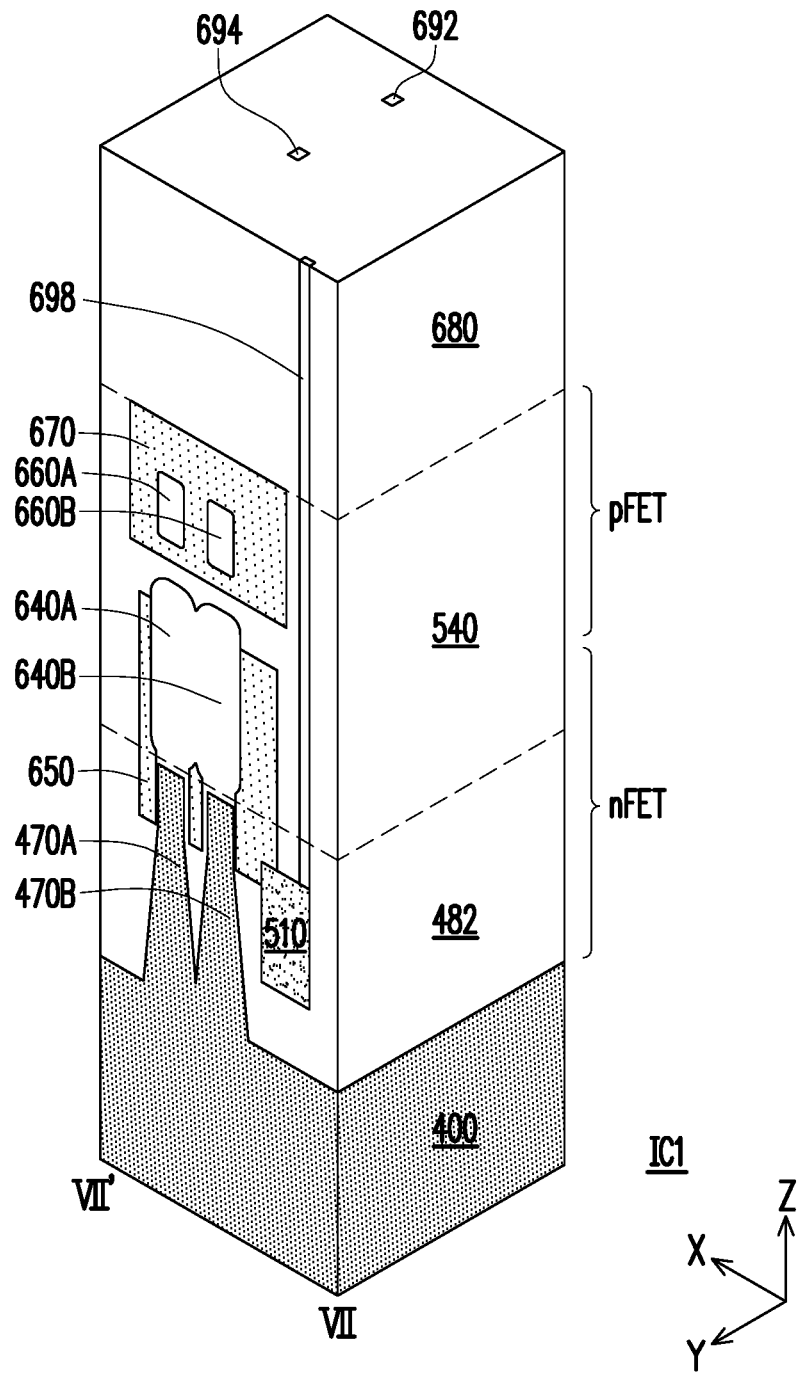
Figure 45D:
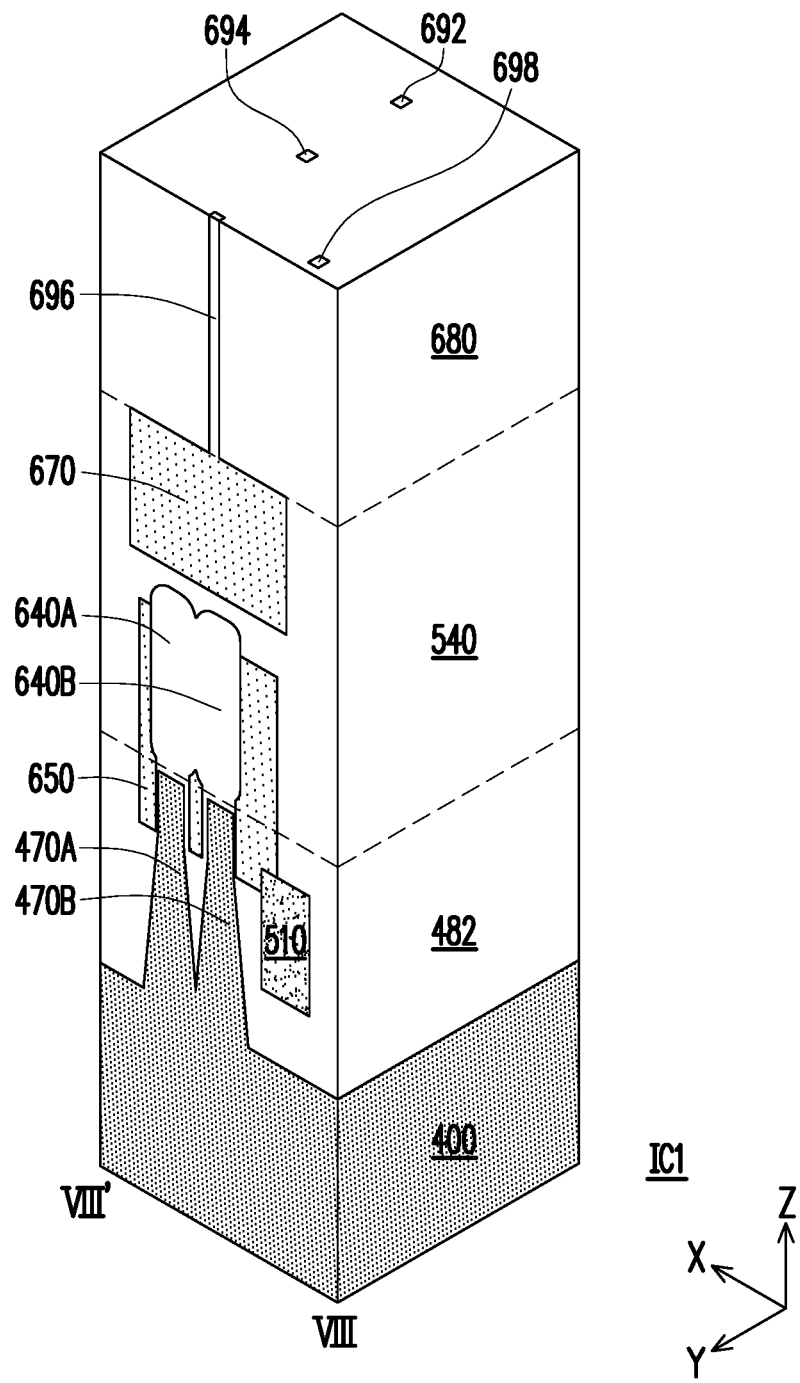

In some embodiments, the CMOS device D20 may be integrated into larger circuits (e.g., an integrated circuit IC1, a portion of which is illustrated in FIG. 45). For example, as illustrated in FIG. 45, an additional interlayer dielectric layer 680 may be formed on the CMOS device D20, and via contacts 692, 694, 696, 698 may be formed in the additional interlayer dielectric layer 680 to establish electrical contact with the several components of the CMOS device D20. FIG. 45A is a schematic perspective sectional view of the portion of the integrated circuit IC1 illustrated in FIG. 45, cut at the XZ plane at the level height of the line VI-VI' along the Y direction. FIG. 45B is a schematic perspective sectional view of the structure illustrated in FIG. 45, cut at the XZ plane at the level height of the line IV-IV' along the Y direction. FIG. 45C is a schematic perspective sectional view of the structure illustrated in FIG. 45, cut at the XZ plane at the level height of the line along the Y direction. FIG. 45D is a schematic perspective sectional view of the structure illustrated in FIG. 45, cut at the XZ plate at the level height of the line VIII-VII' along the Y direction. As indicated by the orientation of the Cartesian coordinates in the corresponding drawings, the views of FIG. 45C and FIG. 45D are rotated of 90 degrees with respect to the views of FIG. 45, FIG. 45A, and FIG. 45B. Referring to FIG. 45 to FIG. 45D, the via contacts 692, 694, and 696 extend through the additional interlayer dielectric layer 680 to establish electrical contact with the source and drain contact 600, the gate structure 570, and the source and drain contact 670. The via contact 698 further extends through the interlayer dielectric layer 540 to reach the metal plug 510. That is, as in the CMOS D20 the nFET is stacked below the pFET, to avoid shortening of the source and drain contacts 670 and 650, the via contact 698 establishes electrical connection with the source and drain contact 650 through the metal plug 510. More generally, when the nFET and the pFET are vertically stacked and the circuit design requires to keep separate source and drain contacts or gates for the two transistors, electrical connection with the components of the lower transistor may be established through buried metal plugs.

Figure 46:
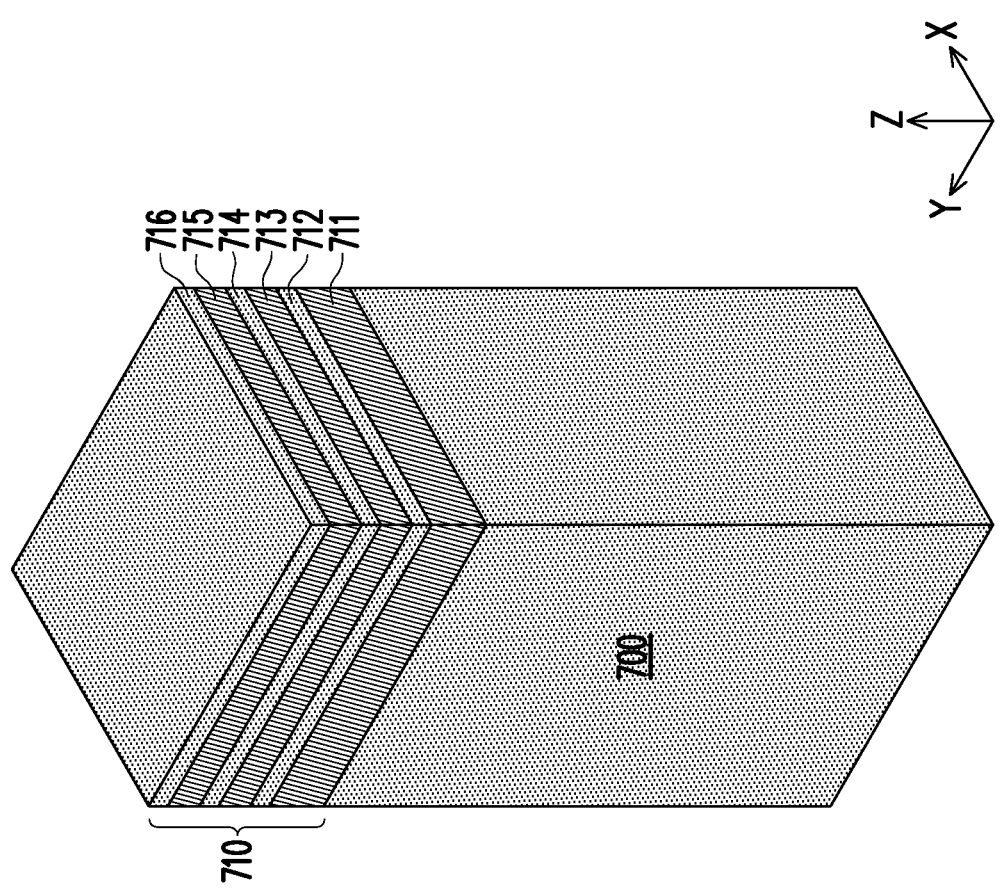
FIG. 46 and FIG. 47 are schematic perspective views of structures produced during a manufacturing method of a CMOS device according to some embodiments of the present disclosure.
Figure 47A:
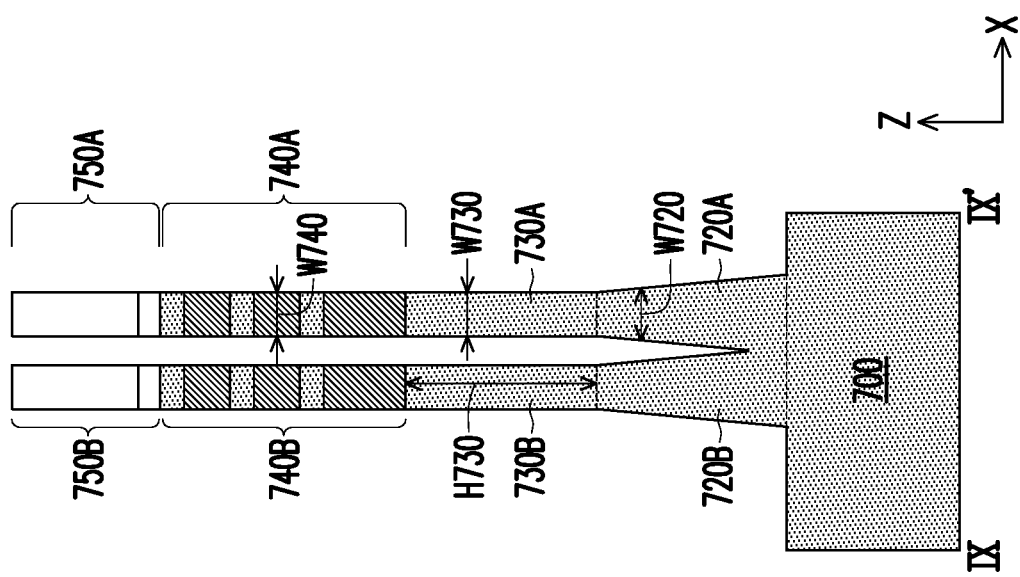
FIG. 47A is a schematic cross-sectional view of the structure illustrated in FIG. 47 according to some embodiments of the present disclosure.
Figure 47:
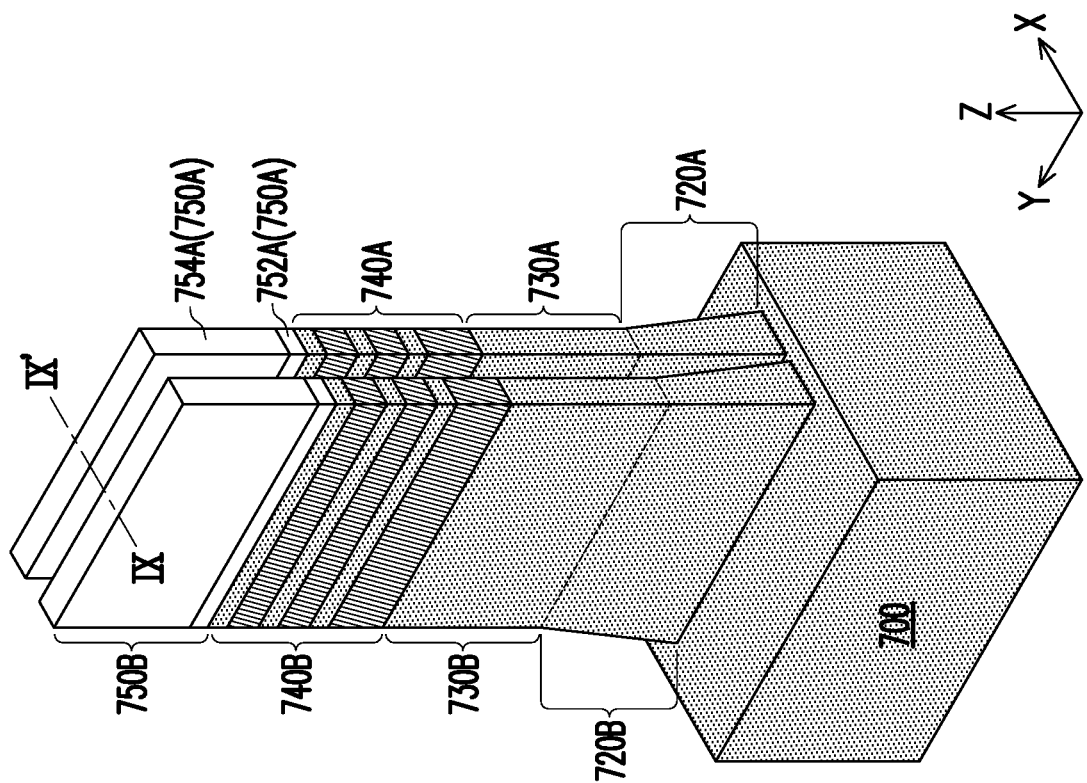
Figure 48A:
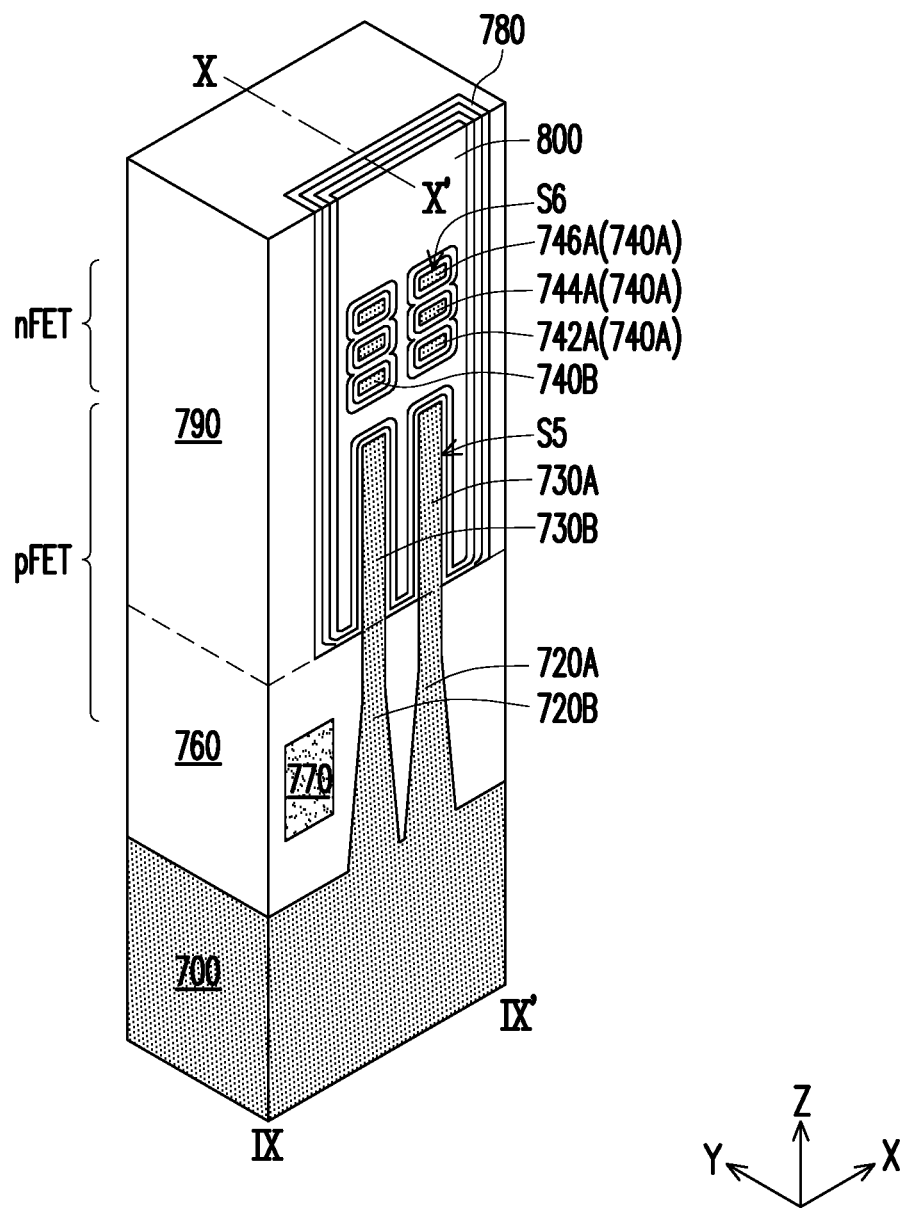
FIG. 48A and FIG. 48B are schematic perspective sectional views of a structure produced during a manufacturing method of a CMOS device according to some embodiments of the present disclosure.
Figure 48B:
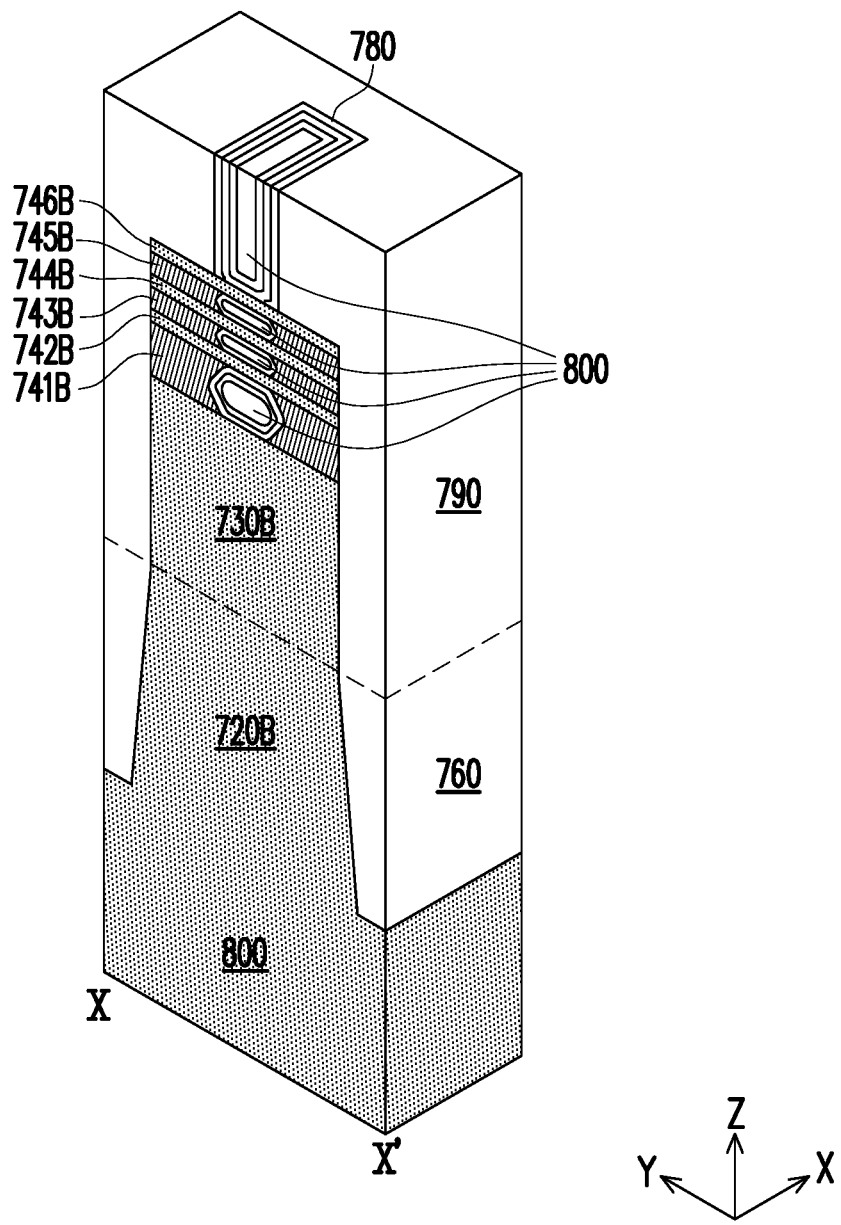
Figure 49:
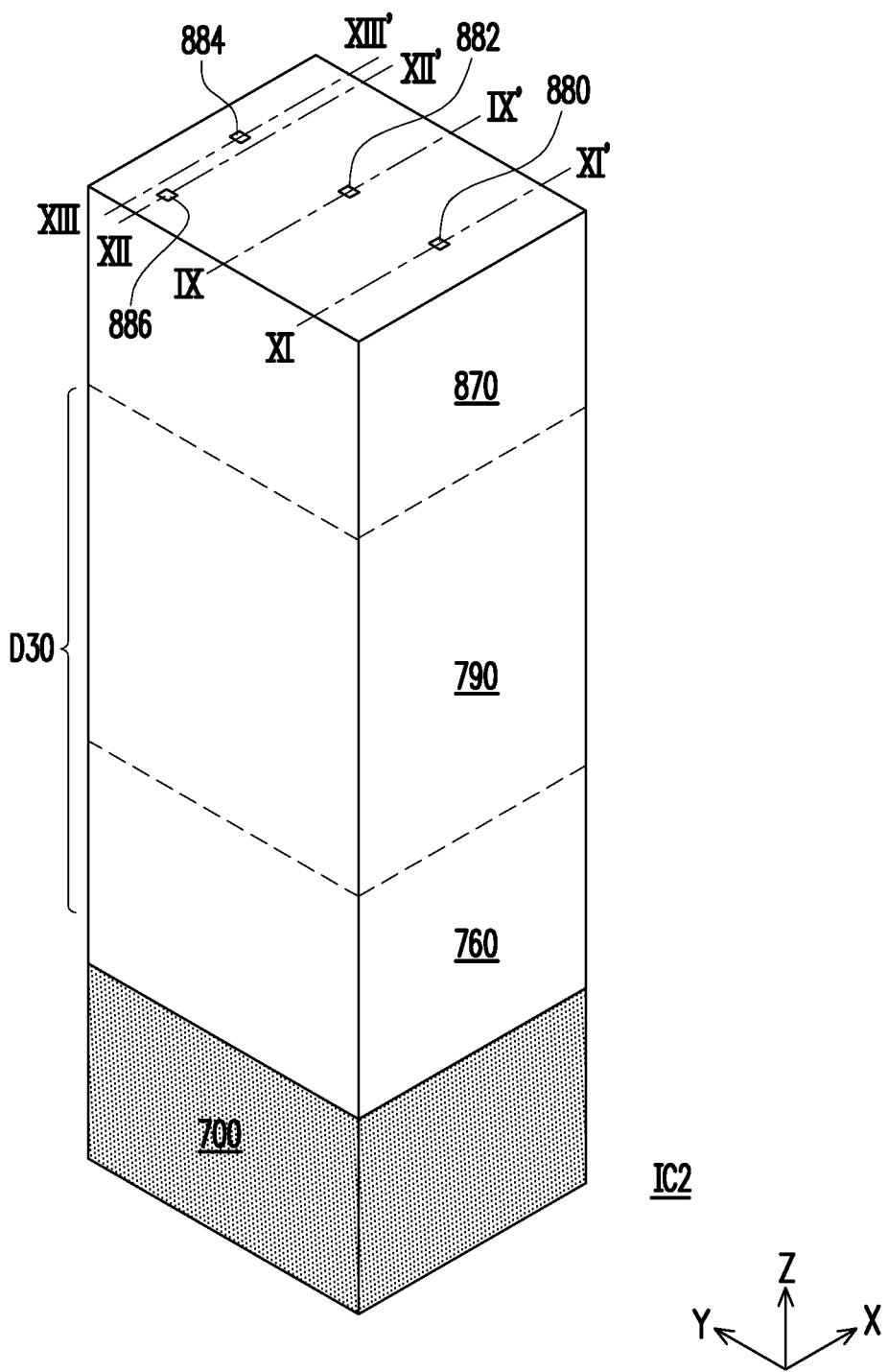
FIG. 49 is a schematic perspective view of a portion of an integrated circuit according to some embodiments of the present disclosure.
Figure 49A:
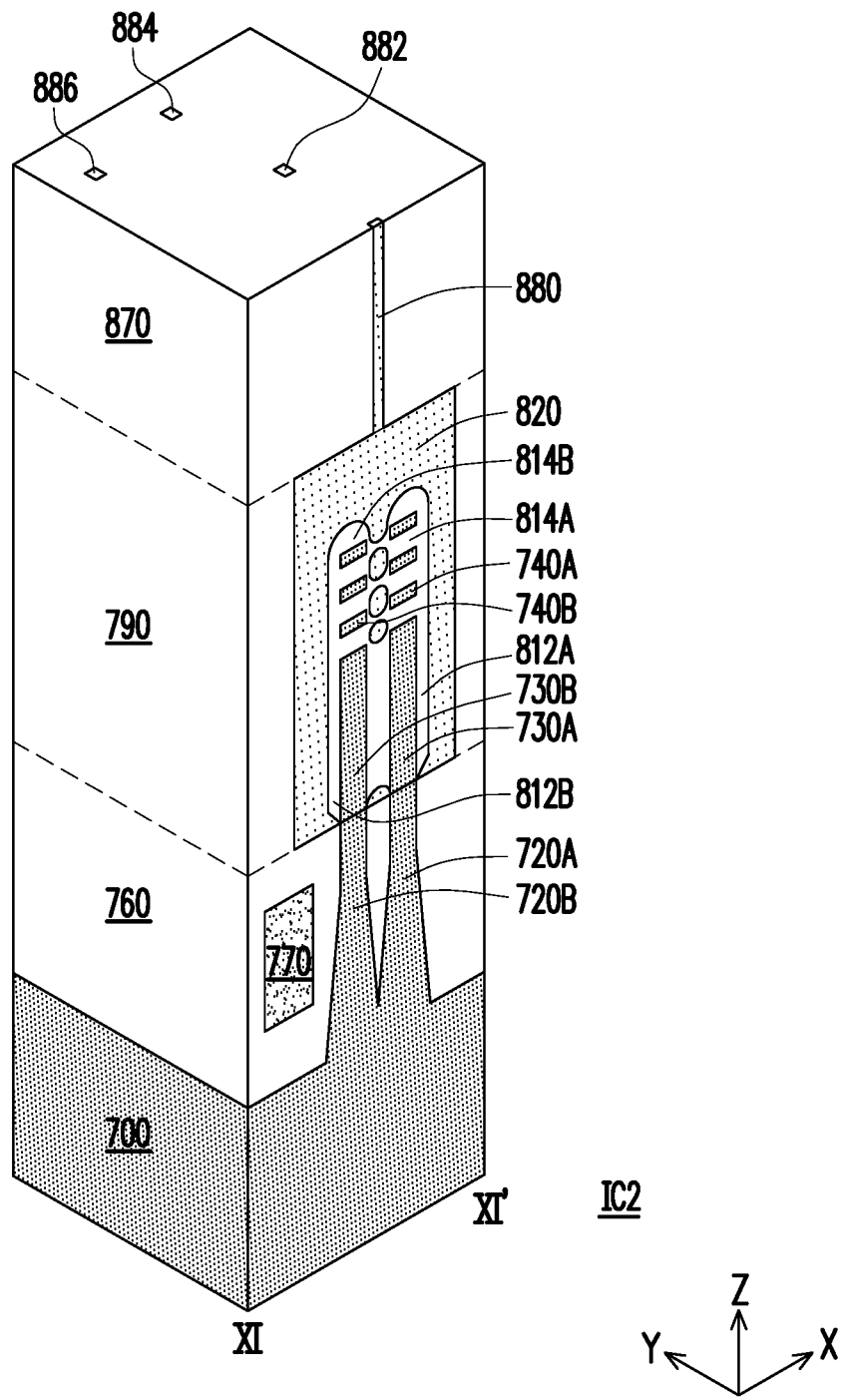
FIG. 49A to FIG. 49D are schematic perspective sectional views of the structure illustrated in FIG. 49 according to some embodiments of the present disclosure.
Figure 49B:
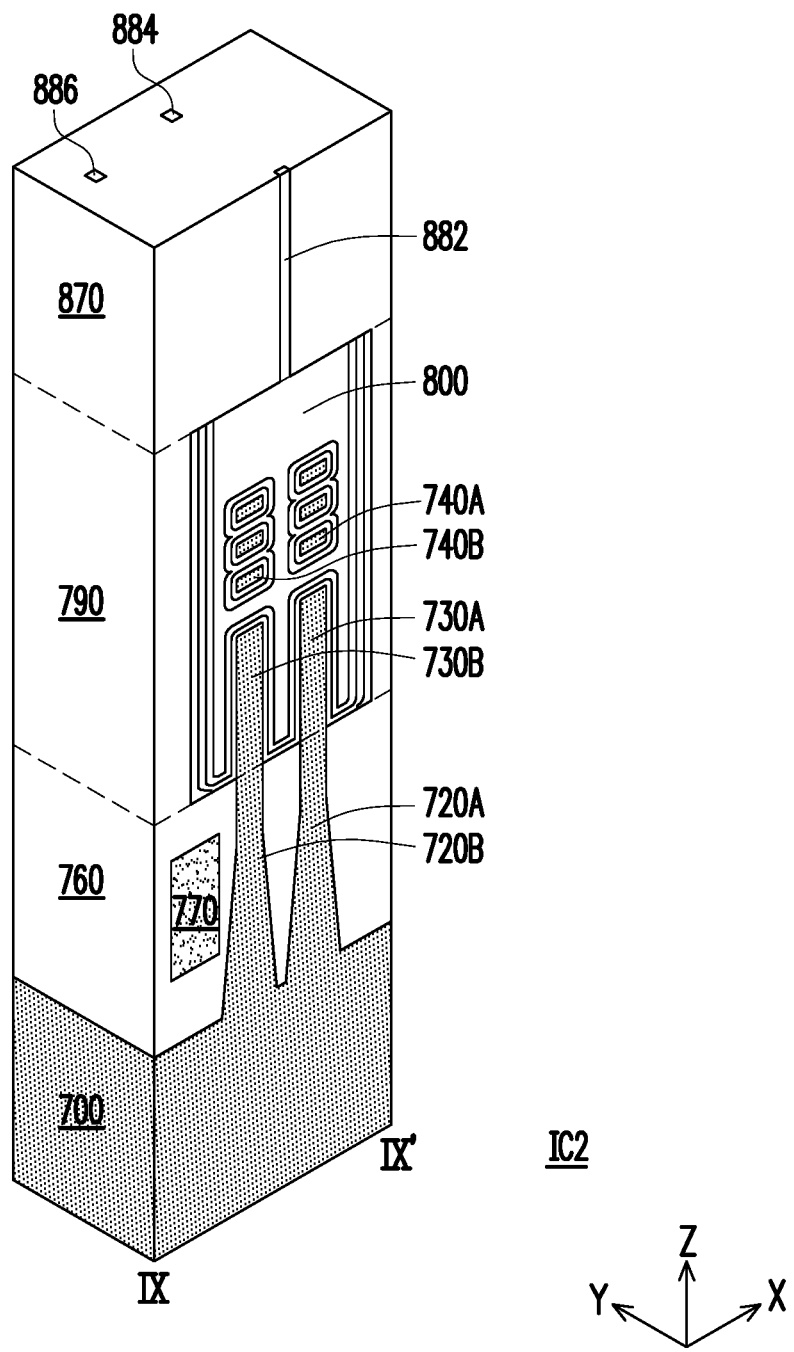

FIG. 46 to FIG. 49 are schematic views of structures produced during a manufacturing method of an integrated circuit IC2 including the CMOS device D30 according to some embodiments of the disclosure. FIG. 46, FIG. 47, and FIG. 49 are schematic perspective views, FIG. 48A, FIG. 48B, and FIG. 49A to FIG. 49D are schematic perspective sectional views, and FIG. 47A is a schematic cross-sectional view. For clarity of illustrations, in the drawings are illustrated the orthogonal axes (X, Y and Z) of the Cartesian coordinate system according to which the views are oriented. The CMOS device D30 may have a similar structure and be fabricated according to a similar process as the CMOS device D20 of FIG. 44, and in the following only the main differences between the two devices and the corresponding processes will be discussed for the sake of brevity. Referring to FIG. 46, in some embodiments a semiconductor substrate 700 is provided. In some embodiments, the semiconductor substrate 700 includes similar material as the semiconductor substrate 100 of FIG. 1. In some embodiments, the stacked semiconductor layers 710 are provided on the semiconductor substrate 700 similar to what was previously described for the stacked semiconductor layers 410 of FIG. 15. A difference between the structure illustrated in FIG. 46 with the structure illustrated in FIG. 15 lies in the stacked semiconductor layers 410 having, as uppermost layer, a layer of channel material 716 without a block of channel material stacked on the stacked semiconductor layers 710. In some embodiments, the layers of sacrificial material 711, 713, 735 may have a thickness in the Z direction in the range from 10 to 40 nm, while the layers of channel material 712, 714, 716 may have a thickness in the Z direction in the range from 5 to 15 nm. In some embodiments, the layers of channel materials 712, 714, 716 may have been doped with n-type dopants, while the upper part of the semiconductor substrate 700 (the region below the stacked semiconductor layers 710) may have been doped with p-type dopants. In the following, as a way of example, it will be considered that the semiconductor substrate 700 and the layers of channel material 712, 714, 716 are made of silicon, optionally doped, while silicon germanium (SiGe) will be considered as sacrificial material for the layers 711, 713, 715. However, the disclosure is not limited thereto, and other combinations of materials for which selective etching is possible are contemplated within the scope of the disclosure.

FIG. 47A is a schematic cross-sectional view of the structure illustrated in FIG. 47, cut along the XZ plane located at the level height of the line IX-IX' along the Y direction. Referring to FIG. 46, FIG. 47, and FIG. 47A, fin bases 720, semiconductor fins 730, and nanosheets 740 may be formed by patterning the semiconductor substrate 700 and the stacked semiconductor layers 710 by using the hard masks 750. In some embodiments, the semiconductor fins 730 are disposed on the fin bases 720, in between the fin bases 720 and the nanosheets 740. The semiconductor fins 730 and the fin bases 720 may be formed from the semiconductor substrate 700, while the nanosheets 740 may be formed from the stacked semiconductor layers 710. In some embodiments, the hard masks 750 may be provided on the stacked semiconductor layers 710, and include an etch stop layer 752 and one or more hard mask dielectric layers 754. In some embodiments, the etching of the semiconductor substrate 700 and the stacked semiconductor layers 710 may be performed so that the nanosheets 740 and the semiconductor fins 730 have substantially the same widths W730, W740 along the X direction, while the width W720 of the fin bases along the X direction may progressively increase proceeding towards the semiconductor substrate 700. That is, the hard masks 750 may be used to pattern both of the stacked semiconductor layers 710 to form the nanosheets 740 and the semiconductor substrate 700 to form the semiconductor fins 730 and the fin bases 720. In some embodiments, the widths W730, W740 may be in the range from 10 nanometers to 40 nanometers. In some embodiments, the height H730 of the semiconductor fins 730 may be in the range from 30 nm to 60 nm. The height H730 may be measured along the Z direction from the level height of the bottommost nanosheet 740 to the level height at which the fin bases 720 start becoming wider along the X direction. As such, the nanosheet 740 may mostly extend in XY planes, while the semiconductor fins 730 may mostly extend in YZ planes.

FIG. 48A is a schematic perspective sectional view of a structure formed at a later stage of the manufacturing process of the CMOS device D30. The view of FIG. 48A is cut along an XZ plane located at the level height of the line IX-IX' along the Y direction illustrated in FIG. 47. FIG. 48B is a schematic perspective sectional view of the same structure illustrated in FIG. 48A, cut along the YZ plane located at the level height of the line X-X' illustrated in FIG. 48A. Referring to FIG. 47, FIG. 48, and FIG. 48A, after formation of the semiconductor fins 730 and the nanosheets 740, the manufacturing process may proceed following similar steps as described above with reference from FIG. 19 to FIG. 30B. Briefly, isolation structures 760 are formed covering the fin bases 720. At least one metal plug 770 is formed in the isolation structures 760, extending in the Y direction, parallel to the fin bases 720 and the semiconductor fins 730. In some embodiments, the metal plug 770 is formed on a side of the fin bases 720 along the X direction. Thereafter, gate spacers 780 surrounding one or more dummy gates (not shown) may be provided extending over the nanosheets 740 and the semiconductor fins 730 in the X direction. The interlayer dielectric layer 790 may be formed surrounding the gate spacers 780, and the dummy gate(s) (not shown) may be removed. The portions of sacrificial material exposed in between the spacers may be removed, and the gate structure(s) 800 may be subsequently formed. The gate structure(s) 800 may fill the enclosure(s) delimited by the gate spacers 780, contacting the semiconductor fins 730 and the nanosheets 740. In some embodiments, the gate structure(s) 800 mostly contacts the semiconductor fins 730 along YZ planes (e.g., as the surface S5), while contact with the nanosheet 740 may mostly take place along XY planes (e.g., as the surface S6). The surfaces S5 and S6 may correspond to different crystallographic surfaces of the channel material forming the nanosheets 742, 744, 746 and the semiconductor fins 730. In some embodiments, the gate structure 800 passes over the semiconductor fins 730, without wrapping around the semiconductor fins 730. In some embodiments, the portions of the semiconductor fins 730 contacted by the gate structure 800 act as channels for a bottom transistor, while the portions of the nanosheets of channel material 742, 744, 746 contacted by the gate structure 800 act as channels for a top transistor. In some embodiments, the bottom transistor is a pFET having a finFET architecture and the top transistor is an nFET having a gate all-around architecture. In some embodiments, by adopting different transistor architectures for the top transistor and the bottom transistor, it may be possible to optimize the charge transport for both holes and electrons.

Figure 49C:
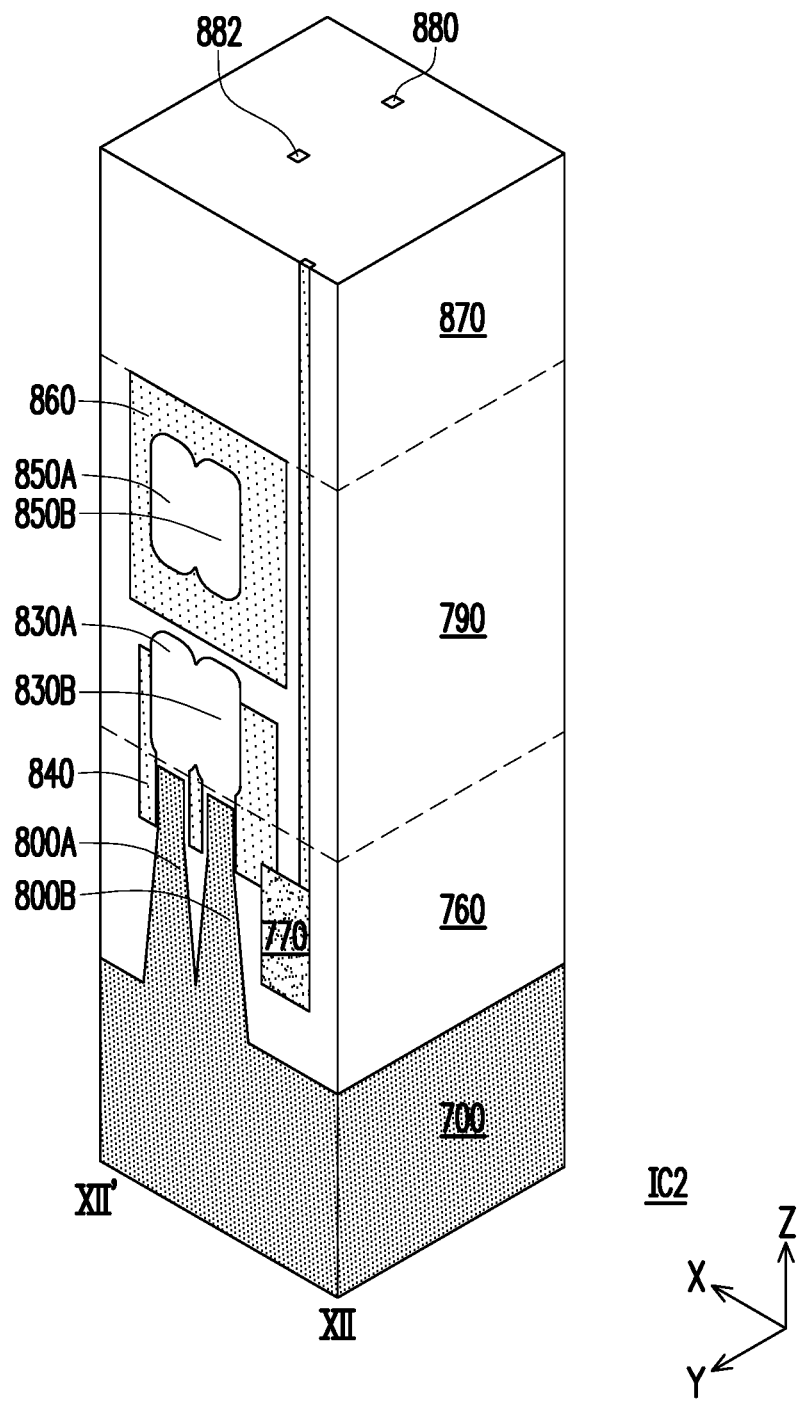
Figure 49D:
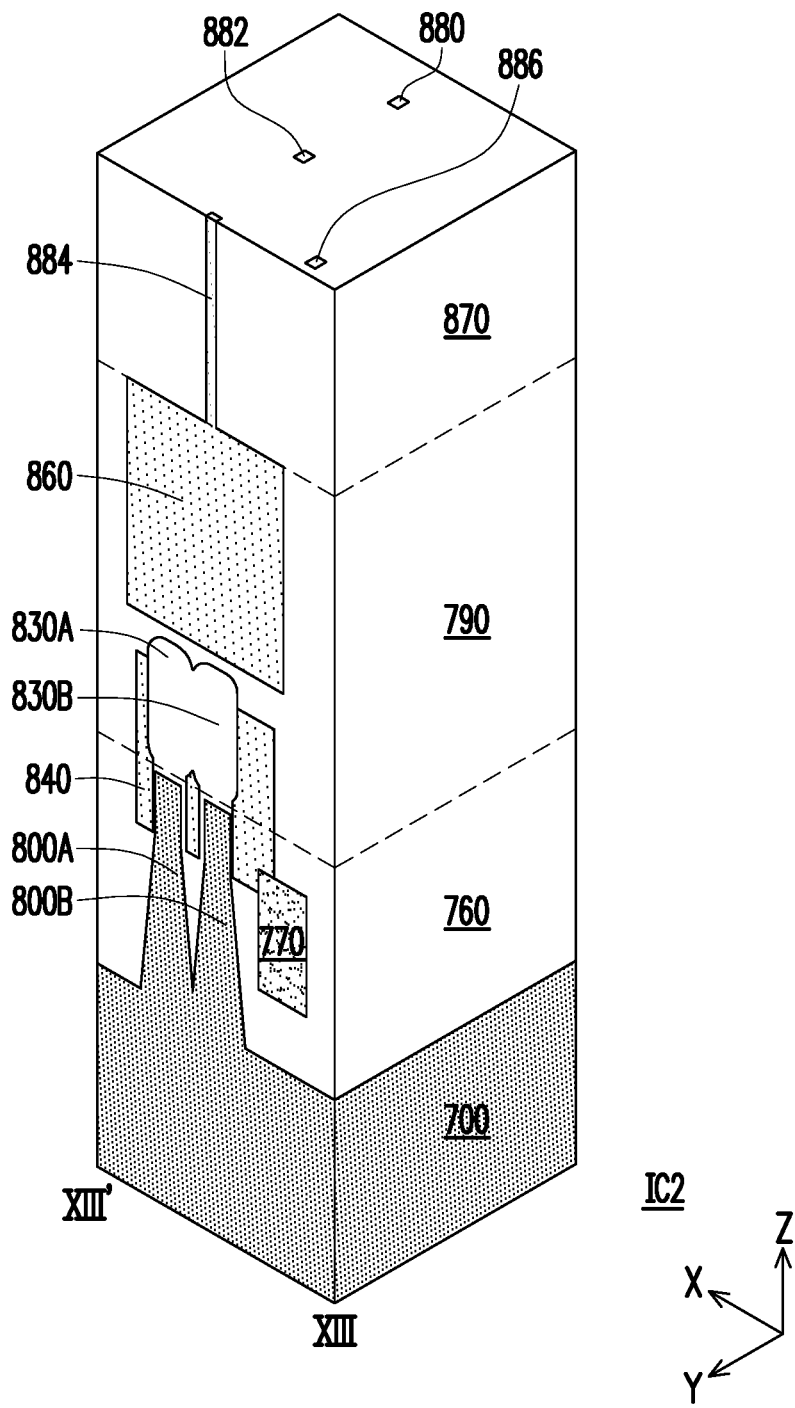

FIG. 49 is a schematic perspective view of a structure of a portion of the integrated circuit IC2 including the CMOS device D30 according to some embodiments of the disclosure. FIG. 49A, FIG. 49B, FIG. 49C, and FIG. 49D are schematic perspective sectional views of the structure illustrated in FIG. 49, cut at the XZ planes respectively located at the level height of the lines XI-XI', IX-IX', XII-XII', and XIII-XIII' along the Y direction. The views of FIG. 49C and FIG. 49D are rotated of 90 degrees along the Z axis, as indicated by the illustrated Cartesian coordinates. Referring to FIG. 48A, FIG. 48B, FIG. 49, and FIG. 49A to FIG. 49D, the CMOS device D30 may be integrated in the integrated circuit IC2 following similar process steps as previously described with respect to FIG. 31 to FIG. 45D. Briefly, source and drain regions 812, 814 may be formed on one side of the gate structure 800 contacting the semiconductor fins 730 and the nanosheets 740, respectively. The source and drain regions 812, 814 may contact each other, and be surrounded by a common source and drain contact 820. On an opposite side of the gate structure 800 along the Y direction, the source and drain region 830 may be formed in contact with the semiconductor fins 730, without contacting the nanosheets 740. A source and drain contact 840 may be formed covering the lower portion of the source and drain region 830, and may establish electrical contact with the buried metal plug 770. The interlayer dielectric layer 790 may separate the source and drain region 830 formed on the semiconductor fins 730 from the source and drain region 850 formed on the nanosheets 740 and from the source and drain contact 860 surrounding the source and drain regions 850. On top of the CMOS device D30 may be disposed the additional interlayer dielectric layer 870, and the via contacts 880, 882, 884, 886 may extend through the additional interlayer dielectric layer 870 and, possibly, the interlayer dielectric layer 790 to establish electrical connection with the source and drain contacts 820, 840, 860 and the gate structure 800.

In the CMOS device D30, the pFET having a finFET architecture is stacked below the nFET having a gate-all-around architecture. The pFET and the nFET may share the same gate structure 800 and one of the source and drain contacts 820 on one side of the gate structure 800. For example, the via contact 880 may establish electrical connection with the common source and drain contact 820, while the via contact 882 may establish electrical connection with the gate structure 800. The via contact 884 may establish electrical connection with the source and drain contact 860 of the nFET, while the via contact 886 may establish electrical connection with the source and drain contact 840 of the pFET through the buried metal plug 770.

As for the CMOS device D20 of FIG. 45, also the CMOS device D30 has the structure of an inverter. However, the disclosure is not limited thereto, and other logic gates, memory cells or CMOS devices are contemplated within the scope of the disclosure.

According to some embodiments, a complementary metal-oxide-semiconductor device includes a p-type field effect transistor and an n-type filed effect transistor. The p-type filed effect transistor has a first transistor architecture. The n-type field effect transistor is coupled with the p-type field effect transistor and has a second transistor architecture. The second transistor architecture is different from the first transistor architecture. The p-type field effect transistor and the n-type field effect transistor share a same metal gate.

According to some embodiments, a complementary metal-oxide-semiconductor device includes a semiconductor substrate, fins, nanosheets, and a gate structure. The fins are disposed over the semiconductor substrate and extend parallel with respect to each other in a first direction. The nanosheets are stacked over the semiconductor substrate and extend in the first direction. The gate structure extends along a second direction perpendicular to the first direction, and contacts the fins and the nanosheets. A contact area between the gate structure and the fins extends mostly along the first direction and a third direction. The third direction is perpendicular to the first direction and the second direction. A contact area between the gate structure and the nanosheets extends mostly along the first direction and the second direction.

According to some embodiments, a method of manufacturing a complementary metal-oxide-semiconductor device includes the following steps. Fins are formed over a semiconductor substrate. Nanosheets are formed over the semiconductor substrate. A gate structure is formed. The gate structure contacts the fins and the nanosheets. A contact area of the gate structure with the fins extends mostly along a (110) crystallographic surface of a semiconductor material of the fins. A contact area of the gate structure with the nanosheets extends mostly along a (100) crystallographic surface of a semiconductor material of the nanosheets.

The foregoing outlines features of several embodiments so that those skilled in the art may better understand the aspects of the disclosure. Those skilled in the art should appreciate that they may readily use the disclosure as a basis for designing or modifying other processes and structures for carrying out the same purposes and/or achieving the same advantages of the embodiments introduced herein. Those skilled in the art should also realize that such equivalent constructions do not depart from the spirit and scope of the disclosure, and that they may make various changes, substitutions, and alterations herein without departing from the spirit and scope of the disclosure.

What is claimed is:

1. A complementary metal-oxide-semiconductor device, comprising:
   a p-type field effect transistor having a first transistor architecture, the first transistor architecture comprising:
      fin bases and semiconductor fins, each of the semiconductor fins being disposed on and continuously connected to one of the fin bases; and
      a first source/drain region, extending along a sidewall of each of the semiconductor fins and a top of each of e semiconductor ns that is connected to the sidewall;
   an n-type field effect transistor coupled with the p-type field effect transistor and having a second transistor architecture, the second transistor architecture comprising:
      a nanosheet base and nanosheets stacked over the nanosheet base; and
      a second source/drain region, disposed on the nanosheet base and surrounding each of the nanosheets, the first source/drain region and the second source/drain region being spatially separated from each other; and
   a gate structure, covering the first transistor architecture and the second transistor architecture, wherein in a cross-sectional view, a top surface of a topmost one of the nanosheets is covered by the gate structure and the second source/drain region that laterally surrounds a bottom of the gate structure.

2. The complementary metal-oxide-semiconductor device of claim 1, wherein the first transistor architecture further comprises a first source/drain contact disposed on the first source/drain region, and the first source/drain region is interposed between the first source/drain contact and a sidewall of an outermost one of the semiconductor fins.

3. The complementary metal-oxide-semiconductor device of claim 1, wherein the p-type field effect transistor includes a first semiconductor structure and the n-type field effect transistor includes a second semiconductor structure different from the first semiconductor structure,
   the gate structure mostly contacts the first semiconductor structure along a (110) crystallographic surface, and
   the gate structure mostly contacts the second semiconductor structure along a (100) crystallographic surface.

4. The complementary metal-oxide-semiconductor device of claim 3, wherein the first semiconductor structure and the second semiconductor structure include a material selected from Si, Ge, SiGe, or a combination thereof.

5. The complementary metal-oxide-semiconductor device of claim 1, wherein the second transistor architecture further comprises a second source/drain contact disposed on the second source/drain region and overlapping the nanosheets.

6. The complementary metal-oxide-semiconductor device of claim 1, wherein in the cross-sectional view, a bottom surface of the topmost one of the nanosheets is in contact with a gate dielectric layer and the second source/drain region that laterally surrounds the gate dielectric layer.

7. The complementary metal-oxide-semiconductor device of claim 1, wherein the gate structure horizontally extends over a semiconductor substrate from the p-type field effect transistor to the n-type field effect transistor.

8. A complementary metal-oxide-semiconductor device, comprising:
   a semiconductor substrate;
   semiconductor fins, disposed over the semiconductor substrate and extending parallel with respect to each other in a first direction;
   nanosheets, stacked over the semiconductor substrate and extending in the first direction;
   a nanosheet base, disposed on the semiconductor substrate, the nanosheets being interposed between the nanosheet base and the semiconductor fins;
   a first source/drain region, wrapping around each of the semiconductor fins in a first cross-sectional view;
   a second source/drain region, disposed below the first source/drain region and wrapping around each of the nanosheets in the first cross-sectional view; and
   a gate structure, extending along a second direction perpendicular to the first direction and contacting the semiconductor fins and the nanosheets,
   wherein a contact area between the gate structure and the semiconductor fins extends mostly along the first direction and a third direction perpendicular to the first direction and the second direction, and a contact area between the gate structure and the nanosheets extends mostly along the first direction and the second direction.

9. The complementary metal-oxide-semiconductor device of claim 8, wherein a width of a first semiconductor fin of the semiconductor fins in the second direction is smaller than a width of a first nanosheet of the nanosheets in the second direction, and a height of the first semiconductor fin in the third direction is greater than a height of the first nanosheet in the third direction.

10. The complementary metal-oxide-semiconductor device of claim 8, wherein a width of an upper straight portion of the nanosheet base in the second direction is equal to a width of a first nanosheet of the nanosheets in the second direction, and a height of the first semiconductor fin in the third direction is greater than a height of the first nanosheet in the third direction.

11. The complementary metal-oxide-semiconductor device of claim 8, wherein in a second cross-sectional view, the gate structure wraps around each of the nanosheets and each of the semiconductor fins.

12. The complementary metal-oxide-semiconductor device of claim 8, further comprising:
   a source/drain contact, surrounding the first source/drain region and the second region, filling a space between the first source/drain region and the second region, and extending to be interposed between the nanosheet base and the second region in the first cross-sectional view.

13. The complementary metal-oxide-semiconductor device of claim 8, wherein a metal plug is disposed adjacent to and spaced apart from the nanosheet base in the first cross-sectional view.

14. The complementary metal-oxide-semiconductor device of claim 8, further comprising:
   a source and drain contact disposed adjacent to the gate structure;
   isolation structures disposed on the semiconductor substrate; and
   a metal plug buried in the isolation structures and physically contacting the source and drain contact.

15. A complementary metal-oxide-semiconductor device, comprising:
- fin bases, protruding from a semiconductor substrate;
- semiconductor fins, continuously connected to the fin bases and extending parallel with respect to each other in a first direction;
- nanosheets, stacked upon one another and disposed above the semiconductor fins;
- a common source/drain region, wrapping around each of the nanosheets and extending to cover each of the semiconductor fins in a first cross-sectional view; and
- a gate structure, elongated along a second direction and extending along a third direction to surround each of the nanosheets and each of the semiconductor fins in a second cross-sectional view, wherein the first direction is substantially perpendicular to the second direction and the third direction.

16. The complementary metal-oxide-semiconductor device of claim 15, further comprising:
- a common source/drain contact, surrounding the common source/drain region in the first cross-sectional view.

17. The complementary metal-oxide-semiconductor device of claim 15, further comprising:
- a metal plug, disposed adjacent to the fin bases and vertically between the semiconductor substrate and the gate structure in the second cross-sectional view.

18. The complementary metal-oxide-semiconductor device of claim 17, further comprising:
- a lower source/drain region, disposed over the semiconductor substrate; and
- a lower source/drain contact, coupling the lower source/drain region to the metal plug in a third-cross sectional view.

19. The complementary metal-oxide-semiconductor device of claim 18, further comprising:
- an upper source/drain region, vertically disposed over the lower source/drain region; and
- an upper source/drain contact, surrounding the upper source/drain region and physically separated from the lower source/drain contact in the third-cross sectional view.

20. The complementary metal-oxide-semiconductor device of claim 15, wherein a width of a first semiconductor fin of the semiconductor fins in the second direction is equal to a width of a first nanosheet of the nanosheets in the second direction.

* * * * *